(12) United States Patent
Endo

(10) Patent No.: US 7,590,926 B2
(45) Date of Patent: Sep. 15, 2009

(54) DECODING APPARATUS, DECODING METHOD, PROGRAM-RECORDING MEDIUM, PROGRAM AND RECORDING/REPRODUCTION APPARATUS

(75) Inventor: Masaki Endo, Tokyo (JP)

(73) Assignee: Sony Corporation, Tokyo (JP)

( * ) Notice: Subject to any disclaimer, the term of this patent is extended or adjusted under 35 U.S.C. 154(b) by 432 days.

(21) Appl. No.: 11/153,420

(22) Filed: Jun. 16, 2005

(65) Prior Publication Data

US 2006/0277449 A1    Dec. 7, 2006

(30) Foreign Application Priority Data

Jun. 28, 2004    (JP) ............................ P2004-189951

(51) Int. Cl.
*H03M 13/03*    (2006.01)

(52) U.S. Cl. ...................... 714/794; 714/795; 714/796

(58) Field of Classification Search .......... 714/794–796
See application file for complete search history.

(56) References Cited

U.S. PATENT DOCUMENTS

| | | | | |
|---|---|---|---|---|
| 5,838,729 A | * | 11/1998 | Hu et al. ...................... | 375/265 |
| 5,841,478 A | * | 11/1998 | Hu et al. ................. | 375/240.25 |
| 5,841,819 A | * | 11/1998 | Hu et al. ...................... | 375/341 |
| 5,991,341 A | * | 11/1999 | Shin ........................... | 375/265 |
| 6,088,404 A | * | 7/2000 | Jekal .......................... | 375/341 |
| 6,094,739 A | * | 7/2000 | Miller et al. ................. | 714/792 |
| 6,134,697 A | * | 10/2000 | Jekal .......................... | 714/792 |
| 6,201,563 B1 | * | 3/2001 | Rhee ........................... | 348/21 |
| 6,256,352 B1 | * | 7/2001 | Chang .................... | 375/240.26 |
| 6,449,002 B1 | * | 9/2002 | Markman et al. ............. | 348/21 |
| 6,738,949 B2 | * | 5/2004 | Senda et al. ............... | 714/796 |
| 6,769,091 B2 | * | 7/2004 | Classon et al. .............. | 714/792 |
| 2006/0277449 A1 | * | 12/2006 | Endo .......................... | 714/704 |

FOREIGN PATENT DOCUMENTS

JP    08-084082    3/1996

* cited by examiner

*Primary Examiner*—Joseph D Torres
(74) *Attorney, Agent, or Firm*—Rader, Fishman & Grauer PLLC; Christopher M. Tobin

(57) ABSTRACT

Disclosed is a decoding apparatus for decoding an encoded signal on the basis of a plurality of state-transition trellises having differing state counts. The decoding apparatus includes a decoding section for decoding the encoded signal on the basis of a first state-transition trellis, and a mode selection section for selecting either a first operating mode based on the first state-transition trellis or a second operating mode based on a second state-transition trellis. The second state-transition trellis has a state count smaller than that of the first state-transition trellis. If the mode selection section selects the second operating mode, the decoding section decodes the encoded signal by carrying out a state transition switch from a first state transition to a second state transition.

19 Claims, 21 Drawing Sheets

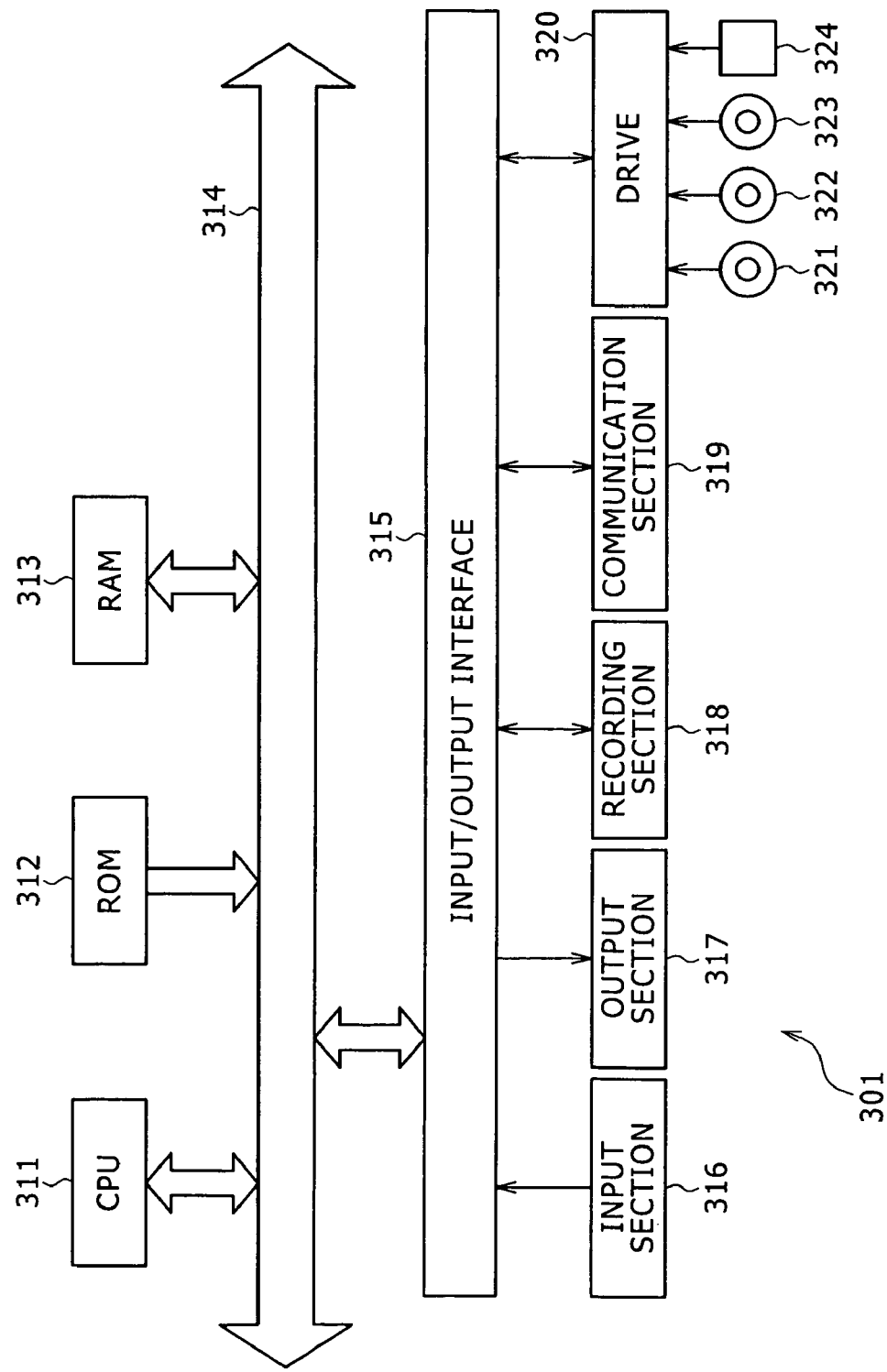

DECODING APPARATUS, DECODING METHOD, PROGRAM-RECORDING MEDIUM, PROGRAM AND RECORDING/REPRODUCTION APPARATUS

BACKGROUND OF THE INVENTION

The present invention relates to decoding apparatus, decoding methods, program-recording mediums, programs and recording/reproduction apparatus. More particularly, the present invention relates to a decoding apparatus capable of keeping up with a plurality of operating modes without increasing a circuit size, a decoding method adopted by the decoding apparatus, a program implementing the decoding method, a program-recording medium for storing the program and a recording/reproduction apparatus employing the decoding apparatus.

The capability exhibited by a contemporary recording/reproduction apparatus designed for optical disks as a capability of recording data into the optical disks mounted on the recording/reproduction apparatus has been becoming better remarkably. The conventional binary identification only is not sufficient means for guaranteeing a low reproduction-error rate. The number of cases has been increasing as cases in which a Viterbi decoding circuit capable of guaranteeing a low reproduction-error rate in spite of existence of inter-code interferences is used.

FIG. 1 is a diagram showing a typical configuration of a recording/reproduction apparatus employing the Viterbi decoding circuit.

In the typical configuration shown in FIG. 1, a modulation circuit 11 carries out a modulation process as part of processing to record data onto a recording medium 14. The modulation circuit 11 converts an input sequence received from a preceding stage not shown in the figure as a sequence of pieces of information to be recorded into a modulated sequence $X_t$ (t=0, 1, 2 and so on), and outputs the modulated sequence $X_t$ to a precoder 12.

The precoder 12 carries out a preceding process for a partial response, which is abbreviated hereafter to a PR. That is to say, the precoder 12 encodes the modulated sequence $X_t$ received from the modulation circuit 11 on the basis of a predetermined coding rule to generate an intermediate sequence $y_t$. The precoder 12 then records the intermediate sequence $y_t$ onto the recording medium 14 by way of a recording amplifier 13 including a recording head.

The recording medium 14 is typically an optical disk such as a Blu-ray Disc, a CD-RW (Compact Disk ReWritable) or a DVD±RW (Digital Versatile Disk ReWritable). The recording amplifier 13 records data received by the modulation circuit 11 from the preceding stage not shown in the figure as a sequence of pieces of information to be recorded onto the recording medium 14.

A reproduction amplifier 15 including a reproduction head detects a signal reproduced from the recording medium 14 and outputs the result of the detection to an equalizer 16. The equalizer 16 carries out an equalization process for a target transmission line model close to the frequency characteristic of a transmission line on the reproduced signal received from the reproduction amplifier 15 to generate a transmission-line output Z. An example of the equalization process is a PR equalization process. Then, the equalizer 16 outputs the transmission-line output Z to a PLL (Phase Locked Loop) 17 and a sampling circuit 18.

The PLL 17 extracts clock components from the transmission-line output Z on a transmission line including the recording medium 14 to generate a clock signal synchronized with the reproduced signal. The PLL 17 then outputs the generated clock signal to the sampling circuit 18, a Viterbi decoding circuit 19 and a demodulation circuit 20.

The sampling circuit 18 samples the transmission-line output Z received from the equalizer 16 in synchronization with the clock signal received from the PLL 17 to convert the transmission-line output Z into data, which is shown in the figure as a sampled sequence $Z_t$. The sampling circuit 18 then supplies the sampled sequence $Z_t$ to the Viterbi decoding circuit 19. The Viterbi decoding circuit 19 carries out a Viterbi decoding process on the sampled sequence $Z_t$ received from the sampling circuit 18 to produce a most probable modulated sequence $x_t$ corresponding to the output of the modulation circuit 11.

The demodulation circuit 20 is the counterpart of the modulation circuit 11. The demodulation circuit 20 demodulates the most probable modulated sequence $x_t$ received from the Viterbi decoding circuit 19 and outputs the result of the demodulation process to a succeeding stage not shown in the figure.

FIG. 2 is a diagram showing a typical configuration of the Viterbi decoding circuit 19 employed in the recording/reproduction apparatus shown in FIG. 1.

As shown in FIG. 2, the typical configuration of the Viterbi decoding circuit 19 comprises a BM (Branch Metric) computation circuit 41, an ACS (Add, Compare and Select) circuit 42, a path memory 43 and a most-probable determination circuit 44.

The BM computation circuit 41 uses the sampled sequence $Z_t$ received as an input signal to compute branch-metric data for state transitions, which are each a transition from a state to another, and outputs the branch-metric data to the ACS circuit 42.

The ACS circuit 42 adds path-metric data of a state immediately preceding the present state to the branch-metric data received from the BM computation circuit 41 to produce a sum. If paths merge at the path memory 43 to be described later, the ACS circuit 42 adds path-metric data of a state immediately preceding the present state to the branch-metric data received from the BM computation circuit 41 to produce a sum for each of the merging paths, and compares the sums with each other to select the smallest one. The ACS circuit 42 then uses the selected sum resulting from of the addition, comparison and selection processes as updated path-metric data of the present state. Finally, the ACS circuit 42 outputs the result of the selection of the sums to the path memory 43 and the most-probable determination circuit 44. In the following description, the path-metric data may be referred to simply as metric data in some cases.

The path memory 43 is a plurality of shift registers provided at a plurality of stages each identified by a stage number as registers each composed of an array of flip-flops. Each of the flip-flops serves as a memory. A value stored in a memory is subjected to a select-shift operation before being shifted to a next memory. To put it in detail, a value to be stored in a memory provided at any specific stage is selected among values, which are received from memories provided at a stage preceding the specific stage through merging paths cited above, in dependence on the aforementioned selection result received from the ACS circuit 42, and the selected value is then stored in the memory before being shifted to memories provided at a stage immediately following the specific stage. These operations to select, store and shift a value are carried out repeatedly. The operation to select a value to be stored in a memory provided at any specific stage among values from memories at a stage preceding the specific stage in dependence on the aforementioned selection result received from the ACS circuit 42 agrees with the operation carried out by the ACS circuit 42 to select a smallest sum among sums computed for merging paths as described above.

The most-probable determination circuit 44 fetches an output signal from memories provided at the last stage and supplies the fetched output signal to the demodulation circuit 20 as the modulated sequence $x_t$. For example, assume that the path memory 43 is composed of 16 stages. In this case, the most-probable determination circuit 44 fetches an output signal from memories composing a shift register provided at the $16^{th}$ stage. In this way, the most probable signal reproduced at a time leading ahead of the present time by 16 clocks is firmly determined.

It is to be noted that, if the above operation to select a value is not carried out in the path memory 43 as an operation agreeing with merging of paths, the most-probable determination circuit 44 carries out a most probable determination process to extract an output signal from path memories for storing minimum path-metric data for a state on the basis of a selection result received the ACS circuit 42, and supplies the output signal extracted in the most probable determination process to the demodulation circuit 20 as the modulated sequence $x_t$.

By referring to FIGS. 3 and 4, the following description explains a PR transmission line for a case in which (1, 7) RLL (Run Length Limited) codes for d (minimum run length)=1 are used. It is to be noted that, in the typical configurations shown in FIGS. 3 and 4, a circle represents a state whereas a label attached to an arrow represents a branch or a transition. An RLL code is a code in which the number of 0s sandwiched between is in a modulated code is limited. A (d, k) RLL code is an RLL code with a minimum run length d set for a sequence of 0s sandwiched between 1s and a maximum run length k set for the sequence of 0s sandwiched between 1s. For example, a (1, 7) RLL code has a minimum run length of 1 and a maximum run length of 7 for the sequence of 0s sandwiched between 1s.

FIG. 3 is a diagram showing state transitions of a PR (1, x, 1) transmission line with a constraint length of 3 for a case in which (1, 7) RLL codes are used. It is to be noted that the PR (1, x, 1) transmission line with a constraint length of 3 can be typically a PR (1, 1, 1) transmission line or a PR (1, 2, 1) transmission line. Since these typical transmission lines are different from each other only in that they have different theoretical values (or identification reference values) of transitions c, they are all explained below as the PR (1, x, 1) transmission line.

In the case of the typical configuration shown in FIG. 3, notation c000 denotes a transition from state S00 to state S00. Notation c001 denotes a transition from state S00 to state S01. Notation c011 denotes a transition from state S01 to state S11. Notation c111 denotes a transition from state S11 to state S11. Notation c110 denotes a transition from state S11 to state S10. Notation c100 denotes a transition from state S10 to state S00.

That is to say, in the diagram showing state transitions of a PR (1, x, 1) transmission line with a constraint length of 3, d (minimum run length)=1 shrinks the number of state transitions to 4 and the number of states to 4.

FIG. 4 is a diagram showing transitions of states of a PR (1, x, x, 1) transmission line with a constraint length of 4 for a case in which (1, 7) RLL codes are used. It is to be noted that the PR (1, x, x, 1) transmission line with a constraint length of 4 can be typically a PR (1, 2, 2, 1) transmission line or a PR (1, 3, 3, 1) transmission line. Since these typical transmission lines are different from each other only in that they have different theoretical values (or identification reference values) of transitions c, they are all explained below as the PR (1, x, x, 1) transmission line.

In the case of the typical configuration shown in FIG. 4, notation c0000 denotes a transition from state S000 to state S000. Notation c0001 denotes a transition from state S000 to state S001. Notation c0011 denotes a transition from state S001 to state S011. Notation c0111 denotes a transition from state S011 to state S111. Notation c0110 denotes a transition from state S011 to state S110. Notation c1111 denotes a transition from state S111 to state S111. Notation c1110 denotes a transition from state S111 to state S110. Notation c0011 denotes a transition from state S110 to state S100. Notation c1001 denotes a transition from state S100 to state S001. Notation c1000 denotes a transition from state S100 to state S000.

That is to say, in the diagram showing transitions of states of a PR (1, x, x, 1) transmission line with a constraint length of 4, d (minimum run length)=1 shrinks the number of values to 7 and the number of states to 6.

As described above, in a PR transmission line, a reproduced signal value is not confirmed by a state S itself. Instead, it is not until a transition c from a state S to a state S that a reproduced signal value is identified firmly.

By referring to FIGS. 5 and 6, the following description explains details of the Viterbi decoding circuit 19 for the PR (1, x, 1) transmission line, the state transitions of which are shown in FIG. 3. It is to be noted that FIG. 5 is a diagram showing typical configurations of the branch-metric computation circuit 41 and the ACS circuit 42 for the PR (1, x, 1) transmission line, the state transitions of which are shown in FIG. 3. On the other hand, FIG. 6 is a diagram showing a typical configuration of the path memory 43 for the PR (1, x, 1) transmission line, the state transitions of which are shown in FIG. 3.

In the typical configuration shown in FIG. 5, the branch-metric computation circuit 41 includes as many branch-metric computation sections 61, which are used for computing BM (branch-metric data) for every transition from a state to another, as the state transitions. In the case of the typical configuration shown in FIG. 5, the number of state transitions is 6. Thus, the branch-metric computation circuit 41 includes 6 branch-metric computation sections 61-1 to 61-6. Each of the branch-metric computation sections 61-1 to 61-6 calculates branch-metric data bm representing the likelihood of a state transition c and outputs the branch-metric data bm to the ACS circuit 42. It is to be noted that symbol cABC (where suffixes A, B and C each represent the integer 0 or 1) assigned to a state transition c denotes the theoretical value (the identification reference value) of the state transition c. In addition, symbol $n^2$ used in the following description denotes the square of n.

To put it concretely, let us assume that a reproduced signal (or a sampled sequence) completing a PR equalization at a time k is $z_k$. In this case, the branch-metric computation section 61-1 computes branch-metric data $bm000_k$ (=$(z_k-c000)^2$), which represents the likelihood of the state transition c000, and outputs the branch-metric data $bm000_k$ to an ACS section 62-1. By the same token, the branch-metric computation section 61-2 computes branch-metric data $bm100_k$ (=$(z_k-c100)^2$), which represents the likelihood of the state transition c100, and outputs the branch-metric data $bm100_k$ also to the ACS section 62-1. In the same way, the branch-metric computation section 61-3 computes branch-metric data $bm001_k$ (=$(z_k-c001)^2$), which represents the likelihood of the state transition c001, and outputs the branch-metric data $bm001_k$ to an ACS section 62-2. Likewise, the branch-metric computation section 61-4 computes branch-metric data $bm110_k$ $(=(z_k-c110)^2)$, which represents the likelihood of the state transition c110, and outputs the branch-metric data $bm110_k$ to an ACS section 62-3. Similarly, the branch-metric computation section 61-5 computes branch-metric data $bm001_k$ $(=(z_k-c011)^2)$ which represents the likelihood of the state transition c011, and outputs the branch-metric data $bm001_k$ to an ACS section 62-4. By the same token, the branch-metric computation section 61-6 computes branch-metric data $bm111_k$ $(=(z_k-c111)^2)$, which represents the likelihood of the state transition c111, and outputs the branch-metric data $bm111k$ also to the ACS section 62-4.

The ACS circuit 42 adds path-metric data stored internally as path-metric data of a state immediately preceding the present state to the branch-metric data received from the branch-metric computation circuit 41 to produce a sum. The ACS circuit 42 then uses the sum as updated path-metric data m of the present state. The path-metric data m is the likelihood of a history up to state S. The ACS circuit 42 includes as many ACS (add, compare and select) sections 62 as states. In the case of the typical configuration shown in FIG. 5, the number of states is 4. Thus, the ACS circuit 42 includes 4 ACS sections 62-1 to 62-4. It is to be noted that the ACS sections 62-1 to 62-4 with path merging existing each compare the sum of path-metric data of a state immediately preceding the present state for one path and the branch-metric data with the sum of path-metric data of a state immediately preceding the present state for the other path and the branch-metric data, selecting the smaller one. The ACS circuit 42 then uses the selected smaller sum as updated path-metric data of the present state. Finally, the ACS circuit 42 outputs a selection result indicating which sum has been selected to the path memory 43.

To put it concretely, the ACS section 62-1 updates the path-metric data $m00_k$, which is the likelihood of a history up to state S00. To be more specific, the ACS section 62-1 adds the path-metric data $m00_{k-1}$ stored internally in the ACS section 62-1 as the path-metric data of the state immediately preceding the present state to the branch-metric data $bm000_k$ received from the branch-metric computation section 61-1 to produce a first sum. The ACS section 62-1 also adds the path-metric data $m10_{k-1}$ stored internally in the ACS section 62-3 as the path-metric data of the state immediately preceding the present state to the branch-metric data $bm100_k$ received from the branch-metric computation section 61-2 to produce a second sum. Then, the ACS section 62-1 compares the first and second sums with each other in order to select the smaller one to be used as updated path-metric data $m00_k$ of the present state. Finally, the ACS section 62-1 outputs a selection result sel00 to a memory included in the path memory 43 as a memory used for storing the value of state S00. The computations and the comparison, which are carried out by the ACS section 62-1, can be expressed by Eq. (1) given as follows:

$$m00_k = \min\{m00_{k-1}+bm000_k, m10_{k-1}+bm100_k\} \quad (1)$$

On the other hand, the ACS section 62-2 updates the path-metric data $m01_k$, which is the likelihood of a history up to state S01. To put it concretely, the ACS section 62-2 adds the path-metric data $m00_{k-1}$ stored internally in the ACS section 62-1 as the path-metric data of the state immediately preceding the present state to the branch-metric data $bm001_k$ received from the branch-metric computation section 61-3 to produce a sum and uses the sum as updated path-metric data $m01_k$ of the present state. The computation carried out by the ACS section 62-2 can be expressed by Eq. (2) given as follows:

$$m01_k = m00_{k-1}+bm001_k \quad (2)$$

By the same token, the ACS section 62-3 updates the path-metric data $m10_k$, which is the likelihood of a history up to state S10. To put it concretely, the ACS section 62-3 adds the path-metric data $m11_{k-1}$ stored internally in the ACS section 62-4 as the path-metric data of the state immediately preceding the present state to the branch-metric data $bm110_k$ received from the branch-metric computation section 61-4 to produce a sum and uses the sum as updated path-metric data $m10_k$ of the present state. The computation carried out by the ACS section 62-3 can be expressed by Eq. (3) given as follows:

$$m10_k = m11_{k-1}+bm110_k \quad (3)$$

In the same way as the ACS section 62-1, the ACS section 62-4 updates the path-metric data $m11_k$, which is the likelihood of a history up to state S11. To put it concretely, the ACS section 62-4 adds the path-metric data $m01_{k-1}$ stored internally in the ACS section 62-2 as the path-metric data of the state immediately preceding the present state to the branch-metric data $bm011_k$ received from the branch-metric computation section 61-5 to produce a first sum. The ACS section 62-4 also adds the path-metric data $m11_{k-1}$ stored internally in the ACS section 62-4 as the path-metric data of the state immediately preceding the present state to the branch-metric data $bm111_k$ received from the branch-metric computation section 61-6 to produce a second sum. Then, the ACS section 62-4 compares the first and second sums in order to select the smaller one to be used as updated path-metric data $m11_k$ of the present state. Finally, the ACS section 62-4 outputs a selection result sel11 to a memory included in the path memory 43 as a memory used for storing the value of state S11. The computations and the comparison, which are carried out by the ACS section 62-4, can be expressed by Eq. (4) given as follows:

$$m11_k = \min\{m11_{k-1}+bm111_k, m01_{k-1}+bm011_k\} \quad (4)$$

The path memory 43 shown in FIG. 6 depicts a trellis expressing the state-transition diagram shown in FIG. 3 in terms of sequences along the time axis. A circle represents a state S shown in FIG. 3 whereas an arrow represents a state transition c. Each shift register employed in the path memory 43 shown in FIG. 6 has 4 memories having the same form as the 4-state trellis expressing the state-transition diagram shown in FIG. 3 in terms of sequences along the time axis. That is to say, the Viterbi decoding circuit 19 for a PR (1, x, 1) transmission line carries out a decoding process on the basis of the trellis expressing the state-transition diagram shown in FIG. 3 in terms of sequences along the time axis.

Thus, a circle in the path memory 43 also represents a memory such as a flip-flop. In the typical configuration shown in FIG. 6, the number of stages of memories composing the path memory 43 is 3. It is to be noted, however, that the number of stages can be actually 16 or 32 for example.

In the path memory 43, an operation to select a value among values stored in memories at a preceding stage is carried out in dependence on a selection result, which is the result of selection carried out by the ACS circuit 42, and the selected value is shifted to a memory at the stage immediately following the preceding stage repeatedly. To put it concretely, in the path memory 43, a value to be stored in a memory for state S00 at any specific stage is a value selected among a value stored in a memory for state S00 at a stage immediately preceding the specific stage and a value stored in a memory for state S10 at the stage immediately preceding the specific stage in accordance with a selection result sel00 received from the ACS section 62-1. The selected value stored in the memory for state S00 at the specific stage is then shifted (output) to a memory for state S00 at a stage immediately following the specific stage and a memory for state S01 at the stage immediately following the specific stage. By the same token, in the path memory 43, a value to be stored in a memory for state S11 at the specific stage is a value selected among a value stored in a memory for state S11 at the stage immediately preceding the specific stage and a value stored in a memory for state S01 at the stage immediately preceding the specific stage in accordance with a selection result sel11 received from the ACS section 62-4. The selected value stored in the memory for state S11 at the specific stage is then shifted (output) to a memory for state S11 at the stage immediately following the specific stage and a memory for state S10 at the stage immediately following the specific stage.

It is to be noted that, by way of a memory for state S01 at each specific stage, a value is shifted from a memory at a stage immediately preceding the specific stage to a memory existing at a stage immediately following the specific stage as a memory according to a transition c. Thus, for any specific stage in the path memory 43, a value stored in a memory for state S00 at a stage immediately preceding the specific stage is shifted to a memory for state S11 at a stage immediately following the specific stage by way of a memory for state S01 at the specific stage. By the same token, by way of a memory for state S10 at each specific stage, a value is shifted from a memory at a stage immediately preceding the specific stage to a memory existing at a stage immediately following the specific stage as a memory according to a transition c. Thus, for any specific stage in the path memory 43, a value stored in a memory for state S11 at a stage immediately preceding the specific stage is shifted to a memory for state S00 at a stage immediately following the specific stage by way of a memory for state S10 at the specific stage.

As described above, a value to be stored in any path memory provided at any specific stage identified by a certain stage number as a path memory at which paths merge is selected among values stored in path memories provided at stages immediately following the specific stage in accordance with a selection result produced by a process carried out by the ACS circuit to select a sum of metric data as a result of comparison of sums. As a result, the most-probable determination circuit 44 fetches data originated from the most probable paths from memories provided at the last stage, and supplies the fetched data to the demodulation circuit 20 as the modulated sequence $x_t$.

By referring to FIGS. 7 and 8, the following description explains details of the Viterbi decoding circuit 19 for the PR (1, x, x, 1) transmission line, the state transitions of which are shown in FIG. 4. It is to be noted that FIG. 7 is a diagram showing typical configurations of the branch-metric computation circuit 41 and the ACS circuit 42 for the PR (1, x, x, 1) transmission line, the state transitions of which are shown in FIG. 4. On the other hand, FIG. 8 is a diagram showing a typical configuration of the path memory 43 for the PR (1, x, x, 1) transmission line, the state transitions of which are shown in FIG. 4. The typical configurations shown in FIGS. 7 and 8 are basically the same as their counterparts included in the Viterbi decoding circuit 19 as shown in FIGS. 5 and 6 respectively except that, in the typical configurations shown in FIGS. 7 and 8, the number of states is 6 and the number of state transitions is 10. Thus, descriptions of their details are not repeated to avoid duplications.

In the typical configuration shown in FIG. 7, the branch-metric computation circuit 41 includes as many branch-metric computation sections 71 as the state transitions. In the case of the typical configuration shown in FIG. 7, the number of state transitions is 10. Thus, the branch-metric computation circuit 41 includes 10 computation sections 71-1 to 71-10.

The branch-metric computation section 71-1 computes branch-metric data $bm0000_k$ ($=(z_k-c0000)^2$), which represents the likelihood of the state transition c0000, and outputs the branch-metric data $bm0000k$ to an ACS section 72-1. By the same token, the branch-metric computation section 71-2 computes branch-metric data $bm1000_k$ ($=(z_k-c1000)^2$), which represents the likelihood of the state transition c1000, and outputs the branch-metric data $bm1000_k$ also to the ACS section 72-1. Likewise, the branch-metric computation section 71-3 computes branch-metric data $bm0001_k$ ($=(z_k-c0001)^2$), which represents the likelihood of the state transition c0001, and outputs the branch-metric data $bm0001_k$ to an ACS section 72-2. By the same token, the branch-metric computation section 71-4 computes branch-metric data $bm1001_k$ ($=(z_k-c1001)^2$), which represents the likelihood of the state transition c1001, and outputs the branch-metric data $bm1001_k$ also to the ACS section 72-2. In the same way, the branch-metric computation section 71-5 computes branch-metric data $bm0011_k$ ($=(z_k-c0011)^2$), which represents the likelihood of the state transition c0011, and outputs the branch-metric data $bm0011_k$ to an ACS section 72-3.

Likewise, the branch-metric computation section 71-6 computes branch-metric data $bm1100_k$ ($=(z_k-c1100)^2$), which represents the likelihood of the state transition c1100, and outputs the branch-metric data $bm1100_k$ to an ACS section 72-4. Similarly, the branch-metric computation section 71-7 computes branch-metric data $bm0110_k$ ($=(z_k-c0110)^2$), which represents the likelihood of the state transition c0110, and outputs the branch-metric data $bm0110_k$ to an ACS section 72-5. By the same token, the branch-metric computation section 71-8 computes branch-metric data $bm1110_k$ ($=(z_k-c1110)^2$), which represents the likelihood of the state transition c1110, and outputs the branch-metric data $bm1110_k$ also to the ACS section 72-5. Similarly, the branch-metric computation section 71-9 computes branch-metric data $bm0111_k$ ($=(z_k-c0111)^2$), which represents the likelihood of the state transition c0111, and outputs the branch-metric data $bm0111_k$ to an ACS section 72-6. By the same token, the branch-metric computation section 71-10 computes branch-metric data $bm1111_k$ ($=(z_k-c1111)^2$), which represents the likelihood of the state transition c1111, and outputs the branch-metric data $bm1111_k$ also to the ACS section 72-6.

The ACS circuit 42 includes as many ACS (add, compare and select) sections 72 as states. In the case of the typical configuration shown in FIG. 7, the number of states is 6. Thus, the ACS circuit 42 includes 6 ACS sections 72-1 to 72-6.

The ACS section 72-1 updates path-metric data $m000_k$, which is the likelihood of a history up to state S000. To be more specific, the ACS section 72-1 adds the path-metric data $m000_{k-1}$ stored internally in the ACS section 72-1 as the path-metric data of the state immediately preceding the present state to the branch-metric data $bm0000_k$ received from the branch-metric computation section 71-1 to produce a first sum. The ACS section 72-1 also adds the path-metric data $m100_{k-1}$ stored internally in the ACS section 72-4 as the path-metric data of the state immediately preceding the present state to the branch-metric data $bm1000_k$ received from the branch-metric computation section 71-2 to produce a second sum. Then, the ACS section 72-1 compares the first and second sums in order to select the smaller one to be used as updated path-metric data $m000_k$ of the present state. Finally, the ACS section 72-1 outputs a selection result sel000 to a memory included in the path memory 43 as a memory used for storing the value of state S000. The computation and the comparison, which are carried out by the ACS section 72-1, can be expressed by Eq. (5) given as follows:

$$m000_k=\min\{m000_{k-1}+bm0000_k, m100_{k-1}+bm1000k\} \quad (5)$$

By the same token, the ACS section 72-2 updates path-metric data $m001_k$, which is the likelihood of a history up to state S001. To be more specific, the ACS section 72-2 adds the path-metric data $m000_{k-1}$ stored internally in the ACS section 72-1 as the path-metric data of the state immediately preceding the present state to the branch-metric data $bm0001_k$ received from the branch-metric computation section 71-3 to produce a first sum. The ACS section 72-2 also adds the path-metric data $m100_{k-1}$ stored internally in the ACS section 72-4 as the path-metric data of the state immediately preceding the present state to the branch-metric data $bm1001_k$ received from the branch-metric computation section 71-4 to produce a second sum. Then, the ACS section 72-2 compares the first and second sums in order to select the smaller one to be used as updated path-metric data $m001_k$ of the present state. Finally, the ACS section 72-2 outputs a selection result sel001 to a memory included in the path memory 43 as a memory used for storing the value of state S001. The computation and the comparison, which are carried out by the ACS section 72-2, can be expressed by Eq. (6) given as follows:

$$m001_k=\min\{m000_{k-1}+bm0001_k, m100_{k-1}+bm1001_k\} \quad (6)$$

On the other hand, the ACS section 72-3 updates path-metric data $m011_k$, which is the likelihood of a history up to state S011. To be more specific, the ACS section 72-3 adds the path-metric data $m001_{k-1}$ stored internally in the ACS section 72-2 as the path-metric data of the state immediately preceding the present state to the branch-metric data $bm0011_k$ received from the branch-metric computation section 71-5 to produce a sum. Then, the ACS section 72-3 uses the sum as updated path-metric data $m011_k$ of the present state. The computation carried out by the ACS section 72-3 can be expressed by Eq. (7) given as follows:

$$m011_k=m001_{k-1}+bm0011_k \quad (7)$$

By the same token, the ACS section 72-4 updates path-metric data $m100_k$, which is the likelihood of a history up to state S100. To be more specific, the ACS section 72-4 adds the path-metric data $m110_{k-1}$ stored internally in the ACS section 72-5 as the path-metric data of the state immediately preceding the present state to the branch-metric data $bm1100_k$ received from the branch-metric computation section 71-6 to produce a sum. Then, the ACS section 72-4 uses the sum as updated path-metric data $m100_k$ of the present state. The computation carried out by the ACS section 72-4 can be expressed by Eq. (8) given as follows:

$$m100_k=m110_{k-1}+bm1100_k \quad (8)$$

The ACS section 72-5 updates path-metric data $m110_k$, which is the likelihood of a history up to state S110. To be more specific, the ACS section 72-5 adds the path-metric data $m111_{k-1}$ stored internally in the ACS section 72-6 as the path-metric data of the state immediately preceding the present state to the branch-metric data $bm1110_k$ received from the branch-metric computation section 71-8 to produce a first sum. The ACS section 72-5 also adds the path-metric data $m011_{k-1}$ stored internally in the ACS section 72-3 as the path-metric data of the state immediately preceding the present state to the branch-metric data $bm0110_k$ received from the branch-metric computation section 71-7 to produce a second sum. Then, the ACS section 72-5 compares the first and second sums in order to select the smaller one to be used as updated path-metric data $m110_k$ of the present state. Finally, the ACS section 72-5 outputs a selection result sel110 to a memory included in the path memory 43 as a memory used for storing the value of state S110. The computation and the comparison, which are carried out by the ACS section 72-5, can be expressed by Eq. (9) given as follows:

$$m110_k=\min\{m111_{k-1}+bm1110_k, m011_{k-1}+bm0110_k\} \quad (9)$$

By the same token, the ACS section 72-6 updates path-metric data $m111_k$, which is the likelihood of a history up to state S111. To be more specific, the ACS section 72-6 adds the path-metric data $m111_{k-1}$ stored internally in the ACS section 72-6 as the path-metric data of the state immediately preceding the present state to the branch-metric data $bm1111_k$ received from the branch-metric computation section 71-10 to produce a first sum. The ACS section 72-6 also adds the path-metric data $m011_{k-1}$ stored internally in the ACS section 72-3 as the path-metric data of the state immediately preceding the present state to the branch-metric data $bm0111_k$ received from the branch-metric computation section 71-9 to produce a second sum. Then, the ACS section 72-6 compares the first and second sums in order to select the smaller one to be used as updated path-metric data $m111_k$ of the present state. Finally, the ACS section 72-6 outputs a selection result sel111 to a memory included in the path memory 43 as a memory used for storing the value of state S111. The computation and the comparison, which are carried out by the ACS section 72-6, can be expressed by Eq. (10) given as follows:

$$m111_k=\min\{m111_{k-1}+bm1111_k, (m011_{k-1}+bm0111_k\} \quad (10)$$

The path memory 43 shown in FIG. 8 depicts a trellis expressing the state-transition diagram shown in FIG. 4 in terms of sequences along the time axis. A circle represents a state S shown in FIG. 4 whereas an arrow represents a state transition c. Each shift register employed in the path memory 43 shown in FIG. 8 has 6 memories having the same form as the 6-state trellis expressing the state-transition diagram shown in FIG. 4 in terms of sequences along the time axis. That is to say, the Viterbi decoding circuit 19 for a PR (1, x, x, 1) transmission line carries out a decoding process on the basis of the trellis expressing the state-transition diagram shown in FIG. 4 in terms of sequences along the time axis.

In the path memory 43 shown in FIG. 8, an operation to select a value among values stored in memories at a preceding stage is carried out in dependence on the result of the selection carried out by the ACS circuit 42, and the selected value is shifted to a memory at the stage immediately following the preceding stage repeatedly. That is to say, in the path memory 43, a value to be stored in a memory for state S000 at any specific stage is a value selected among a value stored in a memory for state S000 at a stage immediately preceding the specific stage and a value stored in a memory for state S100 at the stage immediately preceding the specific stage in accordance with a selection result sel000 received from the ACS section 72-1. The selected value stored in the memory for state S000 at the specific stage is then shifted (output) to a memory for state S000 at a stage immediately following the specific stage and a memory for state S000 at the stage immediately following the specific stage. By the same token, in the path memory 43, a value to be stored in a memory for state S001 at the specific stage is a value selected among a value stored in a memory for state S000 at the stage immediately preceding the specific stage and a value stored in a memory for state S100 at the stage immediately preceding the specific stage in accordance with a selection result sel001 received from the ACS section 72-2. The selected value stored in the memory for state S001 at the specific stage is then shifted (output) to a memory for state S011 at the stage immediately following the specific stage.

In addition, in the path memory 43, a value to be stored in a memory for state S110 at any specific stage is a value selected among a value stored in a memory for state S011 at a stage immediately preceding the specific stage and a value stored in a memory for state S111 at the stage immediately preceding the specific stage in accordance with a selection result sel001 received from the ACS section 72-5. The selected value stored in the memory for state S110 at the specific stage is then shifted (output) to a memory for state S100 at a stage immediately following the specific stage. By the same token, in the path memory 43, a value to be stored in a memory for state S111 at the specific stage is a value selected among a value stored in a memory for state S011 at the stage immediately preceding the specific stage and a value stored in a memory for state S111 at the stage immediately preceding the specific stage in accordance with a selection result sel111 received from the ACS section 72-6. The selected value stored in the memory for state S111 at the specific stage is then shifted (output) to a memory for state S110 at the stage immediately following the specific stage and a memory for state S111 at the stage immediately following the specific stage.

It is to be noted that, by way of a memory for state S011 at each specific stage, a value is shifted from a memory at a stage immediately preceding the specific stage repeatedly to a memory existing at a stage immediately following the specific stage as a memory according to a transition c. Thus, for any specific stage in the path memory 43, a value stored in a memory for state S001 at a stage immediately preceding the specific stage is shifted to a memory for state S110 at a stage immediately following the specific stage and a memory for state S111 at the same following stage by way of a memory for state S011 at the specific stage. By the same token, by way of a memory for state S100 at each specific stage, a value is shifted from a memory at a stage immediately preceding the specific stage repeatedly to a memory existing at a stage immediately following the specific stage as a memory according to a transition c. Thus, for any specific stage in the path memory 43, a value stored in a memory for state S110 at a stage immediately preceding the specific stage is shifted to a memory for state S000 at a stage immediately following the specific stage and a memory for state S001 at the same following stage by way of a memory for state S100 at the specific stage.

As is obvious from the above descriptions, the branch-metric computation circuit 41, the ACS circuit 42 and the path memory 43 each have different configurations for different constraint lengths, that is, different state counts. In general, the smaller the d (minimum run length) and the larger the constraint length, the larger the size of the circuit.

However, a change in constraint length or a change in inter-code interference length is attributed to a change of the frequency characteristic of the PR transmission line and, normally, if the structure of the recording medium as well as the structure of the recording head are determined, an optimum PRML (Partial Response Maximum Likelihood) method is generally determined to be a method of a certain type.

On the other hand, a demand for downward compatibility with specifications of the optical disk, which has been becoming popular so far, is also high. In addition, even for the same generation, a plurality of specification sets exists so that a recording/reproduction apparatus for recent optical disks is required absolutely to keep up with different specifications of frequency characteristics. The specification sets include specifications for disks of addition-recording and renewal-recording types, single-layer and multiple-layer disks as well as low-density and high-density disks.

For the reasons described above, a single recording/reproduction apparatus is required to have a plurality of operating modes for different constraint lengths such as PR (1, 2, 1) and PR (1, 3, 3, 1). Thus, it is necessary to provide such a single recording/reproduction apparatus with a plurality of Viterbi decoding circuits of different types having different constraint lengths and use the apparatus by switching the Viterbi decoding circuit from one having a certain constraint length to another having a different constraint length. In addition, it is necessary to also provide a branch-metric computation circuit 41, an ACS circuit 42 and a path memory 43, which have been explained by referring to FIGS. 5 to 8, for each type having a constraint length. If a single recording/reproduction apparatus needs to be provided with a plurality of operating modes for different constraint lengths as described above, however, the recording/reproduction apparatus will have a problem of a large size of the circuit or a problem of limitation on the type of the Viterbi decoding circuit.

In addition, high speed operations are required also in a Viterbi decoding circuit employed in the recording/reproduction apparatus in order to meet a higher demand raised in recent years as a demand for a high recording/reproduction rate. A portion determining the operating speed of a Viterbi decoding circuit is the ACS circuit for carrying out addition, subtraction (or comparison) and comparison operations in a short possible period such as 1 clock cycle. In addition, if the subtraction (or comparison) processing carried out by the ACS circuit as processing having an amount corresponding to a plurality of clock cycles can all be completed in a time slot, the operating speed can be further increased due to such early completion. The portion determining the operating speed of a Viterbi decoding circuit is referred to as a critical path.

Japanese Patent Laid-open No. Hei 8-84082 discloses a proposed technique to increase the operating speed by at least two times by handling state transitions occurring during at least two time slots as one state transition occurring in one time slot. In this case, however, the size of the circuit must be increased by up to two times in exchange for the increase in operating speed.

By referring to FIGS. 9 to 12, the following description explains a Viterbi decoding circuit 19 having its operating speed increased by carrying out processing of the amount corresponding to two time slots in just one time slot.

FIGS. 9 and 10 are diagrams showing a Viterbi decoding circuit 19 provided for the PR (1, x, 1) transmission line shown in FIG. 3 as a Viterbi decoding circuit 19 capable of carrying out processing of the amount corresponding to two time slots in just one time slot. That is to say, the Viterbi decoding circuit 19 shown in FIGS. 9 and 10 is capable of carrying out processing, which is performed by the Viterbi decoding circuit 19 shown in FIGS. 5 and 6 in two time slots, in just one time slot.

In the typical configuration shown in FIG. 9, the branch-metric computation circuit 41 has branch-metric computation sections 81-1 to 81-10 each used for calculating branch-metric data for state transitions occurring over two time slots in the configuration shown in FIG. 5. Each of the branch-metric computation sections 81-1 to 81-10 computes branch-metric data bm for state transitions occurring over two time slots and outputs the branch-metric data bm to an ACS circuit 42. That is to say, the branch-metric computation circuit 41 shown in FIG. 9 computes branch-metric data $bmABCD_k$ ($=bmABC_{k-1}+bmBCD_k$) where $bmABC_{k-1}$ is equal to the square $(z_{k-1}-cABC)\hat{}2$, $bmBCD_k$ is equal to the square $(z_k-cBCD)\hat{}2$ whereas suffixes A, B, C and D are each the integer 0 or 1.

To put it concretely, the branch-metric computation section 81-1 computes branch-metric data $bm0000_k$ $(=bm000_{k-1}+bm000_k)$ where branch-metric data $bm000_{k-1}$ is equal to the square $(z_{k-1}-c000)\hat{}2$ and branch-metric data $bm000_k$ is equal to the square $(z_k-c000)\hat{}2$, outputting the branch-metric data $bm0000_k$ to the ACS section 82-1. In this case, notation $bm0000_k$ denotes branch-metric data corresponding to a state transition occurring over two time slots, notation $bm000_k$ denotes branch-metric data corresponding to a state transition from a state immediately preceding the present state and notation $bm0000_{k-1}$ denotes branch-metric data corresponding to a state transition from a state immediately leading ahead of the state immediately preceding the present state.

In the following description, $bmABC_{k-1}$ is equal to the square $(z_{k-1}-cABC)\hat{}2$, $bmBCD_k$ is equal to the square $(z_k-cBCD)\hat{}2$ whereas suffixes A, B, C and D are each the integer 0 or 1 as described above. Thus, by the same token, the branch-metric computation section 81-2 computes branch-metric data $bm1000_k$ $(=bm100_{k-1}+bm000_k)$ and outputs the branch-metric data $bm1000_k$ also to the ACS section 82-1 where notation $bm1000_k$ denotes branch-metric data corresponding to a state transition occurring over two time slots. In the same way, the branch-metric computation section 81-3 computes branch-metric data $bm1100_k$ $(=bm110_{k-1}+bm100_k)$ and outputs the branch-metric data $bm1100_k$ also to the ACS section 82-1 where notation $bm1100_k$ denotes branch-metric data corresponding to a state transition occurring over two time slots.

Similarly, the branch-metric computation section 81-4 computes branch-metric data $bm0001_k$($=bm000_{k-1}+bm001_k$) and outputs the branch-metric data $bm0001_k$ to the ACS section 82-2 where notation $bm0001_k$ denotes branch-metric data corresponding to a state transition occurring over two time slots. Likewise, the branch-metric computation section 81-5 computes branch-metric data $bm1001_k$ $(=bm100_{k-1}+bm001_k)$ and outputs the branch-metric data $bm1001_k$ also to the ACS section 82-2 where notation $bm1001_k$ denotes branch-metric data corresponding to a state transition occurring over two time slots. By the same token, the branch-metric computation section 81-6 computes branch-metric data $bm0110_k$ $(=bm011_{k-1}+bm110_k)$ and outputs the branch-metric data $bm0110_k$ to the ACS section 82-3 where notation $bm0110_k$ denotes branch-metric data corresponding to a state transition occurring over two time slots. In the same way, the branch-metric computation section 81-7 computes branch-metric data $bm1110_k$ $(=bm111_{k-1}+bm110_k)$ and outputs the branch-metric data $bm1110_k$ also to the ACS section 82-3 where notation $bm1110_k$ denotes branch-metric data corresponding to a state transition occurring over two time slots.

Similarly, the branch-metric computation section 81-8 computes branch-metric data $bm0011_k$($=bm001_{k-1}+bm011_k$) and outputs the branch-metric data $bm0011_k$ to the ACS section 82-4 where notation $bm0011_k$ denotes branch-metric data corresponding to a state transition occurring over two time slots. Likewise, the branch-metric computation section 81-9 computes branch-metric data $bm0111_k$ $(=bm011_{k-1}+bm111_k)$ and outputs the branch-metric data $bm0111_k$ also to the ACS section 82-4 where notation $bm0111_k$ denotes branch-metric data corresponding to a state transition occurring over two time slots. By the same token, the branch-metric computation section 81-10 computes branch-metric data $bm1111_k$ $(=bm111_{k-1}+bm111_k)$ and outputs the branch-metric data $bm111_k$ also to the ACS section 82-4 where notation $bm1111_k$ denotes branch-metric data corresponding to a state transition occurring over two time slots.

The ACS circuit 42 adds path-metric data stored internally as path-metric data of a state immediately leading ahead of the state immediately preceding the present state to the branch-metric data received from the branch-metric computation circuit 41 to produce a sum. If paths merge at the path memory 43, the ACS circuit 42 adds path-metric data of a state immediately leading ahead of a state immediately preceding the present state to branch-metric data received from the branch-metric computation circuit 41 to produce a sum for each of the merging paths, and compares the sums with each other to select the smallest one. The ACS circuit 42 then uses the sum or the smallest sum as updated path-metric data m of the present state. The path-metric data m is the likelihood of a history up to state S. The ACS circuit 42 includes as many ACS sections 82 as states. In the case of the typical configuration shown in FIG. 9, the number of states is 4. Thus, the ACS circuit 42 includes 4 ACS sections 82-1 to 82-4.

The ACS section 82-1 updates the path-metric data $m00_k$, which is the likelihood of a history up to state S00. To be more specific, the ACS section 82-1 adds the path-metric data $m00_{k-2}$ stored internally in the ACS section 82-1 as the path-metric data of a state immediately leading ahead of the state immediately preceding the present state to the branch-metric data $bm0000_k$ received from the branch-metric computation section 81-1 to produce a first sum. The ACS section 82-1 also adds the path-metric data $m10_{k-2}$ stored internally in the ACS section 82-3 as the path-metric data of a state immediately leading ahead of the state immediately preceding the present state to the branch-metric data $bm1000_k$ received from the branch-metric computation section 81-2 to produce a second sum. In addition, the ACS section 82-1 also adds the path-metric data $m11_{k-2}$ stored internally in the ACS section 82-4 as the path-metric data of a state immediately leading ahead of the state immediately preceding the present state to the branch-metric data $bm1100_k$ received from the branch-metric computation section 81-3 to produce a third sum. Then, the ACS section 82-1 compares the first, second and third sums with each other in order to select the smallest one to be used as updated path-metric data $m00_k$ of the present state. Finally, the ACS section 82-1 outputs a selection result sel00 to a memory included in the path memory 43 as a memory used for storing the value of state S00. The computations and the comparison, which are carried out by the ACS section 82-1, can be expressed by Eq. (11) given as follows:

$$m00_k = \min\{m00_{k-2}+bm0000_k, m10_{k-2}+bm1000_k, m11_{k-2}+bm1100_k\} \qquad (11)$$

Likewise, the ACS section 82-2 updates the path-metric data $m01_k$, which is the likelihood of a history up to state S01. To be more specific, the ACS section 82-2 adds the path-metric data $m00_{k-2}$ stored internally in the ACS section 82-1 as the path-metric data of a state immediately leading ahead of the state immediately preceding the present state to the branch-metric data $bm0001_k$ received from the branch-metric computation section 81-4 to produce a first sum. The ACS section 82-2 also adds the path-metric data $m10_{k-2}$ stored internally in the ACS section 82-3 as the path-metric data of a state immediately leading ahead of the state immediately preceding the present state to the branch-metric data $bm1001_k$ received from the branch-metric computation section 81-5 to produce a second sum. Then, the ACS section 82-2 compares the first and second sums with each other in order to select the smaller one to be used as updated path-metric data $m01_k$ of the present state. Finally, the ACS section 82-2 outputs a selection result sel01 to a memory included in the path memory 43 as a memory used for storing the value of state S01. The computations and the comparison, which are carried out by the ACS section 82-2, can be expressed by Eq. (12) given as follows:

$$m01_k = \min\{m00_{k-2}+bm0001_k, m10_{k-2}+bm1001_k\} \quad (12)$$

By the same token, the ACS section 82-3 updates the path-metric data $m10_k$, which is the likelihood of a history up to state S10. To be more specific, the ACS section 82-3 adds the path-metric data $m11_{k-2}$ stored internally in the ACS section 82-4 as the path-metric data of a state immediately leading ahead of the state immediately preceding the present state to the branch-metric data $bm1110_k$ received from the branch-metric computation section 81-7 to produce a first sum. The ACS section 82-3 also adds the path-metric data $m01_{k-2}$ stored internally in the ACS section 82-2 as the path-metric data of a state immediately leading ahead of the state immediately preceding the present state to the branch-metric data $bm0110_k$ received from the branch-metric computation section 81-6 to produce a second sum. Then, the ACS section 82-3 compares the first and second sums with each other in order to select the smaller one to be used as updated path-metric data $m10_k$ of the present state. Finally, the ACS section 82-3 outputs a selection result sel10 to a memory included in the path memory 43 as a memory used for storing the value of state S10. The computations and the comparison, which are carried out by the ACS section 82-3, can be expressed by Eq. (13) given as follows:

$$m10_k = \min\{m11_{k-2}+bm1110_k, m01_{k-2}+bm0110_k\} \quad (13)$$

The ACS section 82-4 updates the path-metric data $m11_k$, which is the likelihood of a history up to state S11. To be more specific, the ACS section 82-4 adds the path-metric data $m11_{k-2}$ stored internally in the ACS section 82-4 as the path-metric data of a state immediately leading ahead of the state immediately preceding the present state to the branch-metric data $bm1111_k$ received from the branch-metric computation section 81-10 to produce a first sum. The ACS section 82-4 also adds the path-metric data $m01_{k-2}$ stored internally in the ACS section 82-2 as the path-metric data of a state immediately leading ahead of the state immediately preceding the present state to the branch-metric data $bm0111_k$ received from the branch-metric computation section 81-9 to produce a second sum. In addition, the ACS section 82-4 also adds the path-metric data $m00_{k-2}$ stored internally in the ACS section 82-1 as the path-metric data of a state immediately leading ahead of the state immediately preceding the present state to the branch-metric data $bm0011_k$ received from the branch-metric computation section 81-8 to produce a third sum. Then, the ACS section 82-4 compares the first, second and third sums with each other in order to select the smallest one to be used as updated path-metric data $m11_k$ of the present state. Finally, the ACS section 82-4 outputs a selection result sel11 to a memory included in the path memory 43 as a memory used for storing the value of state S11. The computations and the comparison, which are carried out by the ACS section 82-1, can be expressed by Eq. (14) given as follows:

$$m11_k = \min\{m11_{k-2}+bm1111_k, m01_{k-2}+bm0111_k, m00_{k-2}+bm0011_k\} \quad (14)$$

A trellis depicted in the path memory 43 of the typical configuration shown in FIG. 10 has only one stage. The number of states is the same as that for the trellis depicted in the path memory 43 shown in FIG. 6. However, the select and shift operations are carried out for every 2 bits (that is, for every two time slots).

The trellis depicted in the path memory 43 shown in FIG. 10 indicates that it is quite within the bounds of possibility that a transition occurs from state S00 to state S00, S01 or S11 at a time immediately following the next time, a transition occurs from state S01 to state S10 or S11 at a time immediately following the next time, a transition occurs from state S10 to state S00 or S01 at a time immediately following the next time and a transition occurs from state S11 to state S00, S10 or S11 at a time immediately following the next time. That is to say, the Viterbi decoding circuit 19 of this case carries out a decoding process on the basis of the trellis expressing a state-transition diagram shown in FIG. 3 as a state-transition diagram of the PR (1, x, 1) transmission line in terms of sequences along the time axis based on units of two time slots.

Thus, in the path memory 43 shown in FIG. 10, a value to be stored instantly in a memory for state S00 at any specific stage is a value selected among a value stored in a memory for state S00 at a stage immediately preceding the specific stage, a value stored in a memory for state S10 at a stage immediately preceding the specific stage and a value stored in a memory for state S11 at the stage immediately preceding the specific stage in accordance with a selection result sel00 received from the ACS section 82-1. The selected value stored instantly in the memory for state S00 at the specific stage is shifted in the same time slot to a memory for state S00 at a stage immediately following the specific stage, a memory for state S01 at a stage immediately following the specific stage and a memory for state S11 at the stage immediately following the specific stage. Similarly, in the path memory 43, a value to be stored instantly in a memory for state S00 at any specific stage is a value selected among a value stored in a memory for state S00 at a stage immediately preceding the specific stage and a value stored in a memory for state S10 at the stage immediately preceding the specific stage in accordance with a selection result sel01 received from the ACS section 82-2. The selected value stored instantly in the memory for state S01 at the specific stage is shifted in the same time slot to a memory for state S10 at a stage immediately following the specific stage and a memory for state S11 at the stage immediately following the specific stage.

By the same token, in the path memory 43, a value to be stored instantly in a memory for state S10 at any specific stage is a value selected among a value stored in a memory for state S01 at a stage immediately preceding the specific stage and a value stored in a memory for state S11 at the stage immediately preceding the specific stage in accordance with a selection result sel10 received from the ACS section 82-3. The selected value stored instantly in the memory for state S10 at the specific stage is shifted in the same time slot to a memory for state S00 at a stage immediately following the specific stage and a memory for state S01 at the stage immediately following the specific stage. In the same way as stage S00, in the path memory 43, a value to be stored instantly in a memory for state S11 at any specific stage is a value selected among a value stored in a memory for state S00 at a stage immediately preceding the specific stage, a value stored in a memory for state S01 at a stage immediately preceding the specific stage and a value stored in a memory for state S11 at the stage immediately preceding the specific stage in accordance with a selection result sel11 received from the ACS section 82-4. The selected value stored instantly in the memory for state S11 at the specific stage is shifted in the same time slot to a memory for state S00 at a stage immediately following the specific stage, a memory for state S10 at a stage immediately following the specific stage and a memory for state S11 at the stage immediately following the specific stage. As a result, data of two time slots is output to the demodulation circuit 20 as the modulated sequence $x_t$.

As is obvious from the above descriptions, the number of branch-metric computation sections increases from 6 in the branch-metric computation circuit 41 shown in FIG. 5 to 10 in the branch-metric computation circuit 41 shown in FIG. 9. However, the number of states employed the ACS circuit 42 remains at 4 as it is. Thus, the number of ACS sections employed in the ACS circuit 42 shown in FIG. 9 also remains the same as that for the ACS circuit 42 shown in FIG. 5. Nevertheless, the number of states preceding the present state by two time slots for the ACS circuit 42 shown in FIG. 9 increases to 3 from 2 states preceding the present state by one time slot for the ACS circuit 42 shown in FIG. 5. Thus, in the ACS circuit 42 shown in FIG. 9, the smallest one among 3 different results of addition is selected as path-metric data.

That is to say, the Viterbi decoding circuit 19 shown in FIGS. 9 and 10 as a Viterbi decoding circuit 19 for carrying out processing of an amount corresponding to two time slots of the configurations shown in FIGS. 5 and 6 in just one time slot has a circuit size much larger than that of the Viterbi decoding circuit 19 shown in FIGS. 5 and 6 as a Viterbi decoding circuit 19 for carrying out processing of one time slot.

FIGS. 11 and 12 are diagrams showing a Viterbi decoding circuit 19 provided for the PR (1, x, x, 1) transmission line shown in FIG. 4 as a Viterbi decoding circuit 19 capable of carrying out processing of the amount corresponding to two time slots of the configurations shown in FIGS. 7 and 8 in just one time slot. That is to say, the Viterbi decoding circuit 19 shown in FIGS. 11 and 12 is capable of carrying out processing, which is performed by the Viterbi decoding circuit 19 shown in FIGS. 7 and 8 in two time slots, in just one time slot.

In addition, the Viterbi decoding circuit 19 shown in FIGS. 11 and 12 is different from the Viterbi decoding circuit 19 shown in FIGS. 9 and 10 only in that the number of states increases to 6 from 4 for the Viterbi decoding circuit 19 shown in FIGS. 9 and 10 whereas the number of state transitions in the Viterbi decoding circuit 19 shown in FIGS. 11 and 12 increases to 16 from 10 for the Viterbi decoding circuit 19 shown in FIGS. 9 and 10. Thus, the Viterbi decoding circuit 19 shown in FIGS. 11 and 12 basically has a configuration identical with that of the Viterbi decoding circuit 19 shown in FIGS. 9 and 10, making it unnecessary to explain the Viterbi decoding circuit 19 shown in FIGS. 11 and 12 in detail.

That is to say, the branch-metric computation circuit 41 shown in FIG. 11 has branch-metric computation sections 91-1 through 91-16 each used for computing branch-metric data corresponding to a state transition occurring over two time slots from a state immediately leading ahead of a state immediately preceding the present state.

The branch-metric computation section 91-1 computes branch-metric data $bm00000_k = 0000_{k-1} + bm0000_k$ and outputs the branch-metric data $bm00000_k$ to the ACS section 92-1 where notation $bm00000_k$ denotes branch-metric data corresponding to a state transition occurring over two time slots in the configuration shown in FIG. 7. By the same token, the branch-metric computation section 91-2 computes branch-metric data $bm10000_k = 1000_{k-1} + bm0000_k$ and outputs the branch-metric data $bm10000_k$ also to the ACS section 92-1 where notation $bm10000_k$ denotes branch-metric data corresponding to a state transition occurring over two time slots. In the same way, the branch-metric computation section 91-3 computes branch-metric data $bm11000_k = 1100_{k-1} + bm1000_k$ and outputs the branch-metric data $bm11000_k$ also to the ACS section 92-1 where notation $bm11000_k$ denotes branch-metric data corresponding to a state transition occurring over two time slots.

Likewise, the branch-metric computation section 91-4 computes branch-metric data $bm00001_k = 0000_{k-1} + bm0001_k$ and outputs the branch-metric data $bm00001_k$ to the ACS section 92-2 where notation $bm00001_k$ denotes branch-metric data corresponding to a state transition occurring over two time slots. By the same token, the branch-metric computation section 91-5 computes branch-metric data $bm10001_k = 1000_{k-1} + bm0001_k$ and outputs the branch-metric data $bm10001_k$ also to the ACS section 92-2 where notation $bm10001_k$ denotes branch-metric data corresponding to a state transition occurring over two time slots. In the same way, the branch-metric computation section 91-6 computes branch-metric data $bm11001_k = 1100_{k-1} + bm1001_k$ and outputs the branch-metric data $bm11001_k$ also to the ACS section 92-2 where notation $bm11001_k$ denotes branch-metric data corresponding to a state transition occurring over two time slots.

Likewise, the branch-metric computation section 91-7 computes branch-metric data $bm00011_k = 0001_{k-1} + bm0011_k$ and outputs the branch-metric data $bm00011_k$ to the ACS section 92-3 where notation $bm00011_k$ denotes branch-metric data corresponding to a state transition occurring over two time slots. By the same token, the branch-metric computation section 91-8 computes branch-metric data $bm10011_k = 1001_{k-1} + bm0001_k$ and outputs the branch-metric data $bm10011_k$ also to the ACS section 92-3 where notation $bm10011_k$ denotes branch-metric data corresponding to a state transition occurring over two time slots. In the same way, the branch-metric computation section 91-9 computes branch-metric data $bm01100_k = 0110_{k-1} + bm1100_k$ and outputs the branch-metric data $bm01100_k$ to the ACS section 92-4 where notation $bm01100_k$ denotes branch-metric data corresponding to a state transition occurring over two time slots. Similarly, the branch-metric computation section 91-10 computes branch-metric data $bm11100_k = 1110_{k-1} + bm1100_k$ and outputs the branch-metric data $bm11100_k$ also to the ACS section 92-4 where notation $bm11100_k$ denotes branch-metric data corresponding to a state transition occurring over two time slots.

Likewise, the branch-metric computation section 91-11 computes branch-metric data $bm00110_k = 0011_{k-1} + bm0110_k$ and outputs the branch-metric data $bm00110_k$ to the ACS section 92-5 where notation $bm00110_k$ denotes branch-metric data corresponding to a state transition occurring over two time slots. By the same token, the branch-metric computation section 91-12 computes branch-metric data $bm01110_k = 0111_{k-1} + bm1110_k$ and outputs the branch-metric data $bm01110_k$ also to the ACS section 92-5 where notation $bm01110_k$ denotes branch-metric data corresponding to a state transition occurring over two time slots. In the same way, the branch-metric computation section 91-13 computes branch-metric data $bm11110_k = 1111_{k-1} + bm1110_k$ and outputs the branch-metric data $bm11110_k$ also to the ACS section 92-5 where notation $bm11110_k$ denotes branch-metric data corresponding to a state transition occurring over two time slots.

Likewise, the branch-metric computation section 91-14 computes branch-metric data $bm00111_k = 0011_{k-1} + bm0111_k$ and outputs the branch-metric data $bm00111_k$ to the ACS section 92-6 where notation $bm00111_k$ denotes branch-metric data corresponding to a state transition occurring over two time slots. By the same token, the branch-metric computation section 91-15 computes branch-metric data $bm01111_k = 0111_{k-1} + bm1111_k$ and outputs the branch-metric data $bm01111_k$ also to the ACS section 92-6 where notation $bm01111_k$ denotes branch-metric data corresponding to a state transition occurring over two time slots. In the same way, the branch-metric computation section 91-16 computes branch-metric data $bm11111_k = 1111_{k-1} + bm1111_k$ and outputs the branch-metric data $bm11111_k$ also to the ACS section 92-6 where notation $bm11111_k$ denotes branch-metric data corresponding to a state transition occurring over two time slots.

The ACS circuit 42 adds path-metric data stored internally as path-metric data of a state immediately leading ahead of the state immediately preceding the present state to branch-metric data received from the branch-metric computation circuit 41 to produce a sum. If paths merge in the path memory 43, the ACS circuit 42 adds path-metric data of a state immediately leading ahead of a state immediately preceding the present state to branch-metric data received from the branch-metric computation circuit 41 to produce a sum for each of the merging paths, and compares the sums with each other to select the smallest one. The ACS circuit 42 then uses the sum or the selected smallest sum as updated path-metric data m of the present state. The path-metric data m is the likelihood of a history up to state S. The ACS circuit 42 includes as many ACS (add, compare and select) sections 62 as states. In the case of the typical configuration shown in FIG. 11, the number of states is 6. Thus, the ACS circuit 42 includes 6 ACS sections 92-1 to 92-6.

To put it concretely, the ACS section 92-1 updates the path-metric data $m000_k$, which is the likelihood of a history up to state S000. To be more specific, the ACS section 92-1 adds the path-metric data $m000_{k-2}$ stored internally in the ACS section 92-1 as the path-metric data of a state immediately leading ahead of the state immediately preceding the present state to the branch-metric data $bm00000_k$ received from the branch-metric computation section 91-1 to produce a first sum. The ACS section 92-1 also adds the path-metric data $m100_{k-2}$ stored internally in the ACS section 92-4 as the path-metric data of a state immediately leading ahead of the state immediately preceding the present state to the branch-metric data $bm10000_k$ received from the branch-metric computation section 91-2 to produce a second sum. In addition, the ACS section 92-1 also adds the path-metric data $m110_{k-2}$ stored internally in the ACS section 92-5 as the path-metric data of a state immediately leading ahead of the state immediately preceding the present state to the branch-metric data $bm11000_k$ received from the branch-metric computation section 91-3 to produce a third sum. Then, the ACS section 92-1 compares the first, second and third sums with each other in order to select the smallest one to be used as updated path-metric data $m000_k$ of the present state. Finally, the ACS section 92-1 outputs a selection result sel000 to a memory included in the path memory 43 as a memory used for storing the value of state S000. The computations and the comparison, which are carried out by the ACS section 92-1, can be expressed by Eq. (15) given as follows:

$$m000_k=\min\{m000_{k-2}+bm00000_k, m100_{k-2}+bm10000_k, m110_{k-2}+bm11000_k\} \quad (15)$$

By the same token, the ACS section 92-2 updates the path-metric data $m001_k$, which is the likelihood of a history up to state S001. To be more specific, the ACS section 92-2 adds the path-metric data $m000_{k-2}$ stored internally in the ACS section 92-1 as the path-metric data of a state immediately leading ahead of the state immediately preceding the present state to the branch-metric data $bm00001_k$ received from the branch-metric computation section 91-4 to produce a first sum. The ACS section 92-2 also adds the path-metric data $m100_{k-2}$ stored internally in the ACS section 92-4 as the path-metric data of a state immediately leading ahead of the state immediately preceding the present state to the branch-metric data $bm10001_k$ received from the branch-metric computation section 91-5 to produce a second sum. In addition, the ACS section 92-2 also adds the path-metric data $m110_{k-2}$ stored internally in the ACS section 92-5 as the path-metric data of a state immediately leading ahead of the state immediately preceding the present state to the branch-metric data $bm11001_k$ received from the branch-metric computation section 91-6 to produce a third sum. Then, the ACS section 92-2 compares the first, second and third sums with each other in order to select the smallest one to be used as updated path-metric data $m001_k$ of the present state. Finally, the ACS section 92-2 outputs a selection result sel001 to a memory included in the path memory 43 as a memory used for storing the value of state S001. The computations and the comparison, which are carried out by the ACS section 92-2, can be expressed by Eq. (16) given as follows:

$$m001_k=\min\{m000_{k-2}+bm00001_k, m100_{k-2}+bm10001_k, m110_{k-2}+bm11001_k\} \quad (16)$$

Likewise, the ACS section 92-3 updates the path-metric data $m011_k$, which is the likelihood of a history up to state S011. To be more specific, the ACS section 92-3 adds the path-metric data $m000_{k-2}$ stored internally in the ACS section 92-1 as the path-metric data of a state immediately leading ahead of the state immediately preceding the present state to the branch-metric data $bm00011_k$ received from the branch-metric computation section 91-7 to produce a first sum. The ACS section 92-3 also adds the path-metric data $m100_{k-2}$ stored internally in the ACS section 92-4 as the path-metric data of a state immediately leading ahead of the state immediately preceding the present state to the branch-metric data $bm10011_k$ received from the branch-metric computation section 91-8 to produce a second sum. Then, the ACS section 92-3 compares the first and second sums with each other in order to select the smaller one to be used as updated path-metric data $m011_k$ of the present state. Finally, the ACS section 92-3 outputs a selection result sel011 to a memory included in the path memory 43 as a memory used for storing the value of state S011. The computations and the comparison, which are carried out by the ACS section 92-3, can be expressed by Eq. (17) given as follows:

$$m011_k=\min\{m000_{k-2}+bm00011_k, m100_{k-2}+bm10011_k\} \quad (17)$$

By the same token, the ACS section 92-4 updates the path-metric data $m100_k$, which is the likelihood of a history up to state S100. To be more specific, the ACS section 92-4 adds the path-metric data $m111_{k-2}$ stored internally in the ACS section 92-6 as the path-metric data of a state immediately leading ahead of the state immediately preceding the present state to the branch-metric data $bm11100_k$ received from the branch-metric computation section 91-10 to produce a first sum. The ACS section 92-4 also adds the path-metric data $m011_{k-2}$ stored internally in the ACS section 92-3 as the path-metric data of a state immediately leading ahead of the state immediately preceding the present state to the branch-metric data $bm01100_k$ received from the branch-metric computation section 91-9 to produce a second sum. Then, the ACS section 92-4 compares the first and second sums with each other in order to select the smaller one to be used as updated path-metric data $m100_k$ of the present state. Finally, the ACS section 92-4 outputs a selection result sel100 to a memory included in the path memory 43 as a memory used for storing the value of state S100. The computations and the comparison, which are carried out by the ACS section 92-4, can be expressed by Eq. (18) given as follows:

$$m100_k=\min\{m111_{k-2}+bm11100_k, m011_{k-2}+bm01100_k\} \quad (18)$$

In the same way as the ACS section 92-1, the ACS section 92-5 updates the path-metric data $m110_k$, which is the likelihood of a history up to state S110. To be more specific, the ACS section 92-5 adds the path-metric data m111$_{k-2}$ stored internally in the ACS section 92-6 as the path-metric data of a state immediately leading ahead of the state immediately preceding the present state to the branch-metric data bm11110$_k$ received from the branch-metric computation section 91-13 to produce a first sum. The ACS section 92-5 also adds the path-metric data m011$_{k-2}$ stored internally in the ACS section 92-3 as the path-metric data of a state immediately leading ahead of the state immediately preceding the present state to the branch-metric data bm01110$_k$ received from the branch-metric computation section 91-12 to produce a second sum. In addition, the ACS section 92-5 also adds the path-metric data m001$_{k-2}$ stored internally in the ACS section 92-2 as the path-metric data of a state immediately leading ahead of the state immediately preceding the present state to the branch-metric data bm00110$_k$ received from the branch-metric computation section 91-11 to produce a third sum. Then, the ACS section 92-5 compares the first, second and third sums with each other in order to select the smallest one to be used as updated path-metric data m110$_k$ of the present state. Finally, the ACS section 92-5 outputs a selection result sel110 to a memory included in the path memory 43 as a memory used for storing the value of state S110. The computations and the comparison, which are carried out by the ACS section 92-5, can be expressed by Eq. (19) given as follows:

$$m110_k = \min\{m111_{k-2}+bm11110_k, m011_{k-2}+bm01110_k, m001_{k-2}+bm00110_k\} \quad (19)$$

By the same token, the ACS section 92-6 updates the path-metric data m111$_k$, which is the likelihood of a history up to state S111. To be more specific, the ACS section 92-6 adds the path-metric data m111$_{k-2}$ stored internally in the ACS section 92-6 as the path-metric data of a state immediately leading ahead of the state immediately preceding the present state to the branch-metric data bm11111$_k$ received from the branch-metric computation section 91-16 to produce a first sum. The ACS section 92-6 also adds the path-metric data m011$_{k-2}$ stored internally in the ACS section 92-3 as the path-metric data of a state immediately leading ahead of the state immediately preceding the present state to the branch-metric data bm01111$_k$ received from the branch-metric computation section 91-15 to produce a second sum. In addition, the ACS section 92-6 also adds the path-metric data m001$_{k-2}$ stored internally in the ACS section 92-2 as the path-metric data of a state immediately leading ahead of the state immediately preceding the present state to the branch-metric data bm00111$_k$ received from the branch-metric computation section 91-14 to produce a third sum. Then, the ACS section 92-6 compares the first, second and third sums with each other in order to select the smallest one to be used as updated path-metric data m111$_k$ of the present state. Finally, the ACS section 92-6 outputs a selection result sel111 to a memory included in the path memory 43 as a memory used for storing the value of state S111. The computations and the comparison, which are carried out by the ACS section 92-6, can be expressed by Eq. (20) given as follows:

$$m111_k = \min\{m111_{k-2}+bm11111_k, m011_{k-2}+bm01111_k, m001_{k-2}+bm00111_k\} \quad (20)$$

A trellis depicted in the path memory 43 of the typical configuration shown in FIG. 12 has only 1 stage. The number of states is the same as that for the trellis depicted in the path memory 43 shown in FIG. 8. However, the select and shift operations are carried out for every 2 bits (that is, for every two time slots).

The trellis depicted in the path memory 43 shown in FIG. 12 indicates that it is quite within the bounds of possibility that a transition occurs from state S000 to state S000, S001 or S011 at a time following the next time, a transition occurs from state S001 to state S110 or Sill at a time following the next time, a transition occurs from state S011 to state S100, S110 or S111 at a time following the next time, a transition occurs from state S100 to state S000, S001 or S011 at a time following the next time, a transition occurs from state S110 to state S000 or S001 at a time following the next time and a transition occurs from state S111 to state S100, S110 or S111 at a time following the next time. That is to say, the Viterbi decoding circuit 19 of this case carries out a decoding process on the basis of the trellis expressing a state-transition diagram shown in FIG. 4 as a state-transition diagram of the PR (1, x, x, 1) transmission line in terms of sequences along the time axis based on two time slots.

Thus, in the path memory 43, a value to be stored instantly in a memory for state S000 at any specific stage is a value selected among a value stored in a memory for state S000 at a stage immediately preceding the specific stage, a value stored in a memory for state S100 at a stage immediately preceding the specific stage and a value stored in a memory for state S110 at the stage immediately preceding the specific stage in accordance with a selection result sel000 received from the ACS section 92-1. The selected value stored instantly in the memory for state S000 at the specific stage is shifted in the same time slot to a memory for state S000 at a stage immediately following the specific stage, a memory for state S000 at a stage immediately following the specific stage and a memory for state S011 at the stage immediately following the specific stage. Similarly, in the path memory 43, a value to be stored instantly in a memory for state S000 at any specific stage is a value selected among a value stored in a memory for state S000 at a stage immediately preceding the specific stage, a value stored in a memory for state S100 at a stage immediately preceding the specific stage and a value stored in a memory for state S110 at the stage immediately preceding the specific stage in accordance with a selection result sel001 received from the ACS section 92-2. The selected value stored instantly in the memory for state S001 at the specific stage is shifted in the same time slot to a memory for state S110 at a stage immediately following the specific stage and a memory for state S111 at the stage immediately following the specific stage.

By the same token, in the path memory 43, a value to be stored instantly in a memory for state S011 at any specific stage is a value selected among a value stored in a memory for state S000 at a stage immediately preceding the specific stage and a value stored in a memory for state S100 at the stage immediately preceding the specific stage in accordance with a selection result sel011 received from the ACS section 92-3. The selected value stored instantly in the memory for state S011 at the specific stage is shifted in the same time slot to a memory for state S100 at a stage immediately following the specific stage, a memory for state S110 at a stage immediately following the specific stage and a memory for state S111 at the stage immediately following the specific stage. In the same way, in the path memory 43, a value to be stored instantly in a memory for state S100 at any specific stage is a value selected among a value stored in a memory for state S011 at a stage immediately preceding the specific stage and a value stored in a memory for state S111 at the stage immediately preceding the specific stage in accordance with a selection result sel100 received from the ACS section 92-4. The selected value stored instantly in the memory for state S100 at the specific stage is shifted in the same time slot to a memory for state S000 at a stage immediately following the specific stage, a memory for state S001 at a stage immediately following the specific stage and a memory for state S011 at the stage immediately following the specific stage.

By the same token, in the path memory 43, a value to be stored instantly in a memory for state S110 at any specific stage is a value selected among a value stored in a memory for state S001 at a stage immediately preceding the specific stage, a memory for state S011 at a stage immediately preceding the specific stage and a value stored in a memory for state S111 at the stage immediately preceding the specific stage in accordance with a selection result sel110 received from the ACS section 92-5. The selected value stored instantly in the memory for state S110 at the specific stage is shifted in the same time slot to a memory for state S000 at a stage immediately following the specific stage and a memory for state S001 at the stage immediately following the specific stage. In the same way, in the path memory 43, a value to be stored instantly in a memory for state S111 at any specific stage is a value selected among a value stored in a memory for state S001 at a stage immediately preceding the specific stage, a memory for state S011 at a stage immediately preceding the specific stage and a value stored in a memory for state S111 at the stage immediately preceding the specific stage in accordance with a selection result sel111 received from the ACS section 92-6. The selected value stored instantly in the memory for state S111 at the specific stage is shifted in the same time slot to a memory for state S100 at a stage immediately following the specific stage, a memory for state S110 at a stage immediately following the specific stage and a memory for state S111 at the stage immediately following the specific stage. As a result, data of two time slots is output to the demodulation circuit 20 as the modulated sequence $x_t$.

As is obvious from the above descriptions, the number of branch-metric computation sections increases from 10 in the branch-metric computation circuit 41 shown in FIG. 7 to 16 in the branch-metric computation circuit 41 shown in FIG. 11. However, the number of states for the transmission line remains at 6 as it is. Thus, the number of ACS sections employed in the ACS circuit 42 shown in FIG. 11 also remains the same as that for the ACS circuit 42 shown in FIG. 7. However, the number of states preceding the present state by two time slots for the ACS circuit 42 shown in FIG. 11 increases to three from two states preceding the present state by one time slot for the ACS circuit 42 shown in FIG. 7. Thus, in the ACS circuit 42 shown in FIG. 11, the smallest one among 3 different results of addition is selected as path-metric data.

That is to say, the Viterbi decoding circuit 19 shown in FIGS. 11 and 12 for carrying out processing having an amount corresponding to two time slots in the Viterbi decoding circuit 19 shown in FIGS. 7 and 8 in just one time slot has a circuit size much larger than that of the Viterbi decoding circuit 19 shown in FIGS. 7 and 8 for carrying out processing of one time slot.

It is to be noted that descriptions with reference to FIGS. 1 to 12 are applicable and properly referred to in the following explanation of the present invention.

SUMMARY OF THE INVENTION

If it is necessary to provide a single recording/reproduction apparatus with a plurality of Viterbi decoding circuits of different types having different constraint lengths and use the apparatus by switching the Viterbi decoding circuit from one having a certain constraint length to another having a different constraint length as described above, the apparatus has a problem that, for each type of constraint length, it is necessary to provide a branch-metric computation circuit, an ACS (add, compare and select) circuit and a path memory so that the size of the circuit increases, or a problem of limitation on the type of the Viterbi decoding circuit.

In addition, if a state transition occurring over two time slots is processed as a single state transition so as to carry out operations at a high speed, the recording/reproduction apparatus also has a problem of an increased circuit size.

On top of that, as the size of the circuit increases, the recording/reproduction apparatus raises another problem that the computation becomes complicated and the design cost also rises as well.

In order to solve the problems described above, the inventors of the present invention have devised a decoding apparatus capable of keeping up with a plurality of operating modes without increasing the size of its circuit.

In accordance with an embodiment of the present invention, there is provided a decoding apparatus characterized in that the decoding apparatus includes: a decoding section for decoding an encoded signal on the basis of a first state-transition trellis; and a mode selection section for selecting either a first operating mode based on the first state-transition trellis or a second operating mode based on a second state-transition trellis having a state count smaller than that of the first state-transition trellis. If the mode selection section selects the second operating mode, the decoding section decodes an encoded signal by carrying out switching of a state transition from a first state transition selected among state transitions of the first state-transition trellis as a first state transition not corresponding to the second state-transition trellis to a second state transition selected among state transitions of the second state-transition trellis as a second state transition not corresponding to the first state-transition trellis.

As the decoding section described above, it is possible to employ a decoding section including: a branch-metric computation section for calculating branch-metric data; a path-metric selection section for selecting most probable path-metric data on the basis of branch-metric data calculated by the branch-metric computation section; and a path memory for obtaining a decoded signal by shifting information, which is stored in memories employed in the path memory, in accordance with a selection result produced by the path-metric selection section.

In accordance with another embodiment of the present invention, there is provided a decoding method characterized in that the decoding method includes: a decoding step of decoding an encoded signal on the basis of a first state-transition trellis; and a mode selection step of selecting either a first operating mode based on the first state-transition trellis or a second operating mode based on a second state-transition trellis having a state count smaller than that of the first state-transition trellis. If the second operating mode is selected at the mode selection step, at the decoding step, an encoded signal is decoded by carrying out switching of a state transition from a first state transition selected among state transitions of the first state-transition trellis as a first state transition not corresponding to the second state-transition trellis to a second state transition selected among state transitions of the second state-transition trellis as a second state transition not corresponding to the first state-transition trellis.

In accordance with a further embodiment of the present invention, there is provided a program-recording medium for recording a program characterized in that the program includes: a decoding step of decoding an encoded signal on the basis of a first state-transition trellis; and a mode selection step of selecting either a first operating mode based on the first state-transition trellis or a second operating mode based on a second state-transition trellis having a state count smaller than that of the first state-transition trellis. If the second operating mode is selected at the mode selection step, at the decoding step, an encoded signal is decoded by carrying out switching of a state transition from a first state transition selected among state transitions of the first state-transition trellis as a first state transition not corresponding to the second state-transition trellis to a second state transition selected among state transitions of the second state-transition trellis as a second state transition not corresponding to the first state-transition trellis.

In accordance with a still further embodiment of the present invention, there is provided a program characterized in that the program includes: a decoding step of decoding an encoded signal on the basis of a first state-transition trellis; and a mode selection step of selecting either a first operating mode based on the first state-transition trellis or a second operating mode based on a second state-transition trellis having a state count smaller than that of the first state-transition trellis. If the second operating mode is selected at the mode selection step, at the decoding step, an encoded signal is decoded by carrying out switching of a state transition from a first state transition selected among state transitions of the first state-transition trellis as a first state transition not corresponding to the second state-transition trellis to a second state transition selected among state transitions of the second state-transition trellis as a second state transition not corresponding to the first state-transition trellis.

In accordance with a still further embodiment of the present invention, there is provided a recording/reproduction apparatus characterized in that the recording/reproduction apparatus includes: a reproduction section for reproducing a signal, which has been recorded by a recording section on a recording medium, to result in a reproduced signal by carrying out an equalization process on the signal to convert the signal into a signal having a PR (Partial Response) characteristic; a decoding section for decoding the reproduced signal, which has been reproduced by the reproduction section, on the basis of a first state-transition trellis; and a mode selection section for selecting either a first operating mode based on the first state-transition trellis or a second operating mode based on a second state-transition trellis having a state count smaller than that of the first state-transition trellis. If the mode selection section selects the second operating mode, the decoding section decodes the reproduced signal by carrying out switching of a state transition from a first state transition selected among state transitions of the first state-transition trellis as a first state transition not corresponding to the second state-transition trellis to a second state transition selected among state transitions of the second state-transition trellis as a second state transition not corresponding to the first state-transition trellis.

In accordance with a first embodiment of the present invention, an encoded signal is decoded on the basis of a first state-transition trellis. Either a first operating mode based on the first state-transition trellis or a second operating mode based on a second state-transition trellis having a state count smaller than that of the first state-transition trellis is selected. If the second operating mode is selected, the encoded signal is decoded by carrying out switching of a state transition from a first state transition selected among state transitions of the first state-transition trellis as a first state transition not corresponding to the second state-transition trellis to a second state transition selected among state transitions of the second state-transition trellis as a second state transition not corresponding to the first state-transition trellis.

In accordance with a second embodiment of the present invention, a signal recorded on a recording medium is reproduced by carrying out an equalization process on the signal to convert the signal into a signal having a PR (Partial Response) characteristic. The reproduced signal is then decoded on the basis of a first state-transition trellis. Either a first operating mode based on the first state-transition trellis or a second operating mode based on a second state-transition trellis having a state count smaller than that of the first state-transition trellis is selected. If the second operating mode is selected, the encoded signal is decoded by carrying out switching of a state transition from a first state transition selected among state transitions of the first state-transition trellis as a first state transition not corresponding to the second state-transition trellis to a second state transition selected among state transitions of the second state-transition trellis as a second state transition not corresponding to the first state-transition trellis.

The decoding apparatus can be an independent apparatus or a block for carrying out a decoding process of a recording/reproduction apparatus. As an alternative, the decoding apparatus can also be a block for carrying out a decoding process of a communication apparatus.

In accordance with the present invention, an increase in circuit size can be suppressed. In addition, in accordance with the present invention, an optimum operating mode is selected so that decoding performance can be enhanced.

Before preferred embodiments of the present invention are explained, relations between disclosed inventions and the embodiments are explained in the following comparative description. It is to be noted that, even if there is an embodiment described in this specification but not included in the following comparative description as an embodiment corresponding to an invention, such an embodiment is not to be interpreted as an embodiment not corresponding to an invention. Conversely, an embodiment included in the following comparative description as an embodiment corresponding to a specific invention is not to be interpreted as an embodiment not corresponding to an invention other than the specific invention.

In addition, the following comparative description is not to be interpreted as a comprehensive description covering all inventions disclosed in this specification. In other words, the following comparative description by no means denies existence of inventions disclosed in this specification but not included in claims as inventions for which a patent application is filed. That is to say, the following comparative description by no means denies existence of inventions to be included in a separate application for a patent, included in an amendment to this specification or added in the future.

In accordance with an embodiment of the present invention, there is provided a decoding apparatus characterized in that the decoding apparatus includes: a decoding section (such as a Viterbi decoding circuit 112 shown in FIG. 13) for decoding an encoded signal on the basis of a first state-transition trellis (such as a trellis indicated by solid and dotted lines in a path memory 123 shown in FIG. 16); and a mode selection section (such as a system control section 111 shown in FIG. 13) for selecting either a first operating mode (such as a PR (1, x, x, 1) mode) based on the first state-transition trellis or a second operating mode (such as a PR (1, x, 1) mode) based on a second state-transition trellis having a state count smaller than that of the first state-transition trellis, wherein, if the mode selection section selects the second operating mode, the decoding section decodes the encoded signal by carrying out switching of a state transition (such as switching in a trellis indicated by solid line and dotted thick lines in the path memory 123 shown in FIG. 16) from a first state transition selected among state transitions of the first state-transition trellis as a first state transition (such as a state transition shown in FIG. 16 as a transition from state S001 to state S011) not corresponding to the second state-transition trellis to a second state transition selected among state transitions of the second state-transition trellis as a second state transition (such as a state transition shown in FIG. 16 as a transition from state S000 to state S011) not corresponding to the first state-transition trellis.

As the decoding section described above, it is possible to employ a decoding section characterized by including: a branch-metric computation section (such as a branch-metric computation circuit 121 shown in FIG. 15) for calculating branch-metric data; a path-metric selection section (such as an ACS (addition, comparison and selection) circuit 122 shown in FIG. 15) for selecting most probable path-metric data on the basis of branch-metric data calculated by the branch-metric computation section; and a path memory (such as the path memory 123 shown in FIG. 16) for obtaining a decoded signal by shifting information, which is stored in memories employed in the path memory, in accordance with a selection result produced by the path-metric selection section.

In accordance with another embodiment of the present invention, there is provided a decoding method characterized in that the decoding method includes: a decoding step (such as a step S14 of a flowchart shown in FIG. 20) of decoding an encoded signal on the basis of a first state-transition trellis; and a mode selection step (such as a step S11 of the flowchart shown in FIG. 20) of selecting either a first operating mode based on the first state-transition trellis or a second operating mode based on a second state-transition trellis having a state count smaller than that of the first state-transition trellis, whereby, if the second operating mode is selected at the mode selection step, at the decoding step, an encoded signal is decoded by carrying out switching of a state transition from a first state transition selected among state transitions of the first state-transition trellis as a first state transition not corresponding to the second state-transition trellis to a second state transition selected among state transitions of the second state-transition trellis as a second state transition not corresponding to the first state-transition trellis (such as a process carried out at a step S13 of the flowchart shown in FIG. 20).

It is to be noted that, in accordance with further embodiments of the present invention, there are provided a program-recording medium and a program. Since the program-recording medium and the program each basically have the same configuration as the encoding method described above, however, their descriptions are omitted to avoid duplications.

In accordance with a still further embodiment of the present invention, there is provided a recording/reproduction apparatus characterized in that the recording/reproduction apparatus includes: a reproduction section (such as an equalizer 16 shown in FIG. 13) for reproducing a signal, which has been recorded by a recording section (such as a recording amplifier 13 shown in FIG. 13) on a recording medium (such as a recording medium 14 shown in FIG. 13), to result in a reproduced signal by carrying out an equalization process on the signal to convert the signal into a signal having a PR (Partial Response) characteristic; a decoding section (such as the Viterbi decoding circuit 112 shown in FIG. 13) for decoding the reproduced signal, which has been reproduced by the reproduction section, on the basis of a first state-transition trellis (such as the trellis indicated by solid and dotted lines in the path memory path memory 123 shown in FIG. 16); and a mode selection section (such as the system control section 111 shown in FIG. 13) for selecting either a first operating mode (such as the PR (1, x, x, 1) mode) based on the first state-transition trellis or a second operating mode (such as the PR (1, x, 1) mode) based on a second state-transition trellis having a state count smaller than that of the first state-transition trellis, wherein, if the mode selection section selects the second operating mode, the decoding section decodes the reproduced signal by carrying out switching of a state transition (such as switching in the trellis indicated by solid line and dotted thick lines in the path memory 123 shown in FIG. 16) from a first state transition selected among state transitions of the first state-transition trellis as a first state transition (such as a state transition shown in FIG. 16 as a transition from state S001 to state S011) not corresponding to the second state-transition trellis to a second state transition selected among state transitions of the second state-transition trellis as a second state transition (such as a state transition shown in FIG. 16 as a transition from state S000 to state S011) not corresponding to the first state-transition trellis.

BRIEF DESCRIPTION OF THE DRAWINGS

These and other objects and features of the present invention will become clear from the following description of the preferred embodiments given with reference to the accompanying diagrams, in which:

FIG. 23 is a block diagram showing another typical configuration of the recording/reproduction apparatus according to the embodiment of the present invention.

DETAILED DESCRIPTION OF THE PREFERRED EMBODIMENTS

Embodiments of the present invention are explained by referring to diagrams as follows.

Figure 1:
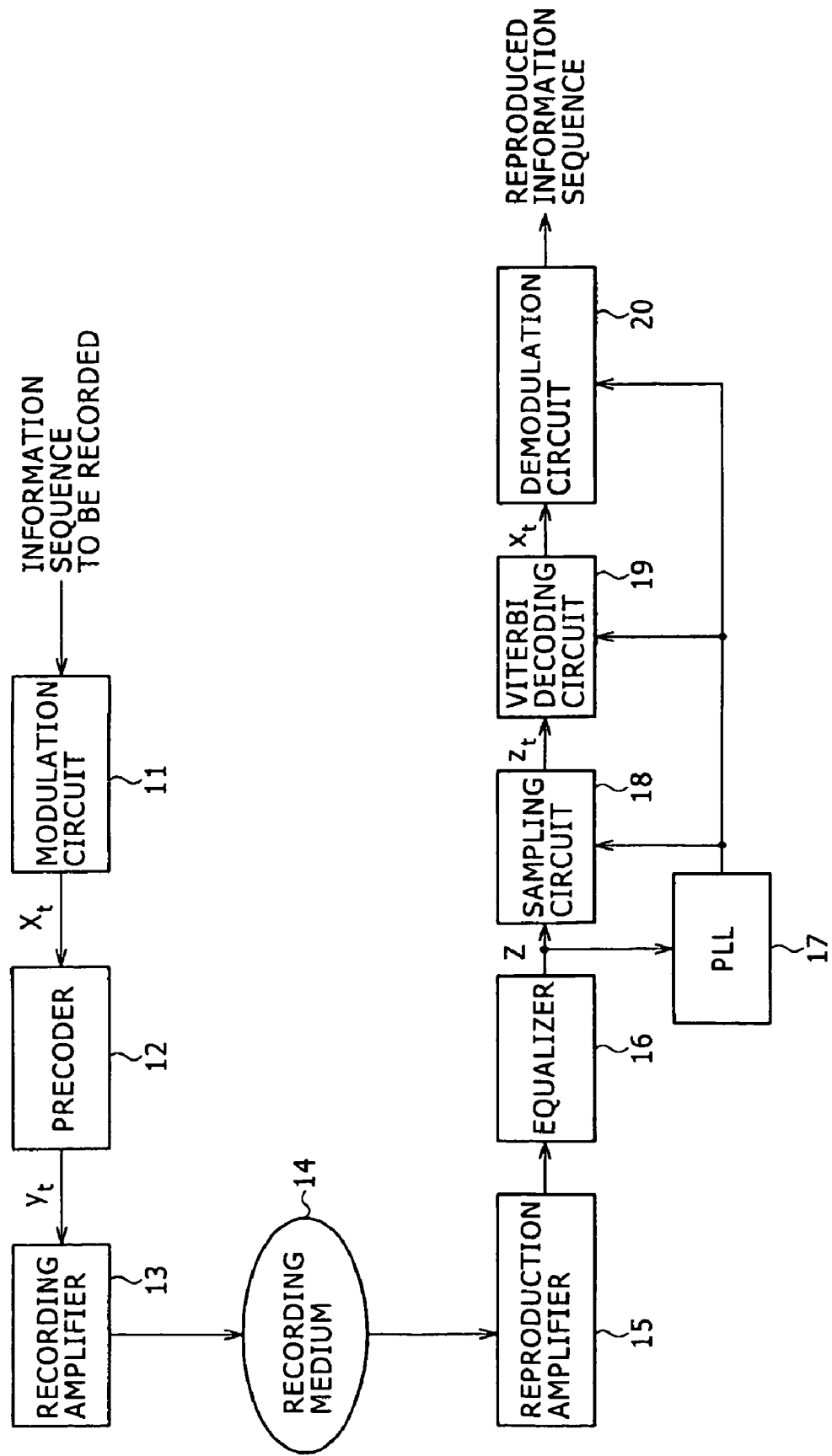
FIG. 1 is a block diagram showing a typical configuration of a recording/reproduction apparatus in related art.
Figure 13:
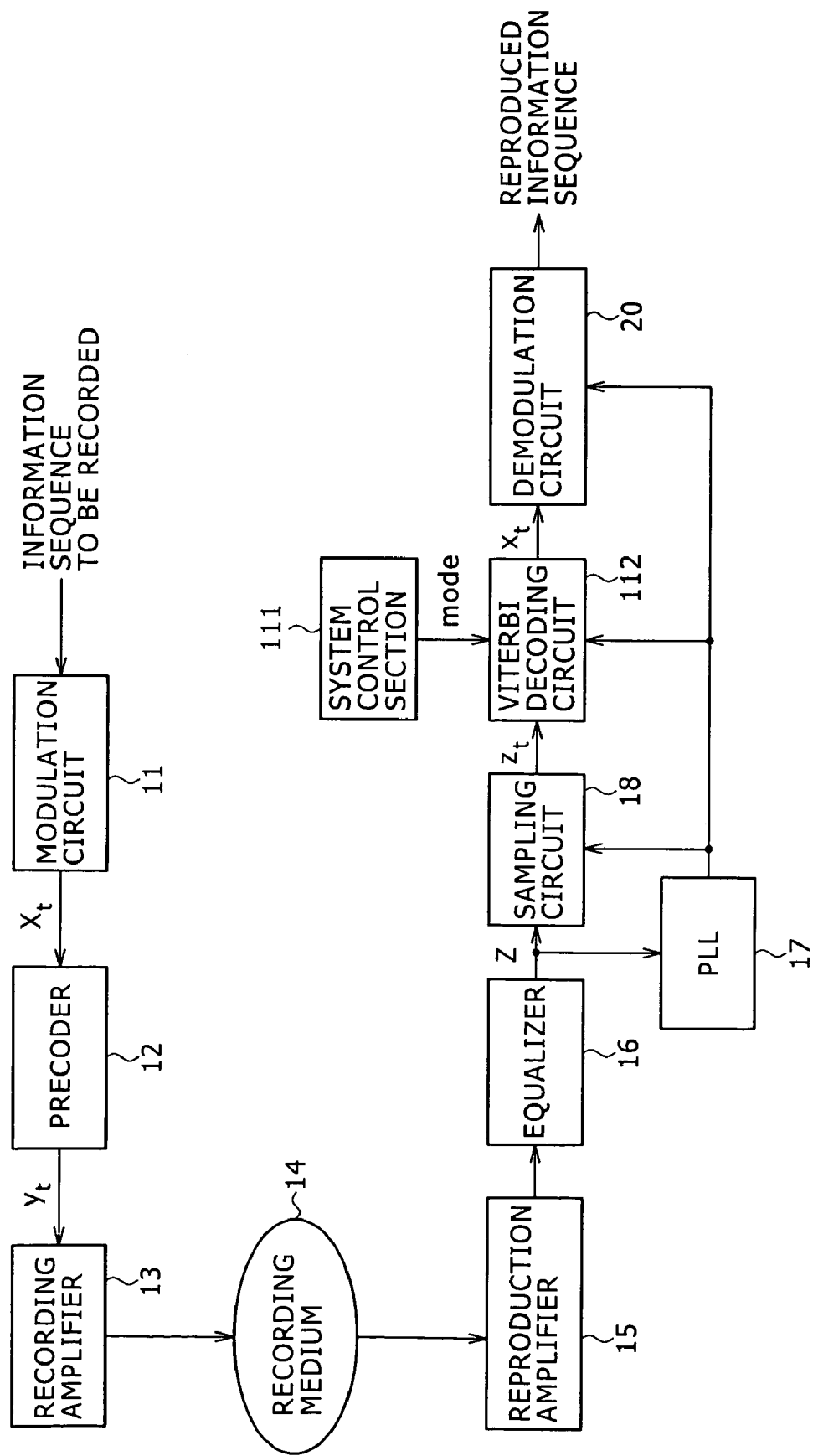
FIG. 13 is a block diagram showing a typical configuration of a recording/reproduction apparatus according to an embodiment of the present invention.

FIG. 13 is a diagram showing a typical configuration of a recording/reproduction apparatus according to the present invention. It is to be noted that the typical configuration is basically the same as the configuration of the recording/reproduction apparatus shown in FIG. 1 except that, in the typical configuration shown in FIG. 13, a system control section 111 is added and a Viterbi decoding circuit 112 serves as a substitute for the Viterbi decoding circuit 19 employed in the recording/reproduction apparatus shown in FIG. 1. For these reasons, descriptions of the typical configuration are properly omitted to avoid duplications.

In the typical configuration shown in FIG. 13, the system control section 111 selects an operating mode among a plurality of operating modes provided for the Viterbi decoding circuit 112, and supplies a mode select signal denoted by the word 'mode' in the figure to the Viterbi decoding circuit 112 as a selection result revealing which operating mode has been selected. An operating mode is a mode in which the Viterbi decoding circuit 112 decodes data reproduced from the recording medium 14. In the case of the embodiment shown in FIG. 13, the Viterbi decoding circuit 112 has operating modes of 2 different types.

In general, however, the Viterbi decoding circuit 112 has operating modes of a plurality of different types. For example, the Viterbi decoding circuit 112 has a PR (Partial Response) (1, x, 1) mode having a constraint length of 3 and a PR (1, x, x, 1) mode having a constraint length of 4. Both the modes are based on (1, 7) RLL codes having a minimum run length (d) of 1.

The Viterbi decoding circuit 112 is basically configured as a Viterbi decoding circuit working in an operating mode having the largest constraint length, that is, an operating mode having the largest number of states. An example of such a Viterbi decoding circuit is the Viterbi decoding circuit 19 shown in FIGS. 7 and 8 as a Viterbi decoding circuit operating in the PR (1, x, x, 1) mode. Sections composing the Viterbi decoding circuit 112 are switched to work in an operating mode indicated by a mode select signal received from the system control section 111.

The Viterbi decoding circuit 112 carries out a Viterbi decoding process on a sampled sequence $z_t$ received from the sampling circuit 18 in an operating mode, which is either the PR (1, x, 1) mode or the PR (1, x, x, 1) mode, in order to reproduce a most probable modulated sequence $x_t$ corresponding to the output of the modulation circuit 11. The operating mode is selected on the basis of the mode select signal received from the system control section 111.

Figure 2:
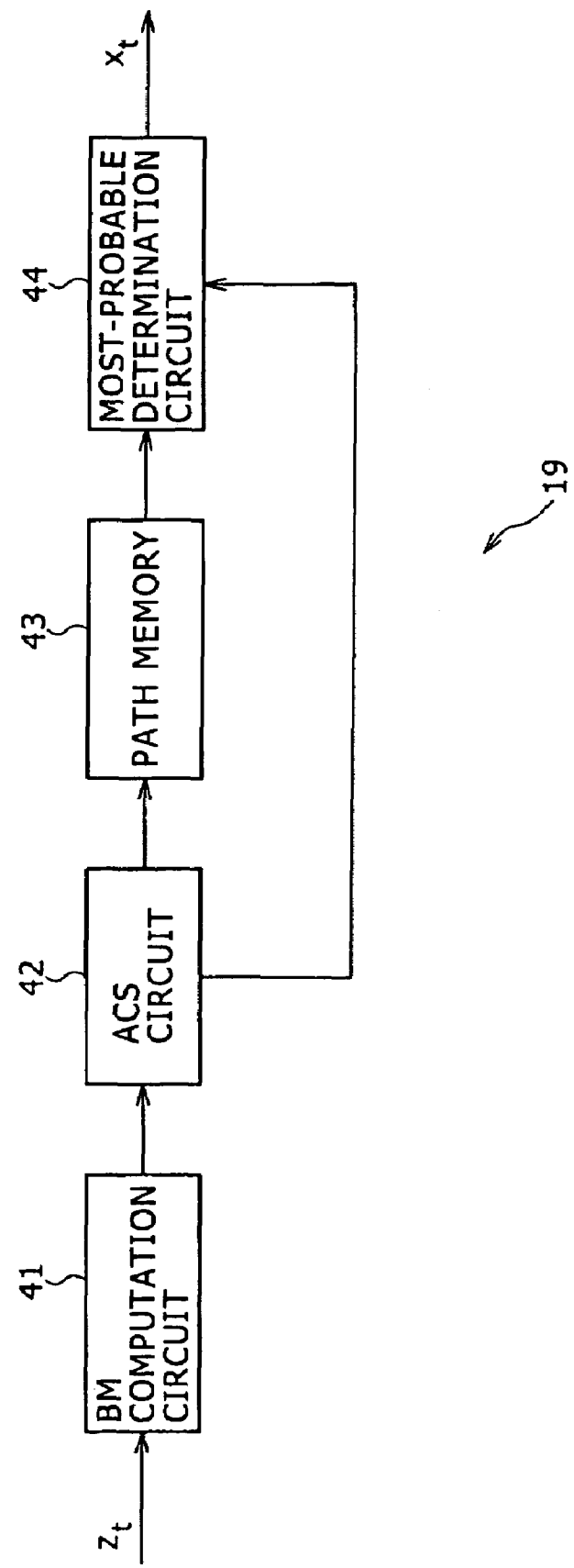
FIG. 2 is a block diagram showing a typical configuration of a Viterbi decoding circuit employed in the recording/reproduction apparatus in related art shown in FIG. 1.
Figure 14:
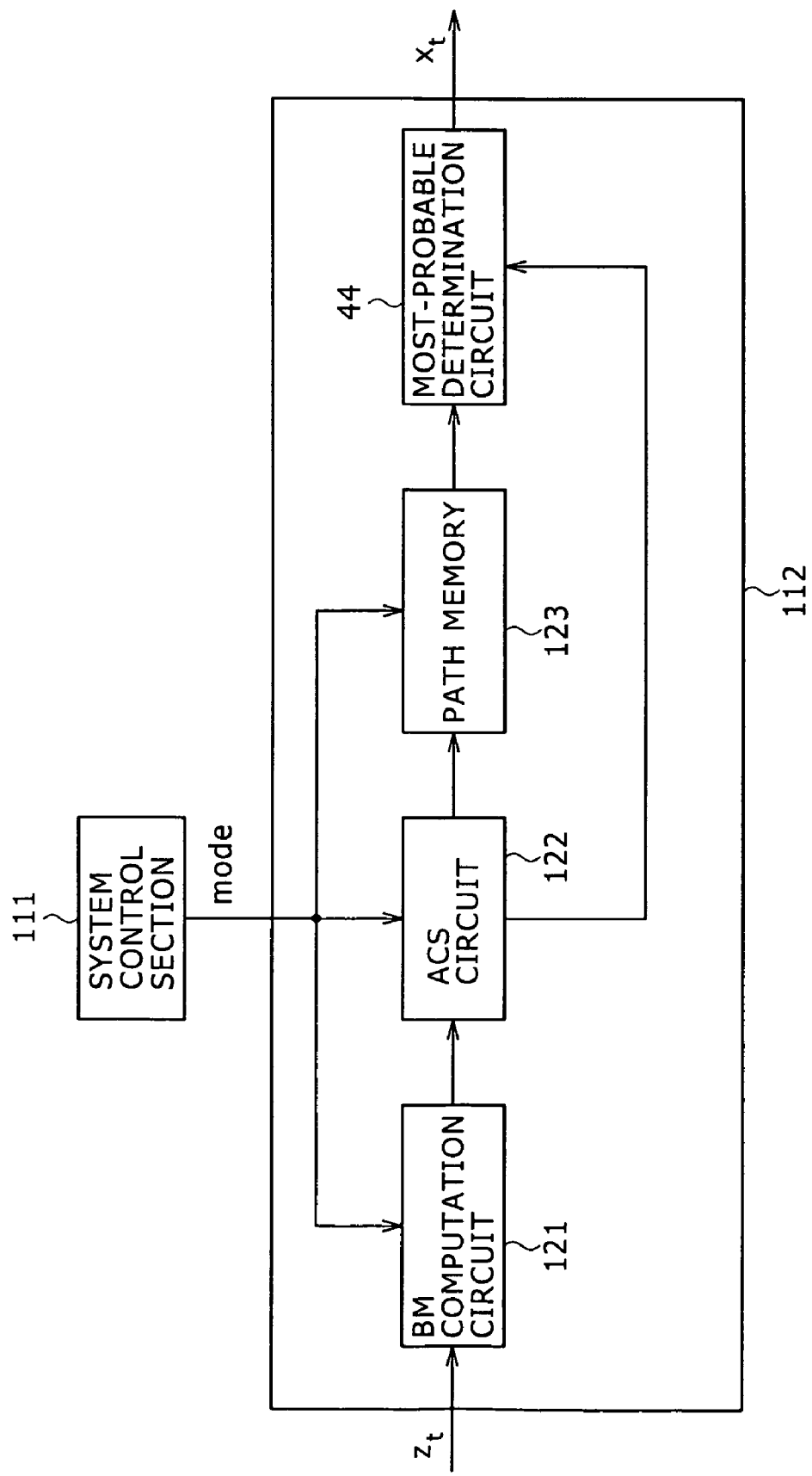
FIG. 14 is a block diagram showing a typical configuration of a Viterbi decoding circuit employed in the recording/reproduction apparatus shown in FIG. 13.

FIG. 14 is a diagram showing a typical configuration of the Viterbi decoding circuit 112 employed in the recording/reproduction apparatus shown in FIG. 13. It is to be noted that, in the typical configuration shown in FIG. 14, sections identical with their respective counterparts employed in the Viterbi decoding circuit 19 shown in FIG. 2 are denoted by the same reference numerals as the counterparts and their explanations are not repeated in order to avoid duplications.

The configuration of a BM (branch metric) computation circuit 121 is based on a branch-metric computation circuit working in an operating mode having the largest constraint length. An example of such a branch-metric computation circuit is the branch-metric computation circuit 41 shown in FIG. 7 as a BM circuit operating in the PR (1, x, x, 1) mode. When the branch-metric computation circuit 121 receives a mode select signal from the system control section 111, the branch-metric computation circuit 121 switches the operating mode to the PR (1, x, 1) mode or the PR (1, x, x, 1) mode in accordance with the received mode select signal and computes branch-metric data for each state transition on the basis of an input signal $z_t$ received from the sampling circuit 18. The branch-metric computation circuit 121 then outputs the computed branch-metric data to an ACS (add, compare and select) circuit 122.

The configuration of the ACS circuit 122 is based on an ACS circuit working in an operating mode having the largest constraint length. An example of such an ACS circuit is the ACS circuit 42 shown in FIG. 7 as an ACS circuit operating in the PR (1, x, x, 1) mode. When the ACS circuit 122 receives a mode select signal from the system control section 111, the ACS circuit 122 switches the operating mode to the PR (1, x, 1) mode or the PR (1, x, x, 1) mode in accordance with the received mode select signal. Then, the ACS circuit 122 adds path-metric data of a state immediately preceding the present state to branch-metric data received from the branch-metric computation circuit 121 to produce a sum. If paths merge in the path memory 123 to be described later, the ACS circuit 122 adds path-metric data of the state immediately preceding the present state to branch-metric data received from the branch-metric computation circuit 121 to produce a sum for each of the merging paths, and compares the sums to select the smallest one to be used as updated path-metric data of the present state. Finally, the ACS circuit 122 outputs a selection result, which is the result of the selection of the sums to the path memory 43 and a most-probable determination circuit 44.

The configuration of the path memory 123 is based on a path memory working in an operating mode having the largest constraint length. An example of such a path memory is the path memory 43 shown in FIG. 8 as a path memory operating in the PR (1, x, x, 1) mode. When the path memory 123 receives a mode select signal from the system control section 111, the path memory 123 switches the operating mode to the PR (1, x, 1) mode or the PR (1, x, x, 1) mode in accordance with the received mode select signal. Then, the path memory 123 carries out a select-shift operation described before on a value stored in each memory of the path memory 123 repeatedly in accordance with the selection result received from the ACS circuit 122.

The Viterbi decoding circuit 112 shown in FIG. 14 is explained concretely by referring to FIGS. 15 and 16 as follows.

Figure 15:
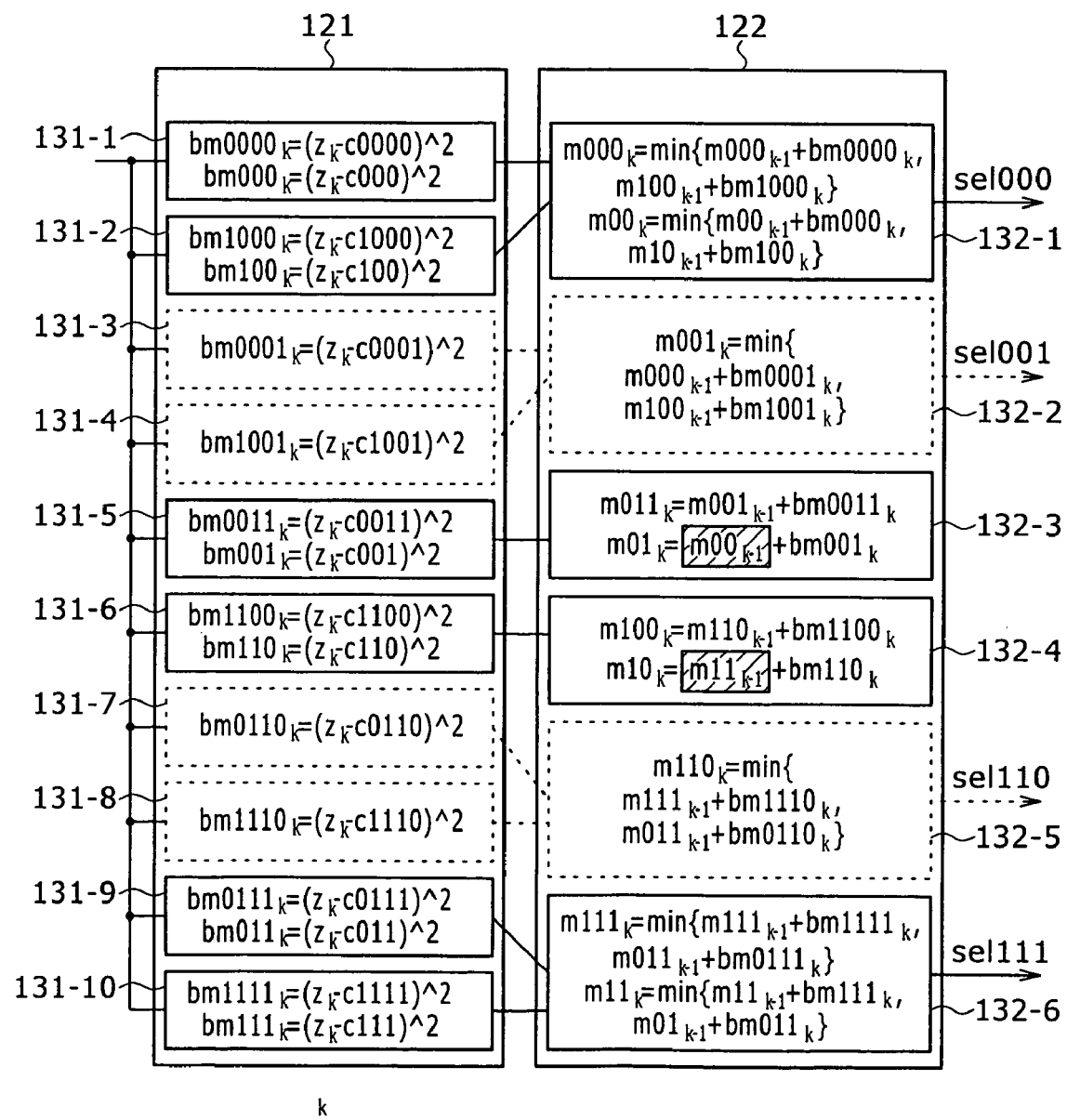
FIG. 15 is a diagram showing typical configurations of a branch-metric computation circuit and an ACS circuit, which are employed in the Viterbi decoding circuit shown in FIG. 14.
Figure 16:
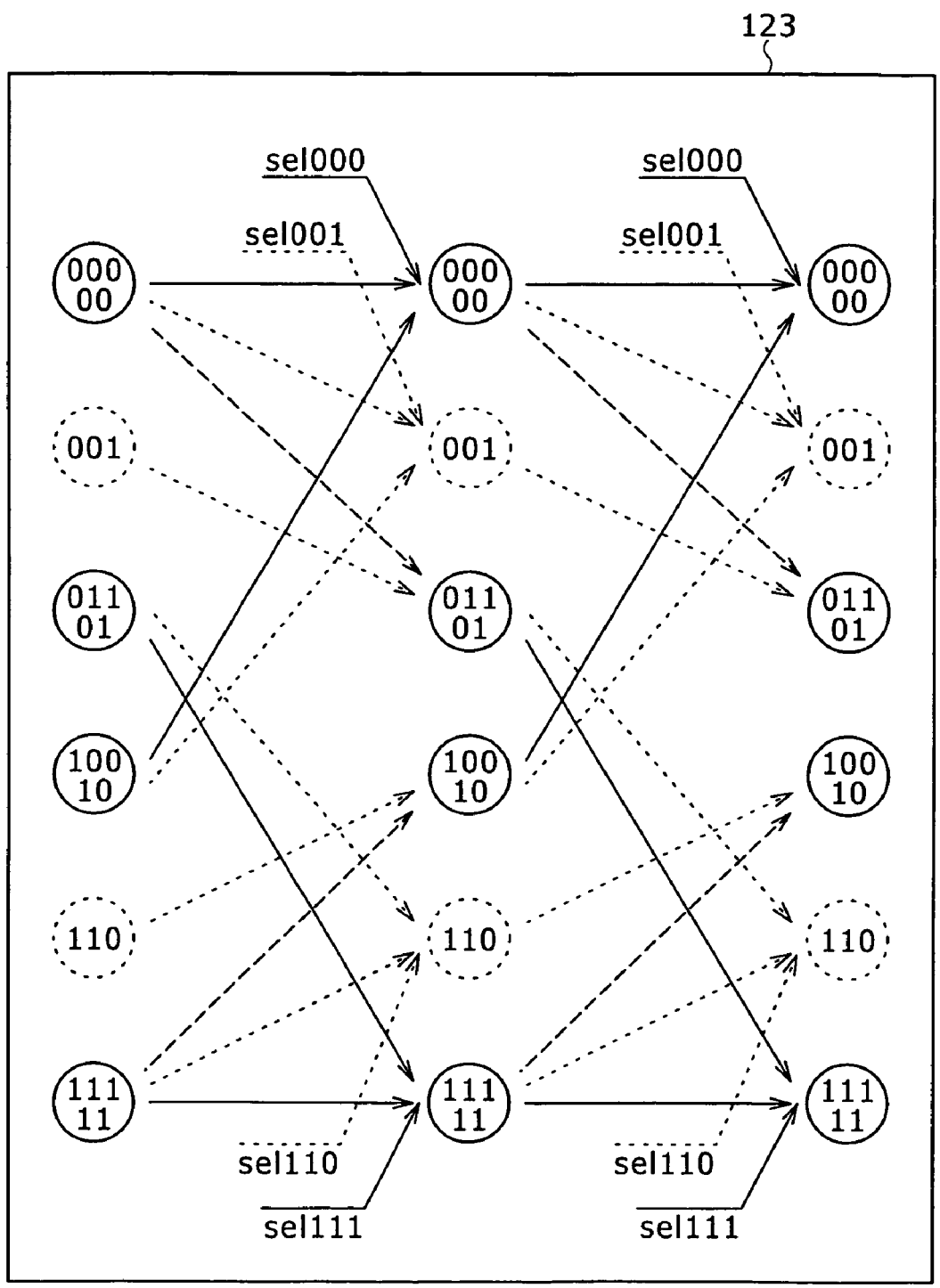
FIG. 16 is a block diagram showing a typical configuration of a path memory employed in the Viterbi decoding circuit shown in FIG. 14.

FIGS. 15 and 16 show a Viterbi decoding circuit 112 for a case in which both the PR (1, x, 1) and PR (1, x, x, 1) modes can be used. In the case of the typical configurations shown in FIGS. 15 and 16, the configuration of the Viterbi decoding circuit 112 is based on a Viterbi decoding circuit working in the operating mode having the largest constraint length. An example of such a Viterbi decoding circuit is the Viterbi decoding circuit 19 shown in FIGS. 7 and 8 as a Viterbi decoding circuit operating in the PR (1, x, x, 1) mode. Sections composing the Viterbi decoding circuit 112 are switched to work in an operating mode indicated by a mode select signal received from the system control section 111.

FIG. 15 is a diagram showing a typical configuration of the branch-metric computation circuit 121 and a typical configuration of the ACS circuit 122. It is to be noted that some blocks shown in FIG. 15 include an equation given on an upper row and an equation given on a lower row. An equation given on an upper row represents an operation carried out in the PR (1, x, x, 1) mode whereas an equation given on a lower row represents an operation carried out in the PR (1, x, 1) mode. In addition, a line and a block, which are each shown by a dotted line, represent respectively a data transfer and an operation, which are not carried out in the PR (1, x, 1) mode. A hatched item represents a substitute for data, which is to be used in the PR (1, x, 1) mode, as a substitute used in conformity with an operation carried out in the PR (1, x, x, 1) mode.

Figure 7:
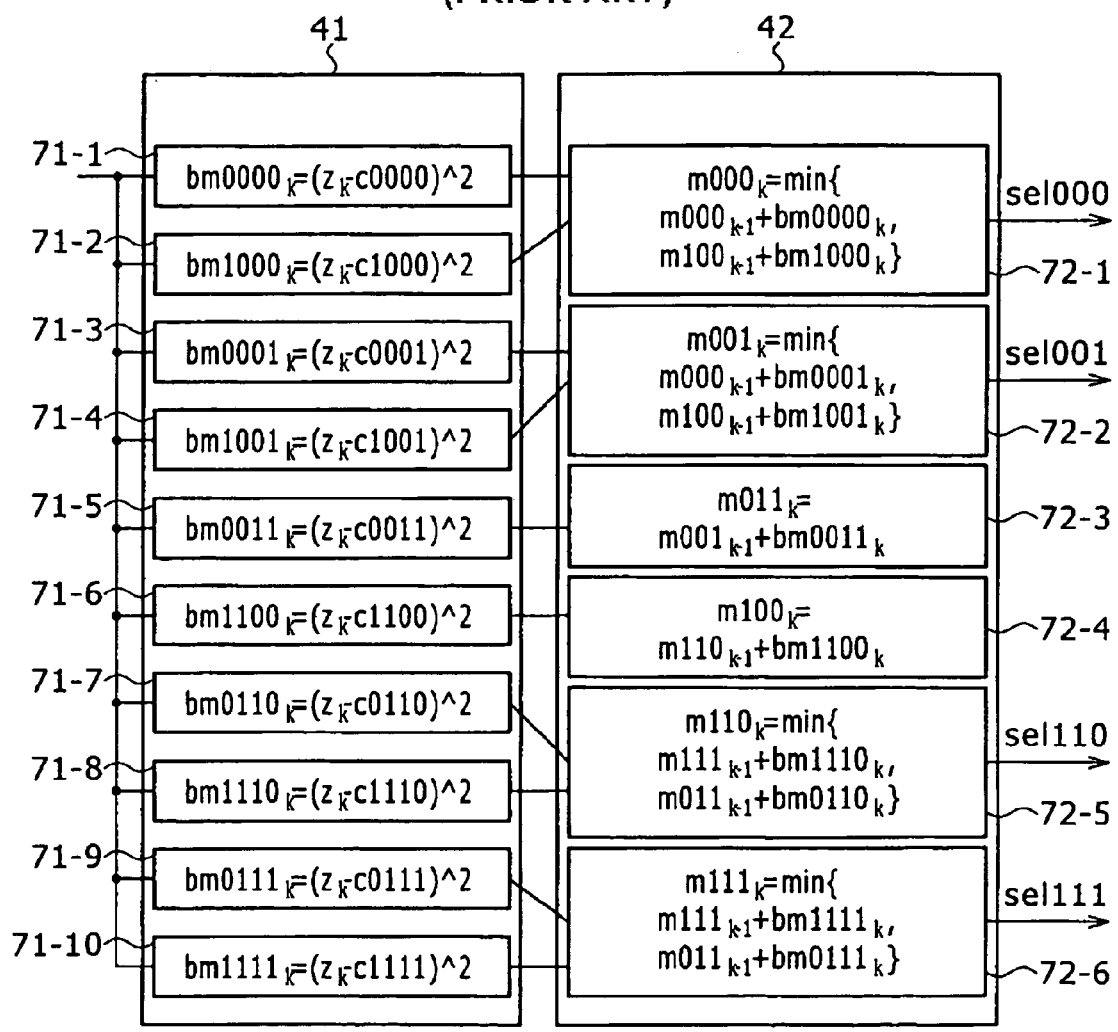
FIG. 7 is a diagram showing a typical configuration of a branch-metric computation circuit and a typical configuration of an ACS circuit for the state transitions shown in FIG. 4.

The branch-metric computation circuit 121 includes as many branch-metric computation sections as state transitions as the branch-metric computation circuit 41 shown in branch-metric computation section 131 in FIG. 7. In the case of the typical configuration shown in FIG. 15, the number of state transitions is 10. Thus, the branch-metric computation circuit 121 includes 10 branch-metric computation sections 131-1 to 131-10. In the following description, the branch-metric computation sections 131-1 to 131-10 are each referred to simply as a branch-metric computation section 131 in case there is no need to distinguish them one another.

When the branch-metric computation circuit 121 switches the operating mode to the PR (1, x, 1) mode, the branch-metric computation circuit 121 designates the branch-metric computation section 131 which computes branch-metric data bmABCD as a branch-metric computation circuit for computations of branch-metric data bmABC data where suffixes A, B, C and D each denote the integer 1 or 0. At that time, the branch-metric computation section 131 switches the theoretical value of a state transition c from cABCD of the PR (1, x, x, 1) mode to cABC of the PR (1, x, 1) mode for each state transition c and computes the square $(z_k-cABC)^2$ instead of computing the square $(z_k-cABCD)^2$. It is to be noted that symbol cABCD assigned to a state transition c denote the theoretical value (the identification reference value) of the state transition c in the PR (1, x, x, 1) mode and symbol cABCD assigned to a state transition c denote the theoretical value (the identification reference value) of the state transition c in the PR (1, x, 1) mode. In addition, symbol n^2 used in descriptions denotes the square of n where notation n denotes an expression.

To put it concretely, in the PR (1, x, x, 1) mode, the branch-metric computation section 131-1 computes branch-metric data $bm0000_k=(z_k-c0000)^2$, which represents the likelihood of the state transition c0000, and outputs the branch-metric data $bm0000_k$ to an ACS section 132-1. In the PR (1, x, 1) mode, on the other hand, the branch-metric computation section 131-1 computes branch-metric data $bm000_k=(z_k-c000)^2$, which represents the likelihood of the state transition c000, and outputs the branch-metric data $bm000_k$ to the ACS section 132-1. By the same token, in the PR (1, x, x, 1) mode, the branch-metric computation section 131-2 computes branch-metric data $bm1000_k=(z_k-c1000)^2$, which represents the likelihood of the state transition c1000, and outputs the branch-metric data $bm1000_k$ also to the ACS section 132-1. In the PR (1, x, 1) mode, on the other hand, the branch-metric computation section 131-2 computes branch-metric data $bm100_k=(z_k-c100)^2$, which represents the likelihood of the state transition c100, and outputs the branch-metric data $bm100_k$ also to the ACS section 132-1.

In the same way, in the PR (1, x, x, 1) mode, the branch-metric computation section 131-3 computes branch-metric data $bm0001_k=(z_k-c0001)^2$, which represents the likelihood of the state transition c0001, and outputs the branch-metric data bm0001k to an ACS section 132-2. In the PR (1, x, 1) mode, on the other hand, the branch-metric computation section 131-3 does not operate. Likewise, in the PR (1, x, x, 1) mode, the branch-metric computation section 131-4 computes branch-metric data $bm1001_k=(z_k-c1001)^2$, which represents the likelihood of the state transition c1001, and outputs the branch-metric data $bm1001_k$ also to the ACS section 132-2. In the PR (1, x, 1) mode, on the other hand, the branch-metric computation section 131-4 does not operate.

Similarly, in the PR (1, x, x, 1) mode, the branch-metric computation section 131-5 computes branch-metric data $bm0011_k=(z_k-c0011)^2$, which represents the likelihood of the state transition c0011, and outputs the branch-metric data $bm0011_k$ to an ACS section 132-3. In the PR (1, x, 1) mode, on the other hand, the branch-metric computation section 131-5 computes branch-metric data $bm001_k=(z_k-c001)^2$, which represents the likelihood of the state transition c011, and outputs the branch-metric data $bm001_k$ to the ACS section 132-3. By the same token, in the PR (1, x, x, 1) mode, the branch-metric computation section 131-6 computes branch-metric data $bm1100_k=(z_k-c1100)^2$, which represents the likelihood of the state transition c1100, and outputs the branch-metric data $bm1100_k$ to an ACS section 132-4. In the PR (1, x, 1) mode, on the other hand, the branch-metric computation section 131-6 computes branch-metric data $bm110_k=(z_k-c110)^2$, which represents the likelihood of the state transition c110, and outputs the branch-metric data $bm110_k$ to the ACS section 132-4.

Likewise, in the PR (1, x, x, 1) mode, the branch-metric computation section 131-7 computes branch-metric data $bm0110_k=(z_k-c0110)^2$, which represents the likelihood of the state transition c0110, and outputs the branch-metric data $bm0110_k$ to an ACS section 132-5. In the PR (1, x, 1) mode, on the other hand, the branch-metric computation section 131-7 does not operate. By the same token, in the PR (1, x, x, 1)

mode, the branch-metric computation section 131-8 computes branch-metric data $bm1110_k=(z_k-c1110)^2$, which represents the likelihood of the state transition c1110, and outputs the branch-metric data $bm1110_k$ also to the ACS section 132-5. In the PR (1, x, 1) mode, on the other hand, the branch-metric computation section 131-8 does not operate.

Similarly, in the PR (1, x, x, 1) mode, the branch-metric computation section 131-9 computes branch-metric data $bm0111_k=(z_k-c0111)^2$, which represents the likelihood of the state transition c0111, and outputs the branch-metric data $bm0111_k$ to an ACS section 132-6. In the PR (1, x, 1) mode, on the other hand, the branch-metric computation section 131-9 computes branch-metric data $bm011_k=(z_k-c011)^2$, which represents the likelihood of the state transition coil, and outputs the branch-metric data $bm011_k$ to the ACS section 132-6. By the same token, the branch-metric computation section 131-10 computes branch-metric data $bm1111_k=(z_1-c1111)^2$, which represents the likelihood of the state transition c1111, and outputs the branch-metric data $bm1111_k$ also to the ACS section 132-6. In the PR (1, x, 1) mode, on the other hand, the branch-metric computation section 131-10 computes branch-metric data $bm111_k=(z_k-c111)^2$, which represents the likelihood of the state transition c111, and outputs the branch-metric data $bm111_k$ also to the ACS section 132-6.

The ACS circuit 122 includes as many ACS sections and the number of states as the ACS circuit 42 shown in FIG. 7 does. In the case of the typical configuration shown in FIG. 15, the number of states is 6. Thus, the ACS circuit 122 includes 6 ACS sections 132-1 to 132-6. In the following description, the ACS sections 132-1 to 132-6 are each referred to simply as an ACS section 132 in case there is no need to distinguish them one another.

Much like the branch-metric computation circuit 121, when the ACS circuit 122 switches the operating mode to the PR (1, x, 1) mode, the ACS circuit 122 designates the ACS section 132 for computing path-metric data mABC as an ACS circuit for computations of path-metric data mAB.

To put it concretely, in the PR (1, x, x, 1) mode, the ACS section 132-1 updates path-metric data $m000_k$, which is the likelihood of a history up to state S000. To be more specific, the ACS section 132-1 adds the path-metric data $m000_{k-1}$ stored internally in the ACS section 132-1 as the path-metric data of the state immediately preceding the present state to the branch-metric data $bm0000_k$ received from the branch-metric computation section 131-1 to produce a first sum. The ACS section 132-1 also adds the path-metric data $m100_{k-1}$ stored internally in the ACS section 132-4 as the path-metric data of the state immediately preceding the present state to the branch-metric data $bm1000_k$ received from the branch-metric computation section 131-2 to produce a second sum. Then, the ACS section 132-1 compares the first and second sums with each other in order to select the smaller one to be used as updated path-metric data $m000_k$ of the present state. The computation and the comparison are carried out by the ACS section 132-1 in accordance with Eq. (5) given before. Finally, the ACS section 132-1 outputs a selection result sel000 to a memory included in the path memory 123 as a memory used for storing the value of state S000.

In the PR (1, x, 1) mode, on the other hand, the ACS section 132-1 updates the path-metric data $m00_k$, which is the likelihood of a history up to state S00. To be more specific, the ACS section 132-1 adds the path-metric data $m00_{k-1}$ stored internally in the ACS section 132-1 as the path-metric data of the state immediately preceding the present state to the branch-metric data $bm000_k$ received from the branch-metric computation section 131-1 to produce a first sum. The ACS section 132-1 also adds the path-metric data $m10_{k-1}$ stored internally in the ACS section 132-4 as the path-metric data of the state immediately preceding the present state to the branch-metric data $bm100_k$ received from the branch-metric computation section 131-2 to produce a second sum. Then, the ACS section 132-1 compares the first and second sums with each other in order to select the smaller one to be used as updated path-metric data $m00_k$ of the present state. The computation and the comparison are carried out by the ACS section 132-1 in accordance with Eq. (1) given before. Finally, the ACS section 132-1 outputs a selection result sel000 to a memory included in the path memory 123 as a memory used for storing the value of state S00.

By the same token, in the PR (1, x, x, 1) mode, the ACS section 132-2 updates path-metric data $m001_k$, which is the likelihood of a history up to state S001. To be more specific, the ACS section 132-2 adds the path-metric data $m000_{k-1}$ stored internally in the ACS section 132-1 as the path-metric data of the state immediately preceding the present state to the branch-metric data $bm0001_k$ received from the branch-metric computation section 131-3 to produce a first sum. The ACS section 132-2 also adds the path-metric data $m100_{k-1}$ stored internally in the ACS section 132-4 as the path-metric data of the state immediately preceding the present state to the branch-metric data $bm1001_k$ received from the branch-metric computation section 131-4 to produce a second sum. Then, the ACS section 132-2 compares the first and second sums in order to select the smaller one to be used as updated path-metric data $m001_k$ of the present state. The computation and the comparison are carried out by the ACS section 132-2 in accordance with Eq. (6) given before. Finally, the ACS section 132-2 outputs a selection result sel001 to a memory included in the path memory 123 as a memory used for storing the value of state S001.

In the PR (1, x, 1) mode, on the other hand, the ACS section 132-2 does not operate.

In the PR (1, x, x, 1) mode, the ACS section 132-3 updates path-metric data $m01_k$, which is the likelihood of a history up to state S011. To be more specific, the ACS section 132-3 adds the path-metric data $m001_{k-1}$ stored internally in the ACS section 132-2 as the path-metric data of the state immediately preceding the present state to the branch-metric data $bm0011_k$ received from the branch-metric computation section 131-5 to produce a sum in accordance with Eq. (7) given before. Then, the ACS section 132-3 uses the sum as updated path-metric data $m011_k$ of the present state.

In the PR (1, x, 1) mode, on the other hand, the ACS section 132-3 updates the path-metric data $m01_k$, which is the likelihood of a history up to state S01. To put it concretely, the ACS section 132-3 adds the updated path-metric data $m00_{k-1}$ stored internally in the ACS section 132-1 as the path-metric data of the state immediately preceding the present state to the branch-metric data $bm001_k$ received from the branch-metric computation section 131-5 to produce a sum in accordance with Eq. (2) given before and uses the sum as updated path-metric data $m01_k$ of the present state.

It is to be noted that, as described above, in the PR (1, x, 1) mode, the ACS section 132-3 updates the path-metric data $m01_k$ on the basis of path-metric data $m00_{k-1}$ stored internally in the ACS section 132-1 (used also for updating path-metric data $m000_k$ in the PR (1, x, x, 1) mode) in place of the path-metric data $m001_{k-1}$ that should be used for updating path-metric data $m01_k$. This is because the ACS section 132-2 for finding path-metric data $m001_{k-1}$ does not operate in the PR (1, x, 1) mode as described above. The path-metric data $m001_{k-1}$ is path metric data of a state immediately preceding the present state having path-metric data $m011_k$ corresponding to the path-metric data $m01_k$ updated by the ACS section 132-3.

By the same token, in the PR (1, x, x, 1) mode, the ACS section 132-4 updates path-metric data $m100_k$, which is the likelihood of a history up to state S100. To be more specific, the ACS section 132-4 adds the path-metric data $m110_{k-1}$ stored internally in the ACS section 132-5 as the path-metric data of the state immediately preceding the present state to the branch-metric data $bm1100_k$ received from the branch-metric computation section 131-6 to produce a sum in accordance with Eq. (8) given before. Then, the ACS section 132-4 uses the sum as updated path-metric data $m100_k$ of the present state.

In the PR (1, x, 1) mode, on the other hand, the ACS section 132-4 updates the path-metric data $m10_k$, which is the likelihood of a history up to state S10. To put it concretely, the ACS section 132-4 adds the updated path-metric data $m11_{k-1}$ stored internally in the ACS section 132-6 as the path-metric data of the state immediately preceding the present state to the branch-metric data $bm110_k$ received from the branch-metric computation section 131-6 to produce a sum in accordance with Eq. (3) given before and uses the sum as updated path-metric data $m10_k$ of the present state.

It is to be noted that, as described above, in the PR (1, x, 1) mode, the ACS section 132-4 updates the path-metric data $m10_k$ on the basis of path-metric data $m11_{k-1}$ stored internally in the ACS section 132-6 (also used for finding path-metric data $m111_k$ in the PR (1, x, x, 1) mode) in place of path-metric data $m110_{k-1}$, which should be used for updating path-metric data $m10_k$, in the same way as the ACS section 132-3 updates the path-metric data $m01_k$ as described above. This is because the ACS section 132-5 for finding path-metric data $m110_{k-1}$ does not operate in the PR (1, x, 1) mode as will be described below. The path-metric data $m110_{k-1}$ is path metric data of a state immediately preceding the present state having path-metric data $m100_k$ corresponding to the path-metric data $m10_k$ updated by the ACS section 132-4.

Figure 6:
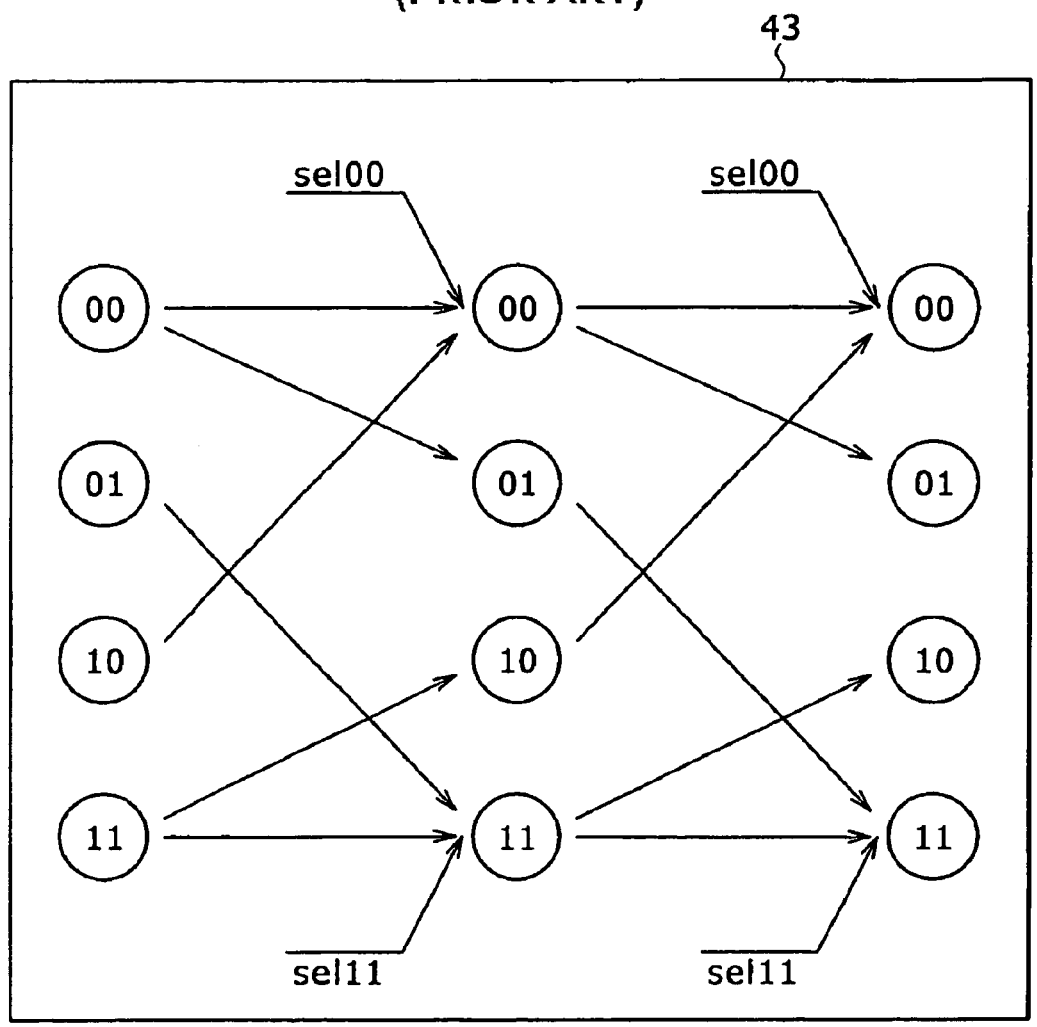
FIG. 6 is a block diagram showing a typical configuration of a path memory for the state transitions shown in FIG. 3.

By using the path-metric data $m00_{k-1}$ and the path-metric data $m11_{k-1}$ as substitutes as described above, a trellis spread throughout the path memory 123 shown in FIG. 16 as the trellis of state transitions occurring in the PR (1, x, x, 1) mode becomes compatible with the trellis spread throughout the path memory 43 shown in FIG. 6 as the trellis of state transitions occurring in the PR (1, x, 1) mode so that the ACS circuit 122 is capable of operating in both the PR (1, x, x, 1) mode and the PR (1, x, 1) mode.

In the same way as the ACS section 132-2, in the PR (1, x, x, 1) mode, the ACS section 132-5 updates path-metric data $m110_k$, which is the likelihood of a history up to state S110. To be more specific, the ACS section 132-5 adds the path-metric data $m111_{k-1}$ stored internally in the ACS section 132-6 as the path-metric data of the state immediately preceding the present state to the branch-metric data $bm1110_k$ received from the branch-metric computation section 131-8 to produce a first sum. The ACS section 132-5 also adds the path-metric data $m011_{k-1}$ stored internally in the ACS section 132-3 as the path-metric data of the state immediately preceding the present state to the branch-metric data $bm0110_k$ received from the branch-metric computation section 131-7 to produce a second sum. Then, the ACS section 132-5 compares the first and second sums in order to select the smaller one to be used as updated path-metric data $m110_k$ of the present state. The computation and the comparison are carried out by the ACS section 132-5 in accordance with Eq. (9) given before. Finally, the ACS section 132-5 outputs a selection result sel110 to a memory included in the path memory 123 as a memory used for storing the value of state S110.

In the PR (1, x, 1) mode, on the other hand, the ACS section 132-5 does not operate.

In the same way as the ACS section 132-1, in the PR (1, x, x, 1) mode, the ACS section 132-6 updates path-metric data $m111_k$, which is the likelihood of a history up to state S111. To be more specific, the ACS section 132-6 adds the path-metric data $m111_{k-1}$ stored internally in the ACS section 132-6 as the path-metric data of the state immediately preceding the present state to the branch-metric data $bm1111_k$ received from the branch-metric computation section 131-10 to produce a first sum. The ACS section 132-6 also adds the path-metric data $m011_{k-1}$ stored internally in the ACS section 132-3 as the path-metric data of the state immediately preceding the present state to the branch-metric data $bm0111_k$ received from the branch-metric computation section 131-9 to produce a second sum. Then, the ACS section 132-6 compares the first and second sums in order to select the smaller one to be used as updated path-metric data $m111_k$ of the present state. Finally, the ACS section 132-6 outputs a selection result sel111 to a memory included in the path memory 123 as a memory used for storing the value of state S111. The computation and the comparison are carried out by the ACS section 132-6 in accordance with Eq. (10) given before.

In the PR (1, x, 1) mode, on the other hand, the ACS section 132-6 updates the path-metric data $m11_k$, which is the likelihood of a history up to state S11. To put it concretely, the ACS section 132-6 adds the path-metric data $m01_{k-1}$ stored internally in the ACS section 132-3 as the path-metric data of the state immediately preceding the present state to the branch-metric data $bm011_k$ received from the branch-metric computation section 131-9 to produce a first sum. The ACS section 132-6 also adds the path-metric data $m11_{k-1}$ stored internally in the ACS section 132-4 as the path-metric data of the state immediately preceding the present state to the branch-metric data $bm111_k$ received from the branch-metric computation section 131-10 to produce a second sum. Then, the ACS section 132-6 compares the first and second sums in order to select the smaller one to be used as updated path-metric data $m11_k$ of the present state. Finally, the ACS section 132-6 outputs a selection result sel111 to a memory included in the path memory 123 as a memory used for storing the value of state S11. The computations and the comparison are carried out by the ACS section 132-6 in accordance with Eq. (4) given before.

FIG. 16 is a diagram showing a typical configuration of the path memory 123.

Figure 4:
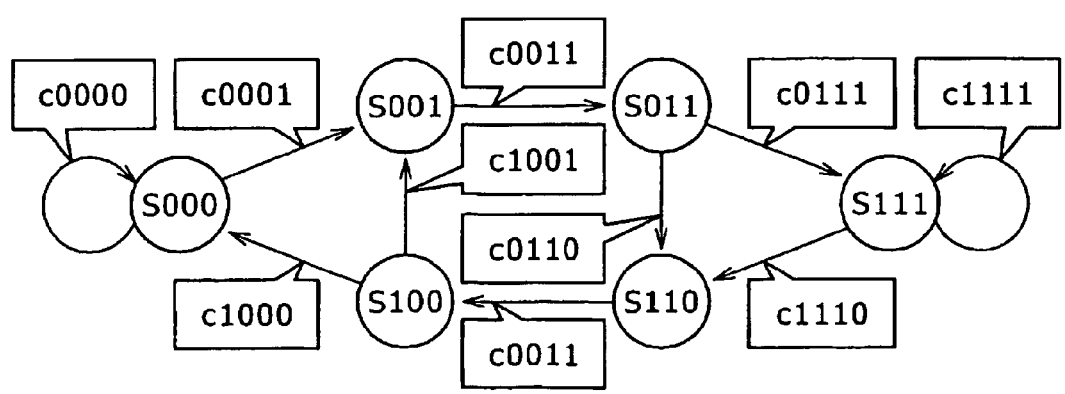
FIG. 4 is a diagram showing a typical configuration of state transitions of for PR (1, x, x, 1) transmission line having a minimum run length (d) of 1.
Figure 5:
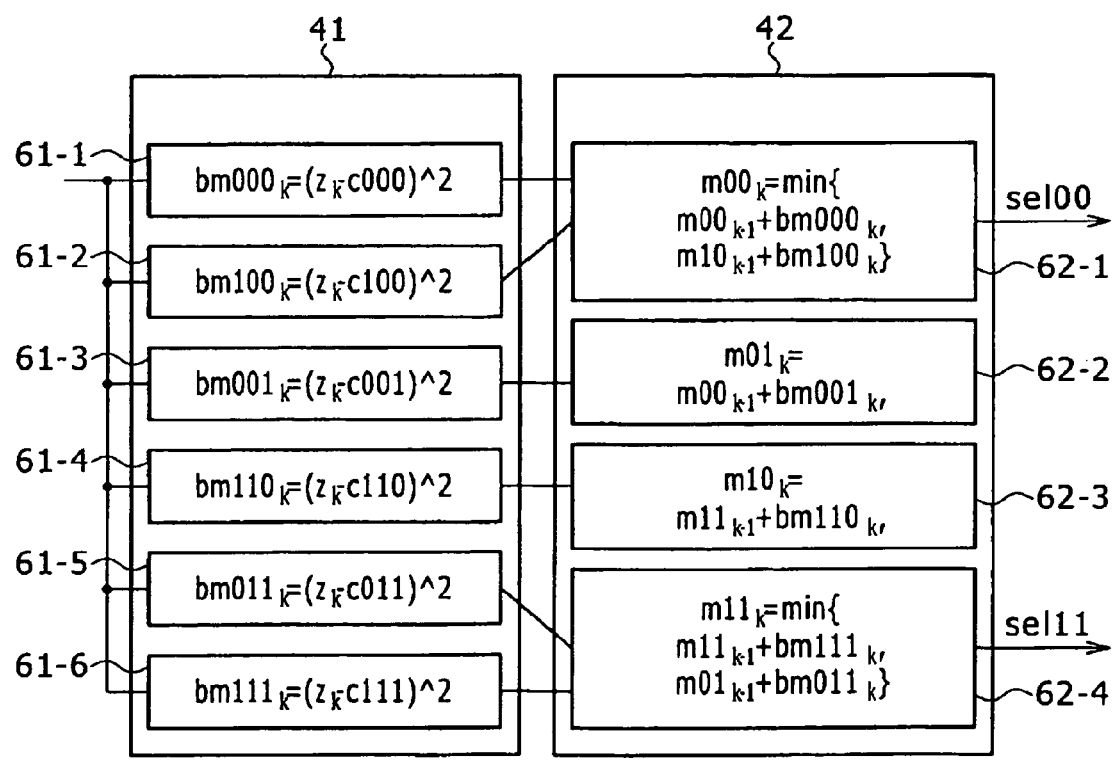
FIG. 5 is a diagram showing a typical configuration of a branch-metric computation circuit and a typical configuration of an ACS (Add, Compare and Select) circuit for the state transitions shown in FIG. 3.
Figure 8:
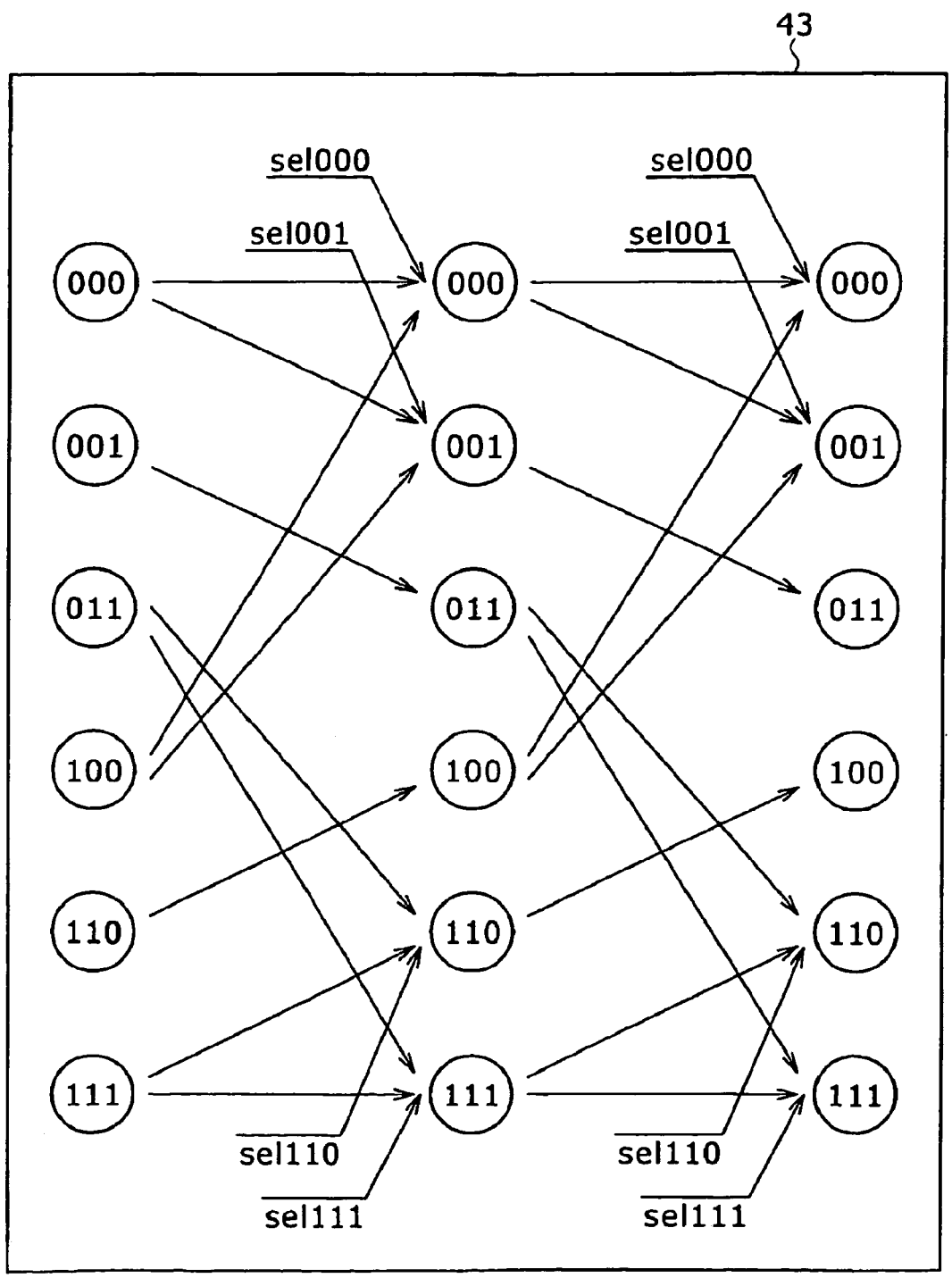
FIG. 8 is a block diagram showing a typical configuration of a path memory for the state transitions shown in FIG. 4.
Figure 9:
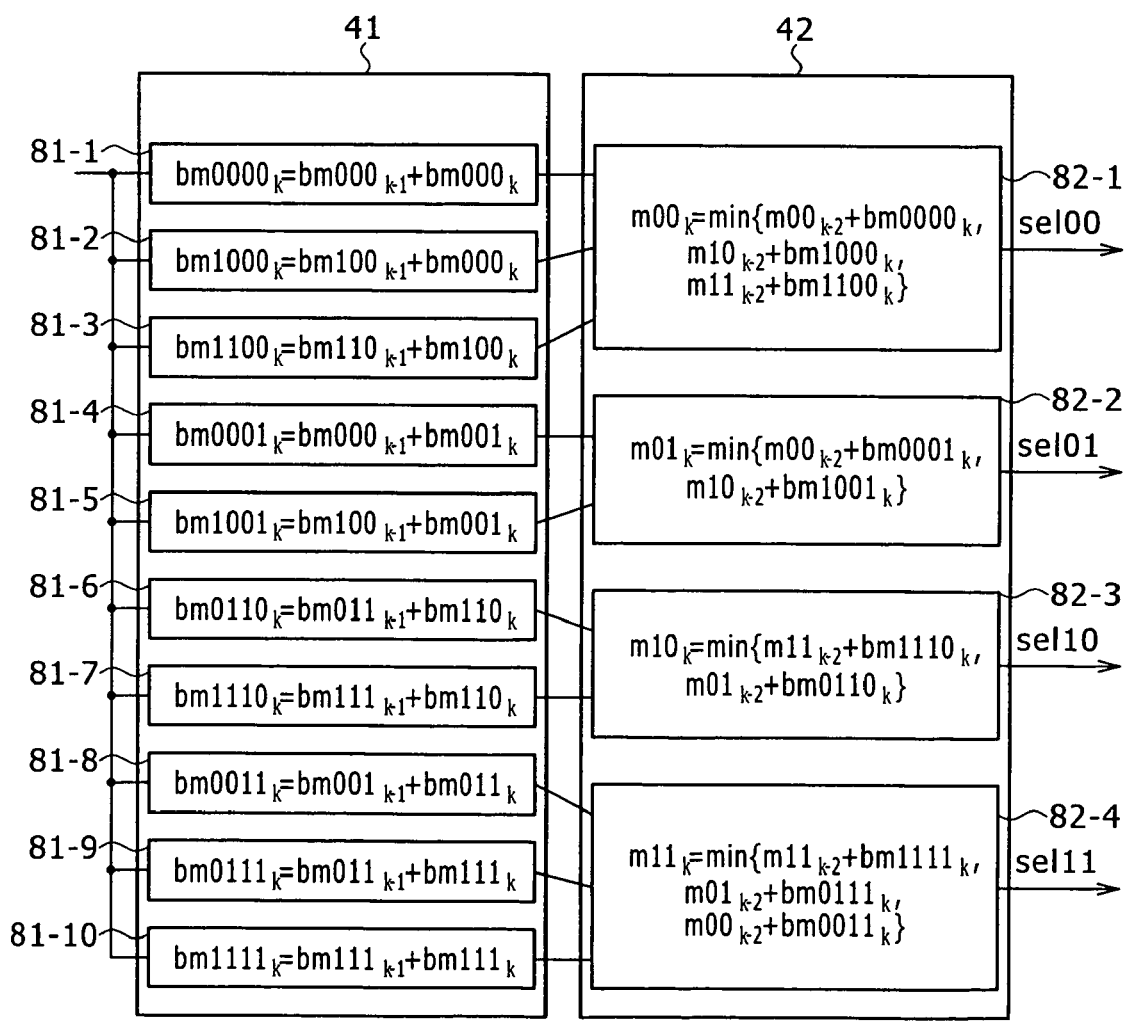
FIG. 9 is a diagram showing a typical configuration of a branch-metric computation circuit and a typical configuration of an ACS circuit provided for the state transitions shown in FIG. 3 as circuits for carrying out processing in units of two time slots.

Much like the path memory 43 shown in FIG. 8, the path memory 123 has a configuration for six states as a configuration expressing a state-transition diagram shown in FIG. 4 in terms of sequences along the time axis. It is to be noted that, in the path memory 123 shown in FIG. 16, each solid-line circle represents a state existing in both the PR (1, x, x, 1) mode and the PR (1, x, 1) mode. On the other hand, each dotted-line circle represents a state existing only in the PR (1, x, x, 1) mode. In addition, each solid-line arrow represents a state transition possibly occurring in both the PR (1, x, x, 1) mode and the PR (1, x, 1) mode. On the other hand, each dotted-line arrow represents a state transition possibly occurring only in the PR (1, x, x, 1) mode. Furthermore, each arrow expressed by a thick dotted line represents a state transition modified for use as a state transition probably occurring only in the PR (1, x, 1) mode and thus never occurring in the PR (1, x, x, 1) mode.

In the typical configuration shown in FIG. 16 as the configuration of the path memory 123, much like the ACS circuit 122, when the operating mode is switched to the PR (1, x, 1) mode, a state transition from state S001 to state S011 is changed (or switched) to a state transition from state S000 (or S00 in the PR (1, x, 1) mode) to state S011 (or S01 in the PR (1, x, 1) mode) whereas a state transition from state S110 to state S100 is changed (or switched) to a state transition from state S111 (or S11 in the PR (1, x, 1) mode) to state S110 (or S10 in the PR (1, x, 1) mode) before carrying out operations.

By replacing the state transitions of the two types cited above, a trellis spread throughout the path memory 123 shown in FIG. 16 as the trellis of state transitions occurring in the PR (1, x, x, 1) mode becomes compatible with the trellis spread throughout the path memory 43 shown in FIG. 6 as a typical trellis of state transitions occurring in the PR (1, x, 1) mode so that the path memory 123 is capable of operating in both the PR (1, x, x, 1) mode and the PR (1, x, 1) mode.

That is to say, in the PR (1, x, x, 1) mode, the path memory 123 operates in the same way as the path memory 43 shown in FIG. 8. To put it in detail, in the path memory 123, a value to be stored in a memory for state S000 at any specific stage is a value selected among a value stored in a memory for state S000 at a stage immediately preceding the specific stage and a value stored in a memory for state S100 at the stage immediately preceding the specific stage in accordance with a selection result sel000 received from the ACS section 132-1. The selected value stored in the memory for state S000 at the specific stage is then shifted (output) to a memory for state S000 at a stage immediately following the specific stage and a memory for state S001 at the stage immediately following the specific stage. In the path memory 123, a value to be stored in a memory for state S000 at the specific stage is a value selected among a value stored in a memory for state S000 at the stage immediately preceding the specific stage and a value stored in a memory for state S100 at the stage immediately preceding the specific stage in accordance with a selection result sel001 received from the ACS section 132-2. The selected value stored in the memory for state S001 at the specific stage is then shifted (output) to a memory for state S011 at the stage immediately following the specific stage.

In addition, in the path memory 123, a value to be stored in a memory for state S110 at any specific stage is a value selected among a value stored in a memory for state S011 at a stage immediately preceding the specific stage and a value stored in a memory for state S111 at the stage immediately preceding the specific stage in accordance with a selection result sel001 received from the ACS section 132-5. The selected value stored in the memory for state S110 at the specific stage is then shifted (output) to a memory for state S110 at a stage immediately following the specific stage. In the path memory 123, a value to be stored in a memory for state S111 at the specific stage is a value selected among a value stored in a memory for state S011 at the stage immediately preceding the specific stage and a value stored in a memory for state S111 at the stage immediately preceding the specific stage in accordance with a selection result sel111 received from the ACS section 132-6. The selected value stored in the memory for state S111 at the specific stage is then shifted (output) to a memory for state S110 at the stage immediately following the specific stage and a memory for state S111 at the stage immediately following the specific stage.

It is to be noted that, by way of a memory for state S011 at each specific stage, a value is shifted from a memory at a stage immediately preceding the specific stage repeatedly to a memory existing at a stage immediately following the specific stage as a memory according to a transition c. Thus, for any specific stage in the path memory 123, a value stored in a memory for state S001 at a stage immediately preceding the specific stage is shifted to a memory for state S110 at a stage immediately following the specific stage and a memory for state S111 at the same following stage by way of a memory for state S011 at the specific stage. By way of a memory for state S100 at each specific stage, a value is shifted from a memory at a stage immediately preceding the specific stage repeatedly to a memory existing at a stage immediately following the specific stage as a memory according to a transition c. Thus, for any specific stage in the path memory 123, a value stored in a memory for state S110 at a stage immediately preceding the specific stage is shifted to a memory for state S000 at a stage immediately following the specific stage and a memory for state S001 at the same following stage by way of a memory for state S100 at the specific stage.

In the PR (1, x, 1) mode, on the other hand, the path memory 123 operates in the same way as the path memory 43 shown in FIG. 4. That is to say, in the path memory 43, a value to be stored in a memory for state S00 at any specific stage is a value selected among a value stored in a memory for state S00 at a stage immediately preceding the specific stage and a value stored in a memory for state S10 at the stage immediately preceding the specific stage in accordance with a selection result sel000 received from the ACS section 132-1. The selected value stored in the memory for state S00 at the specific stage is then shifted (output) to a memory for state S00 at a stage immediately following the specific stage and a memory for state S01 at the stage immediately following the specific stage. In the path memory 123, a value to be stored in a memory for state S11 at the specific stage is a value selected among a value stored in a memory for state S11 at the stage immediately preceding the specific stage and a value stored in a memory for state S01 at the stage immediately preceding the specific stage in accordance with a selection result sel111 received from the ACS section 132-6. The selected value stored in the memory for state S11 at the specific stage is then shifted (output) to a memory for state S11 at the stage immediately following the specific stage and a memory for state S10 at the stage immediately following the specific stage.

It is to be noted that, by way of a memory for state S01 and state S10 at each specific stage, a value is shifted from a memory at a stage immediately preceding the specific stage repeatedly to a memory existing at a stage immediately following the specific stage as a memory according to a transition c. Thus, for any specific stage in the path memory 123, a value stored in a memory for state S00 at a stage immediately preceding the specific stage is shifted to a memory for state S11 at a stage immediately following the specific stage by way of a memory for state S01 at the specific stage. By the same token, by way of a memory for state S10 at each specific stage, a value is shifted from a memory at a stage immediately preceding the specific stage repeatedly to a memory existing at a stage immediately following the specific stage as a memory according to a transition c. Thus, for any specific stage in the path memory 123, a value stored in a memory for state S11 at a stage immediately preceding the specific stage is shifted to a memory for state S00 at a stage immediately following the specific stage by way of a memory for state S10 at the specific stage.

In addition, in the PR (1, x, 1) mode, the memories for states S001 and S110 of the PR (1, x, x, 1) mode do not operate.

As described above, in the PR (1, x, x, 1) mode, the Viterbi decoding circuit 112 carries out a decoding process on the basis of a trellis expressing a state-transition diagram shown in FIG. 4 as a state-transition diagram of a PR (1, x, x, 1) transmission line in terms of sequences along the time axis.

Figure 3:
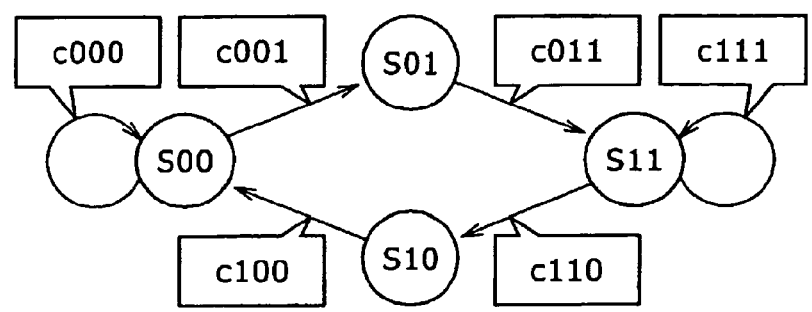
FIG. 3 is a diagram showing a typical configuration of state transitions for a PR (1, x, 1) transmission line having a minimum run length (d) of 1.

The trellis is the trellis composed of state transitions represented by solid-line and dotted-line arrows in FIG. 16. In the PR (1, x, 1) mode, on the other hand, by replacing the state transitions of the two types cited above, the Viterbi decoding circuit 112 is capable of carrying out a decoding process on the basis of a trellis expressing a state-transition diagram shown in FIG. 3 as a state-transition diagram of a PR (1, x, 1) transmission line in terms of sequences along the time axis. The trellis in this case is the trellis composed of state transitions represented by solid-line arrows and arrows each indicated by a dotted thick-line arrow in FIG. 16.

Figure 17:
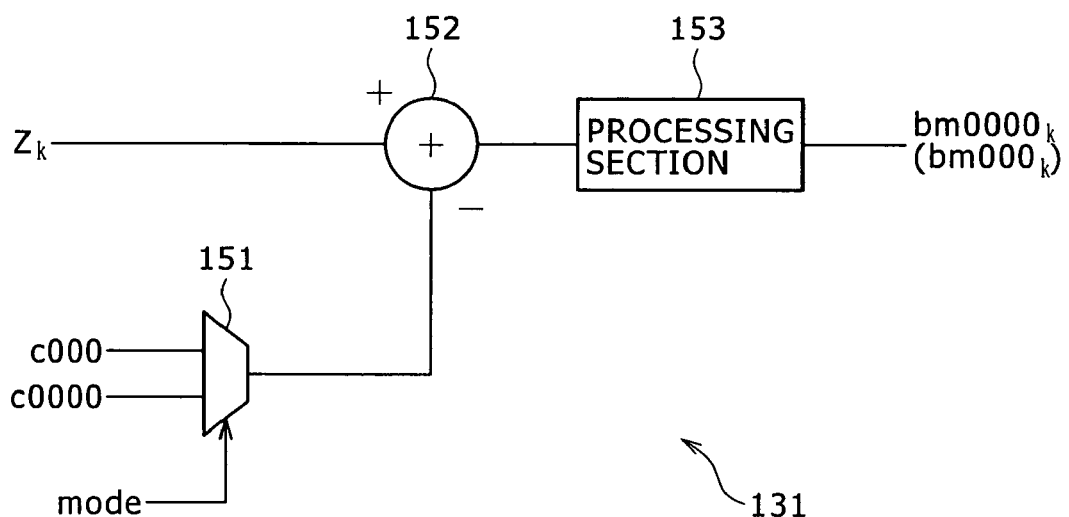
FIG. 17 is a block diagram showing a typical configuration of a branch-metric computation section employed in the branch-metric computation circuit shown in FIG. 15.

Next, by referring to FIG. 17, computation processing carried out by the branch-metric computation section 131 is explained concretely. It is to be noted that the typical configuration shown in FIG. 17 is the configuration of the branch-metric computation section 131-1.

The branch-metric computation section 131 shown in FIG. 17 includes a selector 151, which is typically a multiplexer, a subtractor 152 and a processing section 153.

The selector 151 selects the theoretical value c0000 or c000 and outputs the selected one to the subtractor 152. As described earlier, c0000 and c000 are each a theoretical value (or an identification reference value) of a transition c. That is to say, when the selector 151 receives a mode select signal denoted by the word 'mode' from the system control section 111, the selector 151 selects the theoretical value c0000 or c000 in dependence on the received mode select signal and outputs the selected theoretical value to the subtractor 152.

The subtractor 152 subtracts the theoretical value c0000 or c000 supplied by the selector 151 from an input signal $z_k$ received from the sampling circuit 18 to produce a difference ($z_k$−c0000) or ($z_k$−c000) and outputs the difference ($z_k$−c0000) or ($z_k$−c000) to the processing section 153. The processing section 153 computes the square of the difference ($z_k$−c0000) or ($z_k$−c000) supplied thereto to compute $bm0000_k (=(z_k-c0000)^2)$ or $bm000_k (=(z_k-c000)^2)$ and outputs the branch-metric data $bm0000_k$ or $bm000_k$ to the ACS section 132.

That is to say, in the PR (1, x, x, 1) mode, the selector 151 selects the theoretical value c0000 and outputs the theoretical value c0000 to the subtractor 152. The subtractor 152 subtracts the theoretical value c0000 supplied by the selector 151 from an input signal $z_k$ received from the sampling circuit 18 to produce a difference ($z_k$−c0000) and outputs the difference ($z_k$−c0000) to the processing section 153. The processing section 153 computes the square of the difference ($z_k$−c0000) supplied thereto to compute branch-metric data $bm0000_k$ $(=(z_k-c0000)^2)$ and outputs the branch-metric data $bm0000_k$ to the ACS section 132.

In the PR (1, x, 1) mode, on the other hand, the selector 151 selects the theoretical value c000 and outputs the theoretical value c000 to the subtractor 152. The subtractor 152 subtracts the theoretical value c000 supplied by the selector 151 from an input signal $z_k$ received from the sampling circuit 18 to produce a difference ($z_k$−c000) and outputs the difference ($z_k$−c000) to the processing section 153. The processing section 153 computes the square of the difference ($z_k$−c000) supplied thereto to compute branch-metric data $bm000_k$ $(=(z_k-c000)^2)$ and outputs the branch-metric data $bm000_k$ to the ACS section 132.

Figure 18:
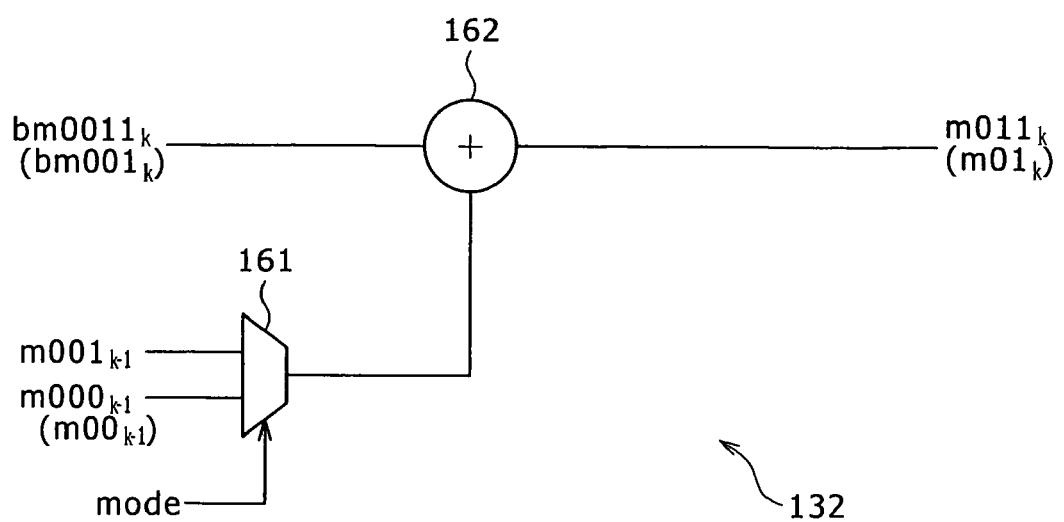
FIG. 18 is a block diagram showing a typical configuration of an ACS section employed in the ACS circuit shown in FIG. 15.

Next, by referring to FIG. 18, computation processing carried out by the ACS section 132 is explained concretely. It is to be noted that the typical configuration shown in FIG. 18 is the configuration of the ACS section 132-3 for carrying out a computation process on data partially modified due to the computing mode. In addition, the ACS section 132-3 does not carry out a comparison process.

The ACS section 132 shown in FIG. 18 includes a selector 161, which is a multiplexer, and a adder 162.

When the selector 161 receives a mode select signal denoted by the word 'mode' from the system control section 111, the selector 161 selects patch-metric data $m001_{k-1}$ stored in the ACS section 132-2 as the patch-metric data of a state immediately preceding the present state or patch-metric data $m000_{k-1}$ (patch-metric data $m00_{k-1}$) stored in the ACS section 132-1 as the patch-metric data of a state immediately preceding the present state in accordance with the mode select signal, and outputs the selected patch-metric data to the adder 162.

The adder 162 adds branch-metric data $bm0011_k$ (or $bm001_k$) received from the branch-metric computation section 131-5 to the patch-metric data received from the selector 161 to produce a sum and uses the sum as updated path-metric data $m011_{k-1}$ (or $m01_{k-1}$) of the present state.

That is to say, in the PR (1, x, x, 1) mode, the selector 161 selects patch-metric data $m001_{k-1}$ stored in the ACS section 132-2 as the patch-metric data of a state immediately preceding the present state, and outputs the selected patch-metric data $m001_{k-1}$ to the adder 162. The adder 162 adds branch-metric data $bm0011_k$ received from the branch-metric computation section 131-5 to the patch-metric data $m001_{k-1}$ received from the selector 161 to produce a sum and uses the sum as updated path-metric data $m011_{k-1}$ of the present state.

In the PR (1, x, 1) mode, on the other hand, the selector 161 selects patch-metric data $m000_{k-1}$ (patch-metric data $m00_{k-1}$) stored in the ACS section 132-1 as the patch-metric data of a state immediately preceding the present state, and outputs the selected patch-metric data to the adder 162. The adder 162 adds branch-metric data $bm0011_k$ received from the branch-metric computation section 131-5 to the patch-metric data $m000_{k-1}$ (patch-metric data $m00_{k-1}$) received from the selector 161 to produce a sum and uses the sum as updated path-metric data $m011_{k-1}$ ($m01_{k-1}$) of the present state.

Figure 19:
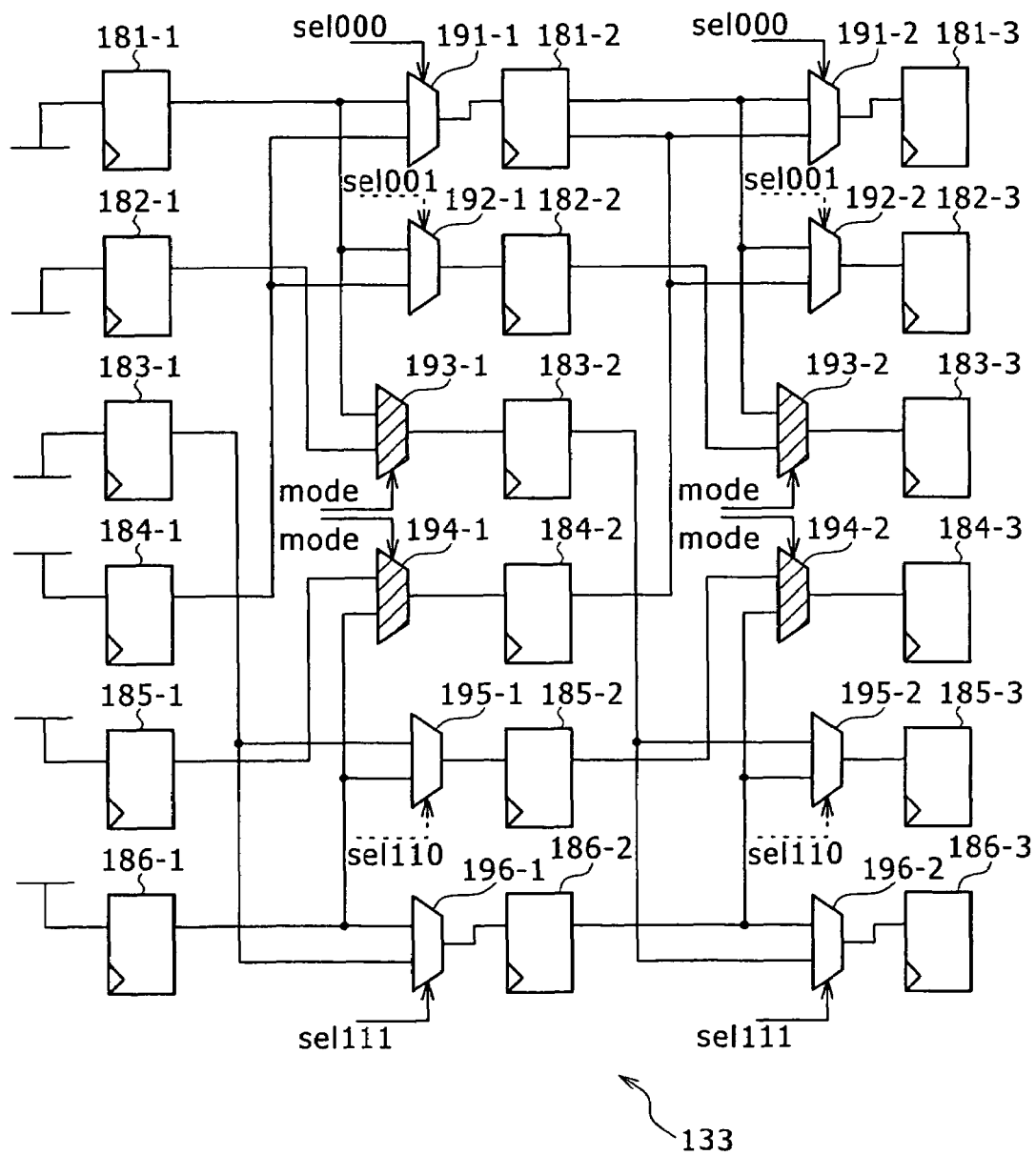
FIG. 19 is a circuit diagram showing the typical configuration of the path memory shown in FIG. 16.

FIG. 19 is a diagram showing a typical hardware configuration of the path memory 123 shown in FIG. 16. The typical hardware configuration shown in FIG. 19 includes flip-flop arrays arranged at three stages. In actuality, however, the flip-flops of the path memory 123 are arranged typically at 16 or 32 stages. The flip-flops each serve as a memory for storing a state in a trellis of the path memory 123 shown in FIG. 16.

To put it in detail, the path memory 123 shown in FIG. 19 includes memories 181-1 to 181-3 arranged at three stages as memories for state S000 (or S00) in the trellis of the path memory 123 shown in FIG. 16, memories 182-1 to 182-3 arranged at three stages as memories for state S001 in the trellis of the path memory 123, memories 183-1 to 183-3 arranged at three stages as memories for state S011 (or S01) in the trellis of the path memory 123, memories 184-1 to 184-3 arranged at three stages as memories for state S100 (or S10) in the trellis of the path memory 123, memories 185-1 to 185-3 arranged at three stages as memories for state S110 in the trellis of the path memory 123 and memories 186-1 to 186-3 arranged at three stages as memories for state S111 (or S1) in the trellis of the path memory 123.

The input terminals of the memories 181-1 to 183-1 are each connected to the ground. On the other hand, the input terminals of the memories 184-1 to 186-1 are each connected to a power-supply line VDD.

In addition, a multiplexer serving as a selector 191-1 is provided at a stage in front of the memory 181-2. By the same token, a multiplexer serving as a selector 191-2 is provided at a stage in front of the memory 181-3. In the same way, a multiplexer serving as a selector 192-1 is provided at a stage in front of the memory 182-2. Likewise, a multiplexer serving as a selector 192-2 is provided at a stage in front of the memory 182-3. Similarly, a multiplexer serving as a selector 193-1 is provided at a stage in front of the memory 183-2. By the same token, a multiplexer serving as a selector 193-2 is provided at a stage in front of the memory 183-3.

In the same way, a multiplexer serving as a selector 194-1 is provided at a stage in front of the memory 184-2. By the same token, a multiplexer serving as a selector 194-2 is provided at a stage in front of the memory 184-3. In the same way, a multiplexer serving as a selector 195-1 is provided at a stage in front of the memory 185-2. Likewise, a multiplexer serving as a selector 195-2 is provided at a stage in front of the memory 185-3. Similarly, a multiplexer serving as a selector 196-1 is provided at a stage in front of the memory 186-2. By the same token, a multiplexer serving as a selector 196-2 is provided at a stage in front of the memory 186-3.

In the following description, the memories 181-1 to 181-3, 182-1 to 182-3, 183-1 to 183-3, 184-1 to 184-3, 185-1 to 185-3, and 186-1 to 186-3 are each referred to simply as a memory 181, a memory 182, a memory 183, a memory 184, a memory 185, and a memory 186 respectively.

Similarly, the selectors 191-1 and 191-2, the selectors 192-1 and 192-2, the selectors 193-1 and 193-2, the selectors 194-1 and 194-2, the selectors 195-1 and 195-2, and the selectors 196-1 and 196-2 are each referred to simply as a selector 191, a selector 192, a selector 193, a selector 194, selector 195, and a selector 196 in case there is no need to distinguish them from each other.

A value stored in a memory 181 provided at a specific stage is shifted to a memory 181 provided at a stage immediately following the specific stage by way of a selector 191 provided between the memories 181, shifted to a memory 182 provided at a stage immediately following the specific stage by way of a selector 192 provided between the memories 181 and 182 and shifted to a memory 183 provided at a stage immediately following the specific stage by way of a selector 193 provided between the memories 181 and 183. A value stored in a memory 182 provided at a specific stage is shifted to a memory 183 provided at a stage immediately following the specific stage by way of a selector 193 provided between the memories 182 and 183.

Likewise, a value stored in a memory 183 provided at a specific stage is shifted to a memory 185 provided at a stage immediately following the specific stage by way of a selector 195 provided between the memories 183 and 185 and shifted to a memory 186 provided at a stage immediately following the specific stage by way of a selector 196 provided between the memories 183 and 186. A value stored in a memory 184 provided at a specific stage is shifted to a memory 181 provided at a stage immediately following the specific stage by way of a selector 191 provided between the memories 184 and 181 and shifted to a memory 182 provided at a stage immediately following the specific stage by way of a selector 192 provided between the memories 184 and 182.

In the same way, a value stored in a memory 185 provided at a specific stage is shifted to a memory 184 provided at a stage immediately following the specific stage by way of a selector 194 provided between the memories 185 and 184. A value stored in a memory 186 provided at a specific stage is shifted to a memory 184 provided at a stage immediately following the specific stage by way of a selector 194 provided between the memories 186 and 184, shifted to a memory 185 provided at a stage immediately following the specific stage by way of a selector 195 provided between the memories 185 and 186 and shifted to a memory 186 provided at a stage immediately following the specific stage by way of a selector 196 provided between the memories 186.

The selector 191 selects one of values shifted from the memories 181 and 184 provided at a stage immediately preceding the present stage in accordance with a selection result sel000 received from the ACS section 132-1, outputting the selected value to the memory 181 provided at the present stage. The selector 192 selects one of values shifted from the memories 181 and 184 provided at a stage immediately preceding the present stage in accordance with a selection result sel001 received from the ACS section 132-2, outputting the selected value to the memory 182 provided at the present stage.

Likewise, the selector 193 selects one of values shifted from the memories 181 and 182 provided at a stage immediately preceding the present stage in accordance with the mode select signal 'mode' received from the system control section 111, outputting the selected value to the memory 183 provided at the present stage. The selector 194 selects one of values shifted from the memories 185 and 186 provided at a stage immediately preceding the present stage in accordance with the mode select signal 'mode' received from the system control section 111, outputting the selected value to the memory 184 provided at the present stage.

Similarly, the selector 195 selects one of values shifted from the memories 183 and 186 provided at a stage immediately preceding the present stage in accordance with a selection result sel1110 received from the ACS section 132-5, outputting the selected value to the memory 185 provided at the present stage. The selector 196 selects one of values shifted from the memories 183 and 186 provided at a stage immediately preceding the present stage in accordance with a selection result sel111 received from the ACS section 132-6, outputting the selected value to the memory 186 provided at the present stage.

That is to say, in the PR (1, x, x, 1) mode, the selector 191 selects one of values shifted from the memories 181 and 184 provided at a stage immediately preceding the present stage in accordance with a selection result sel000 received from the ACS section 132-1, outputting the selected value to the memory 181 provided at the present stage. The selector 192 selects one of values shifted from the memories 181 and 184 provided at a stage immediately preceding the present stage in accordance with a selection result sel001 received from the ACS section 132-2, outputting the selected value to the memory 182 provided at the present stage.

Likewise, in the PR (1, x, x, 1) mode, the selector 193 selects a value shifted from the memory 182 among values shifted from the memories 181 and 182 provided at a stage immediately preceding the present stage, outputting the selected value to the memory 183 provided at the present stage. The selector 194 selects a value shifted from the memory 185 among values shifted from the memories 185 and 186 provided at a stage immediately preceding the present stage, outputting the selected value to the memory 184 provided at the present stage.

Similarly, in the PR (1, x, x, 1) mode, the selector 195 selects one of values shifted from the memories 183 and 186 provided at a stage immediately preceding the present stage in accordance with a selection result sel1110 received from the ACS section 132-5, outputting the selected value to the memory 185 provided at the present stage. The selector 196 selects one of values shifted from the memories 183 and 186 provided at a stage immediately preceding the present stage in accordance with a selection result sel111 received from the ACS section 132-6, outputting the selected value to the memory 186 provided at the present stage.

In the PR (1, x, 1) mode, on the other hand, the selector 191 selects one of values shifted from the memories 181 and 184 provided at a stage immediately preceding the present stage in accordance with a selection result sel000 received from the ACS section 132-1, outputting the selected value to the memory 181 provided at the present stage. In the PR (1, x, 1) mode, however, the selector 192 does not receive a selection result sel001 from the ACS section 132-2 so that the selector 192 does not operate.

In the PR (1, x, 1) mode, the selector 193 outputs a value shifted from the memory 181 provided at a stage immediately preceding the present stage to the memory 183 provided at the present stage. It is to be noted that, in the PR (1, x, 1) mode, the selector 193 does not receive a value from the memory 182 provided at a stage immediately preceding the present stage. The selector 194 outputs a value shifted from the memory 186 provided at a stage immediately preceding the present stage to the memory 184 provided at the present stage. It is to be noted that, in the PR (1, x, 1) mode, the selector 194 does not receive a value from the memory 185.

Much like the selector 192, in the PR (1, x, 1) mode, however, the selector 195 does not receive a selection result sel110 from the ACS section 132-5 so that the selector 195 does not operate. In the PR (1, x, 1) mode, however, the selector 196 selects one of values shifted from the memories 183 and 186 provided at a stage immediately preceding the present stage in accordance with a selection result sel111 received from the ACS section 132-6, outputting the selected value to the memory 186 provided at the present stage.

As described above, the selectors 193 and 194 in the path memory 123 each select a value for the PR (1, x, 1) mode or the PR (1, x, x, 1) mode.

It is to be noted that the path memory 123 shown in FIG. 19 is obtained by merely adding a connection from the memory 181 to the memory 183 and a connection from the memory 186 to the memory 184 as well as adding of the selectors 193 and 194 to the configuration of the PR (1, x, x, 1) path memory 43 shown in FIG. 8. That is to say, by merely changing the configuration of the PR (1, x, x, 1) path memory 43 a little bit, it is possible to select the PR (1, x, 1) mode or the PR (1, x, x, 1) mode.

Figure 20:
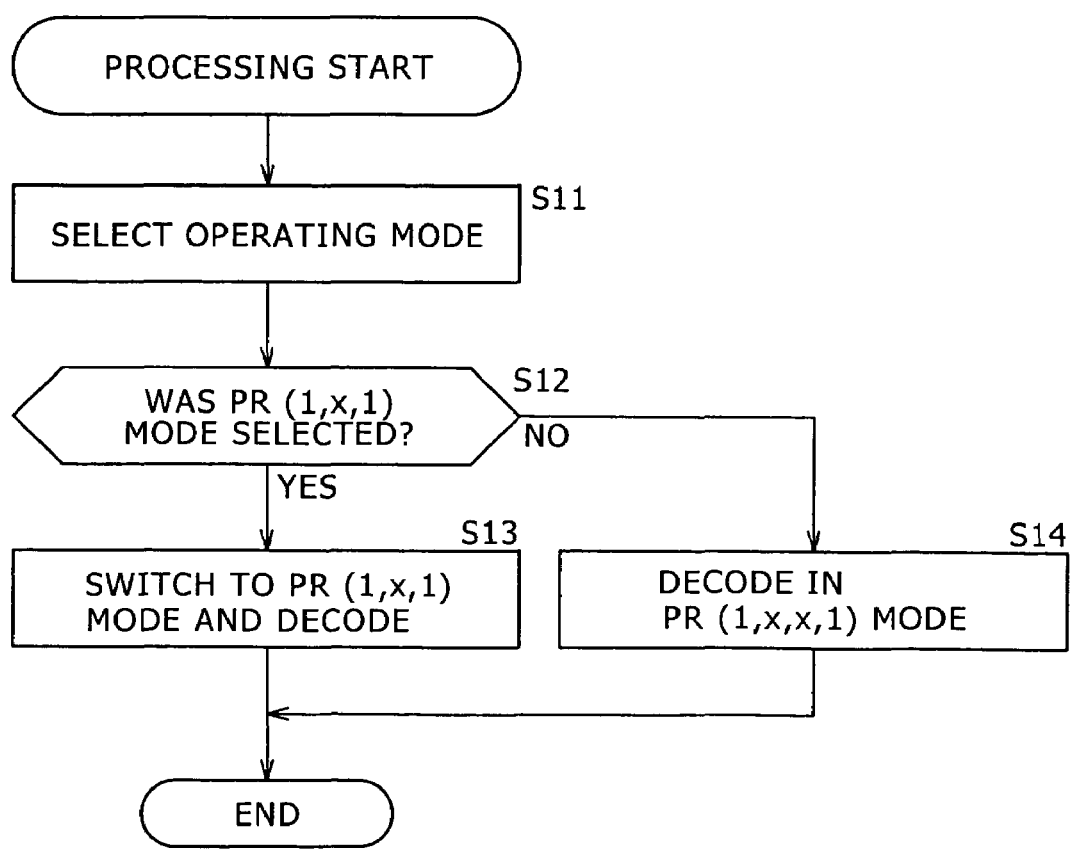
FIG. 20 shows a flowchart referred to in explanation of processing carried out by the recording/reproduction apparatus shown in FIG. 13.

By referring a flowchart shown in FIG. 20, the following description explains processing to carry out a decoding process executed by selecting an operating mode of the recording/reproduction apparatus shown in FIG. 13.

Let us assume for example that a decoding process is to be carried out in the PR (1, x, x, 1) mode. In this case, the user enters a command to switch/change the operating mode via an operation input section or the like. As an alternative, a command is issued in the recording/reproduction apparatus shown in FIG. 13 to change the operating mode in accordance with data recorded on the recording medium 14.

In response to these commands, at a step S11, the system control section 111 selects the PR (1, x, 1) mode or the PR (1, x, x, 1) mode as the operating mode. The system control section 111 then outputs a mode select signal 'mode' to the branch-metric computation circuit 121, the ACS circuit 122 and the path memory 123 as a result of the selection. Subsequently, the flow of the processing goes on to a step S12.

Receiving the mode select signal 'mode' from the system control section 111 at the step S12, the selectors employed in the branch-metric computation circuit 121, the ACS circuit 122 and the path memory 123 produce a result of determination as to whether or not the PR (1, x, 1) mode has been selected. If the result of determination indicates that the PR (1, x, 1) mode has been selected, the flow of the processing goes on to a step S13 at which the operating mode is switched to the PR (1, x, 1) mode prior to a decoding process carried out thereafter. After the decoding process has been carried out in the PR (1, x, 1) mode, the processing represented by the flowchart shown in FIG. 20 is ended.

In the decoding process carried out at the step S13 in the PR (1, x, 1) mode, to put it concretely, the selector 151 employed in the branch-metric computation section 131 selects the theoretical value c000 and outputs the theoretical value c000 to the subtractor 152. The subtractor 152 subtracts the theoretical value c000 supplied by the selector 151 from an input signal $z_k$ supplied by the sampling circuit 18 to find a difference $(z_k - c000)$ and supplies the difference $(z_k - c000)$ to the processing section 153. The processing section 153 computes branch-metric data $bm000_k$ $(=(z_k - c000)^2)$, where symbol $(z_k - c000)^2$ denotes the square of the difference $(z_k - c000)$, and supplies the branch-metric data $bm000_k$ to the ACS section 132.

In the PR (1, x, 1) mode, the selector 161 employed in the ACS section 132 selects path-metric data $m000_{k-1}$ or $m00_{k-1}$ and outputs the selected path-metric data to the adder 162. The adder 162 adds branch-metric data $bm0011_k$ received from the branch-metric computation section 131-5 to the path-metric data $m000_{k-1}$ (or $m00_{k-1}$) received from the selector 161 to produce a sum, and uses the sum as updated path-metric data $m011_{k-1}$ (or $m01_{k-1}$) of the present state.

As described above, in the PR (1, x, 1) mode, the selector 191 employed in the path memory 123 selects one of values shifted from the memories 181 and 184 provided at a stage immediately preceding the present stage in accordance with a selection result sel000 received from the ACS section 132-1, outputting the selected value to the memory 181 provided at the present stage. In the PR (1, x, 1) mode, however, the selector 192 employed in the path memory 123 does not receive a selection result sel001 from the ACS section 132-2 so that the selector 192 does not operate.

As described above, in the PR (1, x, 1) mode, the selector 193 employed in the path memory 123 outputs a value shifted from the memory 181 provided at a stage immediately preceding the present stage to the memory 183 provided at the present stage. It is to be noted that, in the PR (1, x, 1) mode, the selector 193 employed in the path memory 123 does not receive a value from the memory 182 provided at a stage immediately preceding the present stage. By the same token, in the PR (1, x, 1) mode, the selector 194 employed in the path memory 123 outputs a value shifted from the memory 186 provided at a stage immediately preceding the present stage to the memory 184 provided at the present stage. It is to be noted that, in the PR (1, x, 1) mode, the selector 194 employed in the path memory 123 does not receive a value from the memory 185.

Much like the selector 192, in the PR (1, x, 1) mode, however, the selector 195 does not receive a selection result sel110 from the ACS section 132-5 so that the selector 195 does not operate. In the PR (1, x, 1) mode, however, the selector 196 selects one of values shifted from the memories 183 and 186 provided at a stage immediately preceding the present stage in accordance with a selection result sel111 received from the ACS section 132-6, outputting the selected value to the memory 186 provided at the present stage.

If the selectors employed in the branch-metric computation circuit 121, the ACS circuit 122 and the path memory 123 produce a determination result indicating that the PR (1, x, 1) mode has not been selected, that is, a determination result indicating that the PR (1, x, x, 1) mode has been selected, on the other hand, the flow of the processing goes on from the step S12 to a step S14 at which the operating mode is switched to the PR (1, x, x, 1) mode prior to a decoding process carried out thereafter. After the decoding process has been carried out in the PR (1, x, x, 1) mode, the processing represented by the flowchart shown in FIG. 20 is ended.

In the decoding process carried out at the step S14 in the PR (1, x, x, 1) mode, to put it concretely, the selector 151 employed in the branch-metric computation circuit 121 selects the theoretical value c0000 and outputs the theoretical value c0000 to the subtractor 152. The subtractor 152 subtracts the theoretical value c0000 supplied by the selector 151 from an input signal $z_k$ supplied by the sampling circuit 18 to find a difference ($z_k$–c0000) and supplies the difference ($z_k$–c0000) to the processing section 153. The processing section 153 computes branch-metric data bm0000$_k$ (=($z_k$–c0000)^2), where symbol ($z_k$–c0000)^2 denotes the square of the difference ($z_k$–c0000), and supplies the branch-metric data bm0000$_k$ to the ACS section 132.

In the PR (1, x, x, 1) mode, the selector 161 employed in the ACS section 122 selects path-metric data m001$_{k-1}$, and outputs the selected path-metric data m001$_{k-1}$ to the adder 162. The adder 162 adds branch-metric data bm0011$_k$ received from the branch-metric computation section 131-5 to the path-metric data m001$_{k-1}$ received from the selector 161 to produce a sum, and uses the sum as updated path-metric data m011$_{k-1}$ of the present state.

That is to say, in the PR (1, x, x, 1) mode, the selector 191 employed in the path memory 123 selects one of values shifted from the memories 181 and 184 provided at a stage immediately preceding the present stage in accordance with a selection result sel000 received from the ACS section 132-1, outputting the selected value to the memory 181 provided at the present stage. By the same token, in the PR (1, x, x, 1) mode, the selector 192 employed in the path memory 123 selects one of values shifted from the memories 181 and 184 provided at a stage immediately preceding the present stage in accordance with a selection result sel001 received from the ACS section 132-2, outputting the selected value to the memory 182 provided at the present stage.

Likewise, in the PR (1, x, x, 1) mode, the selector 193 employed in the path memory 123 selects a value shifted from the memory 182 among values shifted from the memories 181 and 182 provided at a stage immediately preceding the present stage, outputting the selected value to the memory 183 provided at the present stage. In the same way, in the PR (1, x, x, 1) mode, the selector 194 employed in the path memory 123 selects a value shifted from the memory 185 among values shifted from the memories 185 and 186 provided at a stage immediately preceding the present stage, outputting the selected value to the memory 184 provided at the present stage.

Similarly, in the PR (1, x, x, 1) mode, the selector 195 employed in the path memory 123 selects one of values shifted from the memories 183 and 186 provided at a stage immediately preceding the present stage in accordance with a selection result sel1110 received from the ACS section 132-5, outputting the selected value to the memory 185 provided at the present stage. By the same token, in the PR (1, x, x, 1) mode, the selector 196 employed in the path memory 123 selects one of values shifted from the memories 183 and 186 provided at a stage immediately preceding the present stage in accordance with a selection result sel111 received from the ACS section 132-6, outputting the selected value to the memory 186 provided at the present stage.

As described above, the operating mode for the configurations of the branch-metric computation circuit 121, the ACS circuit 122 and the path memory 123, which are employed in the recording/reproduction apparatus shown in FIG. 13, can be switched from one to another with ease. Thus, it is not necessary to provide a circuit for each type of constraint length. As a result, the size of the circuit can be prevented from increasing.

Figure 21:
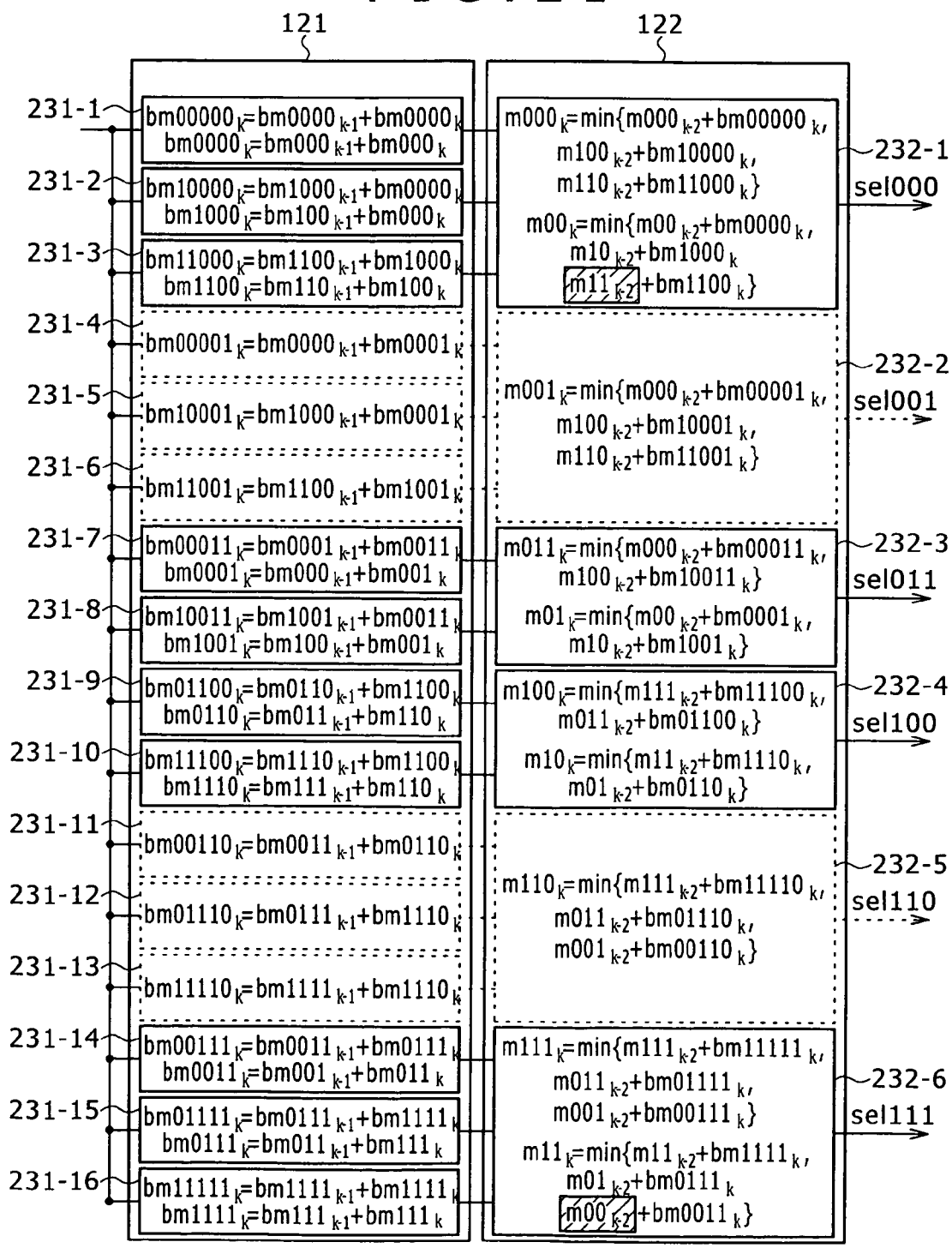
FIG. 21 is a diagram showing typical configurations of a branch-metric computation circuit and an ACS circuit, which are employed in the Viterbi decoding circuit shown in FIG. 14 as a decoding circuit for carrying out processing in units of two time slots.
Figure 22:
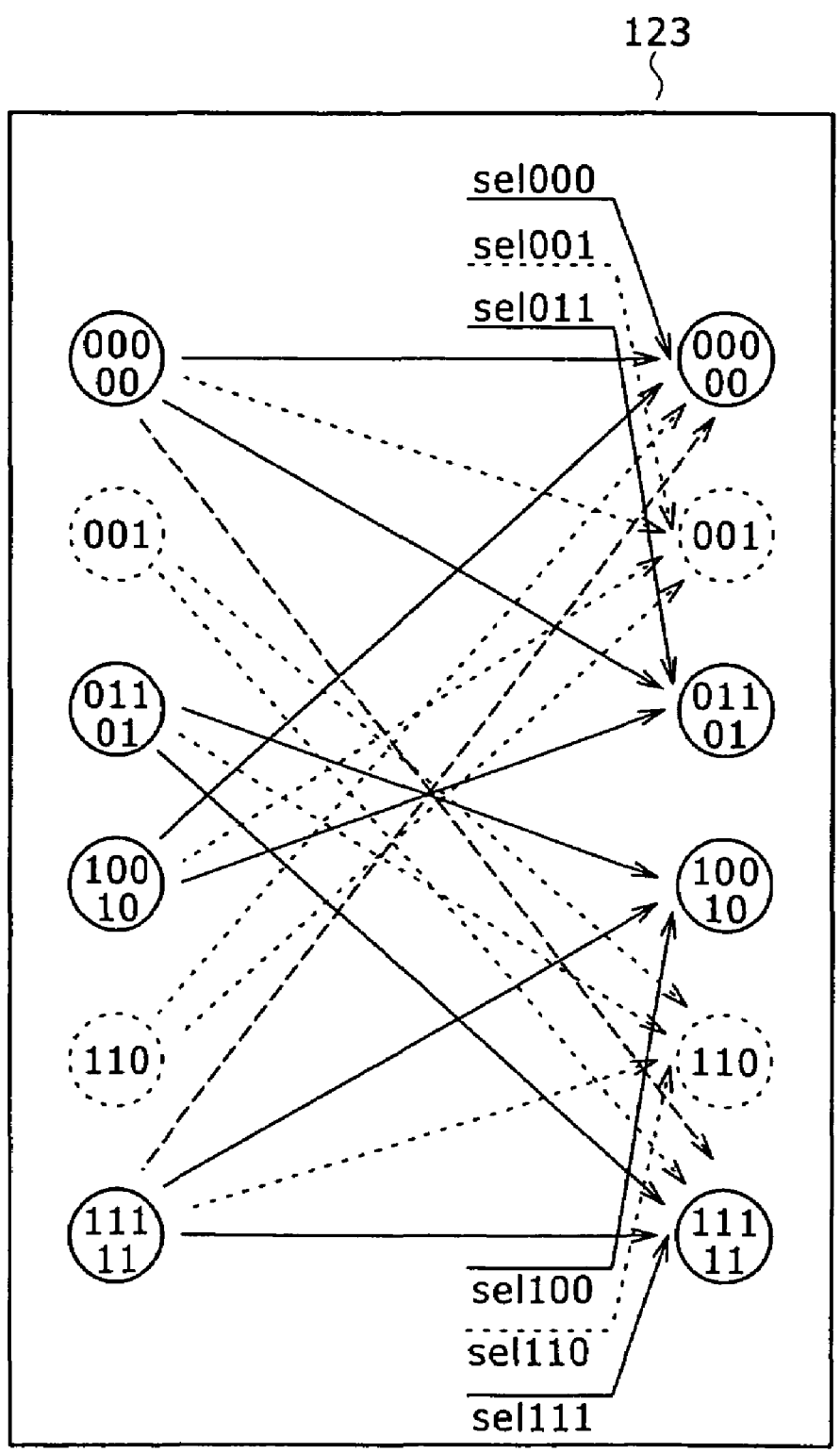
FIG. 22 is a block diagram showing a typical configuration of a path memory employed in the Viterbi decoding circuit shown in FIG. 14 as a decoding circuit for carrying out processing in units of two time slots.

By referring to FIGS. 21 and 22, the following description explains a Viterbi decoding circuit capable of operating at a higher speed by carrying out processing of an amount corresponding to two clock cycles in just one clock cycle.

FIGS. 21 and 22 are diagrams showing a Viterbi decoding circuit 112 capable of carrying out processing of an amount corresponding to two clock cycles in just one clock cycle. The configuration of the Viterbi decoding circuit 112 shown in FIGS. 21 and 22 is basically the same as the configuration of the Viterbi decoding circuit 112 shown in FIGS. 15 and 16 except that, in the case of the configuration of the Viterbi decoding circuit 112 shown in FIGS. 21 and 22, processing of an amount corresponding to two clock cycles is carried out in just one clock cycle while, in the case of the configuration of the Viterbi decoding circuit 112 shown in FIGS. 15 and 16, processing of an amount corresponding to two clock cycles is divided into two portions in two respective clock cycles, being carried out in the two clock cycles.

That is to say, in the embodiment shown in FIG. 21, the configuration of the Viterbi decoding circuit 112 is based on a Viterbi encoding circuit working in an operating mode having the largest constraint length. An example of such a Viterbi encoding circuit is the Viterbi decoding circuit 19 shown in FIGS. 11 and 12 as a Viterbi encoding circuit operating in the PR (1, x, x, 1) mode. When the Viterbi decoding circuit 112 receives a mode select signal from the system control section 111, sections employed in the Viterbi decoding circuit 112 switch the operating mode to the PR (1, x, 1) mode or the PR (1, x, x, 1) mode in accordance with the received mode select signal and operates in the selected mode.

To put it in detail, FIGS. 21 and 22 are diagrams showing a branch-metric computation circuit 121 and an ACS circuit 122, which are capable of carrying out processing of an amount corresponding to two clock cycles in just one clock cycle.

Figure 11:
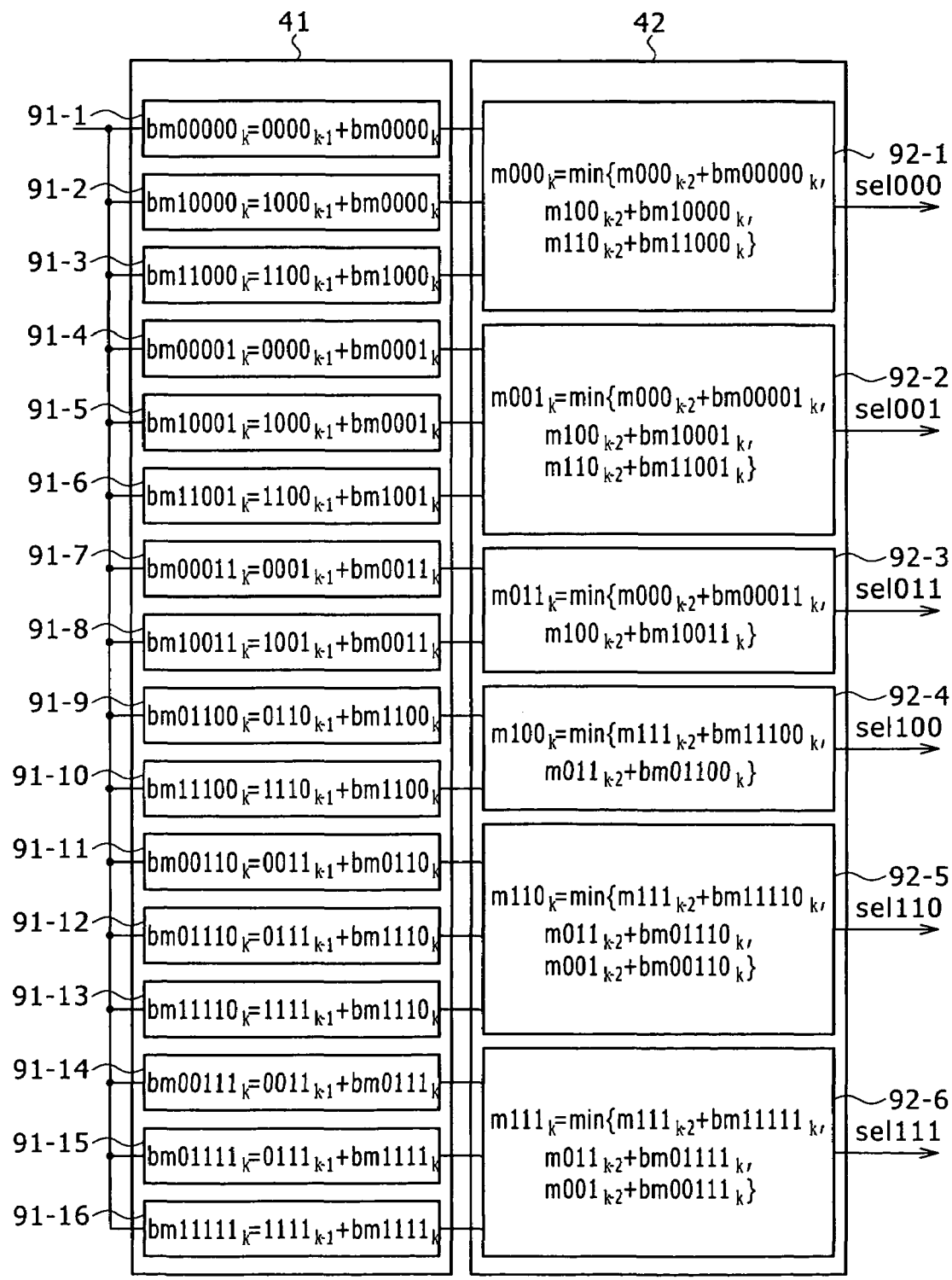
FIG. 11 is a diagram showing a typical configuration of a branch-metric computation circuit and a typical configuration of an ACS circuit provided for the state transitions shown in FIG. 4 as circuits for carrying out processing in units of two time slots.
Figure 12:
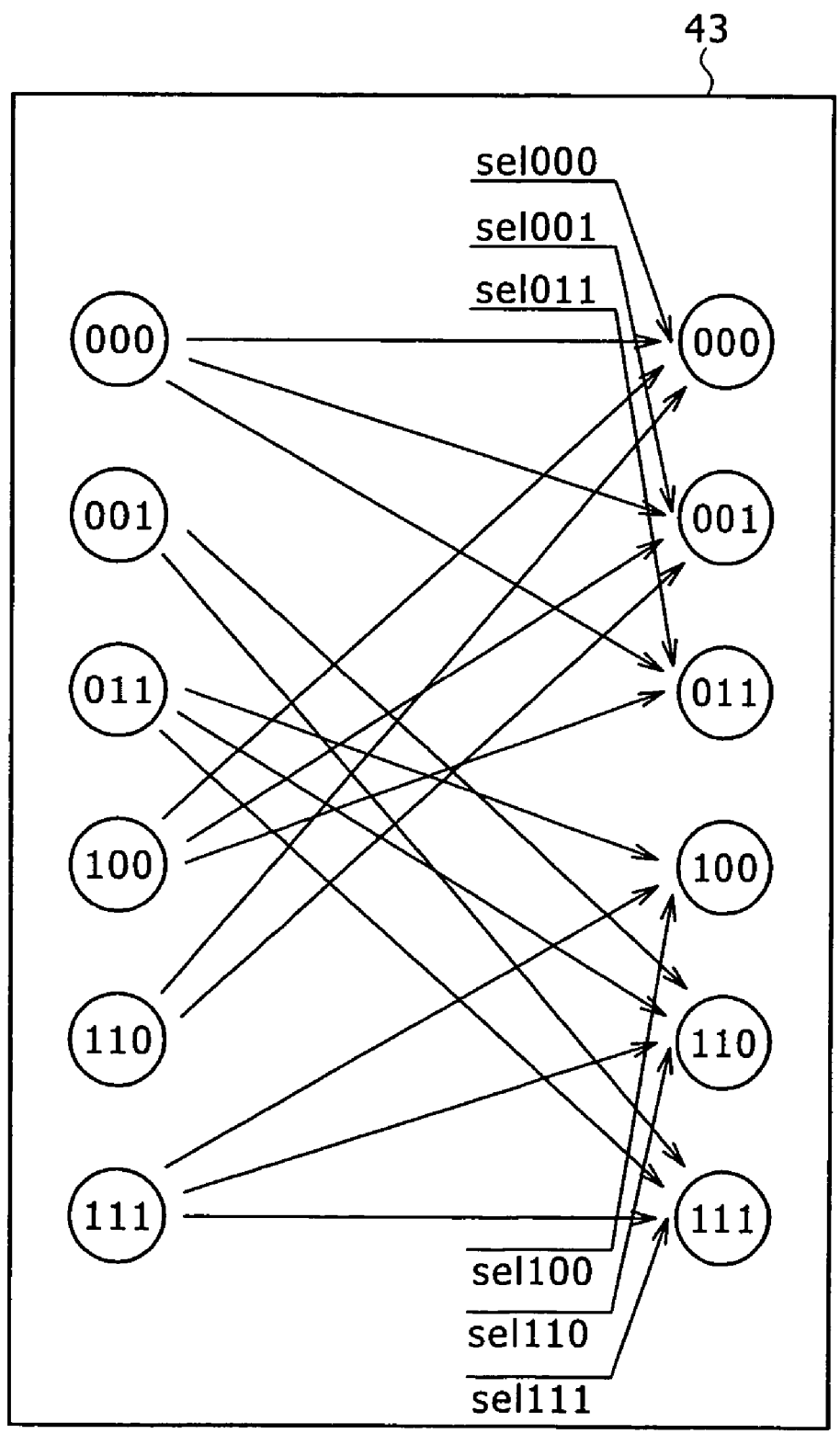
FIG. 12 is a block diagram showing a typical configuration of a path memory provided for the state transitions shown in FIG. 4 as a circuit for carrying out processing in units of two time slots.

The branch-metric computation circuit 121 includes as many branch-metric computation sections as state transitions as the branch-metric computation circuit 41 shown in FIG. 11 does. In the case of the typical configuration shown in FIG. 21, the number of state transitions is 16. Thus, the branch-metric computation circuit 121 includes 16 branch-metric computation sections 231-1 to 231-16 each used for computing a branch-metric data bm corresponding to a state transition occurring over two time slots from a state immediately leading ahead of the state immediately preceding the present state. In the following description, the branch-metric computation sections 231-1 to 231-16 are each referred to simply as a branch-metric computation section 231 in case there is no need to distinguish them from each other. Thus, the branch-metric computation section 231 computes a branch-metric data bm corresponding to a state transition occurring over two time slots from a state immediately leading ahead of the state immediately preceding the present state. Then, the branch-metric computation section 231 outputs the computed branch-metric data bm to the ACS circuit 122.

When the branch-metric computation circuit 121 switches the operating mode to the PR (1, x, 1) mode, the branch-metric computation circuit 121 designates the branch-metric computation section for computing branch-metric data bmABCDE as a branch-metric circuit for computations of branch-metric data bmABCD where suffixes A, B, C, D and E each denotes the integer 1 or 0. At that time, the branch-metric computation section switches cABCD of the PR (1, x, x, 1) mode to cABC of the PR (1, x, 1) mode and cBCDE of the PR (1, x, x, 1) mode to cBCD of the PR (1, x, 1) for each state transition c and computes branch-metric data bmABCD $(=(z_k-cABC)^2+(z_k-cBCD)^2)$ and instead of computing bmABCDE $(=(z_k-cABCD)^2+(z_k-cBCDE)^2)$. It is to be noted that symbols cABCD and cBCDE assigned to a state transition c denote the theoretical value (the identification reference value) of the state transition c in the PR (1, x, x, 1) mode whereas symbols cABC and cBCD assigned to a state transition c denote the theoretical value (the identification reference value) of the state transition c in the PR (1, x, 1) mode.

To put it concretely, in the PR (1, x, x, 1) mode, the branch-metric computation section 231-1 computes branch-metric data bm$00000_k$(=bm$0000_{k-1}$+bm$0000_k$) and outputs the branch-metric data bm$00000_k$ to the ACS section 232-1 where branch-metric data bm$0000_{k-1}$ is equal to the square $(z_{k-1}-c0000)^2$ and branch-metric data bm$0000_k$ is equal to the square $(z_k-c0000)^2$. In this case, notation bm$00000_k$ denotes branch-metric data corresponding to a state transition occurring over two time slots. In the PR (1, x, 1) mode, on the other hand, the branch-metric computation section 231-1 computes branch-metric data bm$0000_k$(=bm$000_{k-1}$+bm$000_k$) where branch-metric data bm$000_{k-1}$ is equal to the square $(z_{k-1}-c000)^2$ and branch-metric data bm$000_k$ is equal to the square $(z_k-c000)^2$ and outputs the branch-metric data bm$0000_k$ also to the ACS section 232-1. In this case, notation bm$0000_k$ denotes branch-metric data corresponding to a state transition occurring over two time slots.

In the following description, branch-metric data bmAB$CD_{k-1}$ is equal to the square $(z_{k-1}-cABCD)^2$, branch-metric data bmBCD$E_k$ is equal to the square $(z_k-cBCDE)^2$, branch-metric data bmAB$C_{k-1}$ is equal to the square $(z_{k-1}-cABC)^2$, branch-metric data bmBC$D_k$ is equal to the square $(z_k-cBCD)^2$ whereas suffixes A, B, C, D and E are each the integer 0 or 1 as described above. Thus, by the same token, in the PR (1, x, x, 1) mode, the branch-metric computation section 231-2 computes branch-metric data bm$10000_k$ (=bm$1000_{k-1}$+bm$0000_k$) and outputs the branch-metric data bm$10000_k$ also to the ACS section 232-1 where notation bm$10000_k$ denotes branch-metric data corresponding to a state transition occurring over two time slots. In the PR (1, x, 1) mode, on the other hand, the branch-metric computation section 231-2 computes branch-metric data bm$1000_k$ (=bm$100_{k-1}$+bm$000_k$) and outputs the branch-metric data bm$1000_k$ also to the ACS section 232-1 where notation bm$1000_k$ denotes branch-metric data corresponding to a state transition occurring over two time slots.

In the same way, in the PR (1, x, x, 1) mode, branch-metric computation section 231-3 computes branch-metric data bm$11000_k$ (=bm$1100_{k-1}$+bm$1000_k$) and outputs the branch-metric data bm$11000_k$ also to the ACS section 232-1 where notation bm$11000_k$ denotes branch-metric data corresponding to a state transition occurring over two time slots. In the PR (1, x, 1) mode, on the other hand, the branch-metric computation section 231-3 computes branch-metric data bm$1100_k$ (=bm$110_{k-1}$+bm$100_k$) and outputs the branch-metric data bm$1100_k$ also to the ACS section 232-1 where notation bm$1100_k$ denotes branch-metric data corresponding to a state transition occurring over two time slots.

By the same token, in the PR (1, x, x, 1) mode, the branch-metric computation section 231-4 computes branch-metric data bm$00001_k$ (=bm$0000_{k-1}$+bm$0001_k$) and outputs the branch-metric data bm$00001_k$ to the ACS section 232-2 where notation bm$00001_k$ denotes branch-metric data corresponding to a state transition occurring over two time slots. In the PR (1, x, 1) mode, on the other hand, the branch-metric computation section 231-4 does not operate. In the same way, in the PR (1, x, x, 1) mode, the branch-metric computation section 231-5 computes branch-metric data bm$10001_k$ (=bm$1000_{k-1}$+bm$0001_k$) and outputs the branch-metric data bm$10001_k$ also to the ACS section 232-2 where notation bm$10001_k$ denotes branch-metric data corresponding to a state transition occurring over two time slots. In the PR (1, x, 1) mode, on the other hand, the branch-metric computation section 231-5 does not operate. By the same token, in the PR (1, x, x, 1) mode, the branch-metric computation section 231-6 computes branch-metric data bm$11001_k$ (=bm$1100_{k-1}$+bm$1001_k$) and outputs the branch-metric data bm$11001_k$ also to the ACS section 232-2 where notation bm$11001_k$ denotes branch-metric data corresponding to a state transition occurring over two time slots. In the PR (1, x, 1) mode, on the other hand, the branch-metric computation section 231-6 does not operate.

In the same say, in the PR (1, x, x, 1) mode, the branch-metric computation section 231-7 computes branch-metric data bm$00011_k$ (=bm$0001_{k-1}$+bm$0011_k$) and outputs the branch-metric data bm$00011_k$ to the ACS section 232-3 where notation bm$00011_k$ denotes branch-metric data corresponding to a state transition occurring over two time slots. In the PR (1, x, 1) mode, on the other hand, the branch-metric computation section 231-7 computes branch-metric data bm$0001_k$ (=bm$000_{k-1}$+bm$001_k$) and outputs the branch-metric data bm$0001_k$ also to the ACS section 232-3 where notation bm$0001_k$ denotes branch-metric data corresponding to a state transition occurring over two time slots.

By the same token, in the PR (1, x, x, 1) mode, the branch-metric computation section 231-8 computes branch-metric data bm$10011_k$ (=bm$1001_{k-1}$+bm$0001_k$) and outputs the branch-metric data bm$10011_k$ also to the ACS section 232-3 where notation bm$10011_k$ denotes branch-metric data corresponding to a state transition occurring over two time slots. In the PR (1, x, 1) mode, on the other hand, the branch-metric computation section 231-8 computes branch-metric data bm$1001_k$ (=bm$100_{k-1}$+bm$001_k$) and outputs the branch-metric data bm$1001_k$ also to the ACS section 232-3 where notation bm$1001_k$ denotes branch-metric data corresponding to a state transition occurring over two time slots.

In the same way, in the PR (1, x, x, 1) mode, the branch-metric computation section 231-9 computes branch-metric data bm$01100_k$ (=bm$0110_{k-1}$+bm$1100_k$) and outputs the branch-metric data bm$01100_k$ to the ACS section 232-4 where notation bm$01100_k$ denotes branch-metric data corresponding to a state transition occurring over two time slots. In the PR (1, x, 1) mode, on the other hand, the branch-metric computation section 231-9 computes branch-metric data bm$0110_k$ (=bm$011_{k-1}$+bm$110_k$) and outputs the branch-metric data bm$0110_k$ also to the ACS section 232-4 where notation bm$0110_k$ denotes branch-metric data corresponding to a state transition occurring over two time slots.

By the same token, in the PR (1, x, x, 1) mode, the branch-metric computation section 231-10 computes branch-metric data bm$11100_k$ (=bm$1110_{k-1}$+bm$1100_k$) and outputs the branch-metric data bm$11100_k$ also to the ACS section 232-4 where notation bm$11100_k$ denotes branch-metric data corresponding to a state transition occurring over two time slots. In the PR (1, x, 1) mode, on the other hand, the branch-metric computation section 231-10 computes branch-metric data bm$1110_k$ (=bm$111_{k-1}$+bm$100_k$) and outputs the branch-metric data bm$1110_k$ also to the ACS section 232-4 where notation bm$1110_k$ denotes branch-metric data corresponding to a state transition occurring over two time slots.

In the same way, in the PR (1, x, x, 1) mode, the branch-metric computation section 231-11 computes branch-metric data bm00110$_k$ (=bm0011$_{k-1}$+bm0110$_k$) and outputs the branch-metric data bm00110$_k$ to the ACS section 232-5 where notation bm00110$_k$ denotes branch-metric data corresponding to a state transition occurring over two time slots. In the PR (1, x, 1) mode, on the other hand, the branch-metric computation section 231-11 does not operate.

In the same way, in the PR (1, x, x, 1) mode, the branch-metric computation section 231-12 computes branch-metric data bm01110$_k$ (=bm0111$_{k-1}$+bm1110$_k$) and outputs the branch-metric data bm01110$_k$ also to the ACS section 232-5 where notation bm01110$_k$ denotes branch-metric data corresponding to a state transition occurring over two time slots. In the PR (1, x, 1) mode, on the other hand, the branch-metric computation section 231-12 does not operate. By the same token, in the PR (1, x, x, 1) mode, the branch-metric computation section 231-13 computes branch-metric data bm11110$_k$ (=bm1111$_{k-1}$+bm1110$_k$) and outputs the branch-metric data bm11110$_k$ also to the ACS section 232-5 where notation bm11110$_k$ denotes branch-metric data corresponding to a state transition occurring over two time slots. In the PR (1, x, 1) mode, on the other hand, the branch-metric computation section 231-13 does not operate.

By the same token, in the PR (1, x, x, 1) mode, the branch-metric computation section 231-14 computes branch-metric data bm00111$_k$ (=bm0011$_{k-1}$+bm0111$_k$) and outputs the branch-metric data bm00111$_k$ to the ACS section 232-6 where notation bm00111$_k$ denotes branch-metric data corresponding to a state transition occurring over two time slots. In the PR (1, x, 1) mode, on the other hand, the branch-metric computation section 231-8 computes branch-metric data bm0011$_k$ (=bm001$_{k-1}$+bm011$_k$) and outputs the branch-metric data bm0011$_k$ also to the ACS section 232-6 where notation bm0011$_k$ denotes branch-metric data corresponding to a state transition occurring over two time slots.

In the same way, in the PR (1, x, x, 1) mode, the branch-metric computation section 231-15 computes branch-metric data bm01111$_k$ (=bm0111$_{k-1}$+bm1111$_k$) and outputs the branch-metric data bm01111$_k$ also to the ACS section 232-6 where notation bm01111$_k$ denotes branch-metric data corresponding to a state transition occurring over two time slots. In the PR (1, x, 1) mode, on the other hand, the branch-metric computation section 231-15 computes branch-metric data bm0111$_k$ (=bm011$_{k-1}$+bm111$_k$) and outputs the branch-metric data bm0111$_k$ also to the ACS section 232-6 where notation bm0111$_k$ denotes branch-metric data corresponding to a state transition occurring over two time slots.

By the same token, in the PR (1, x, x, 1) mode, the branch-metric computation section 231-16 computes branch-metric data bm11111$_k$ (=bm1111$_{k-1}$+bm1111$_k$) and outputs the branch-metric data bm11111$_k$ also to the ACS section 232-6 where notation bm11111$_k$ denotes branch-metric data corresponding to a state transition occurring over two time slots. In the PR (1, x, 1) mode, on the other hand, the branch-metric computation section 231-16 computes branch-metric data bm1111$_k$ (=bm111$_{k-1}$+bm111$_k$) and outputs the branch-metric data bm1111$_k$ also to the ACS section 232-6 where notation bm1111$_k$ denotes branch-metric data corresponding to a state transition occurring over two time slots.

Much like the ACS circuit 42 shown in FIG. 11, the ACS circuit 122 adds branch-metric data received from the branch-metric computation circuit 121 to path-metric data of a state immediately leading ahead of the state immediately preceding the present state to produce a sum and uses the sum as updated path-metric data of the present state. As described earlier, path-metric data m of state S represents the likelihood of a history up to state S. The ACS circuit 122 includes as many ACS sections as states. In the case of the typical configuration shown in FIG. 21, the number of states is 6. Thus, the ACS circuit 122 includes ACS sections 232-1 to 232-6. In the following description, the ACS sections 232-1 to 232-6 are each referred to simply as an ACS section 232 in case there is no need to distinguish them from each other.

Much like the branch-metric computation circuit 121 shown in FIG. 21, when the operating mode is switched to the PR (1, x, 1) mode, the ACS circuit 122 also designates the ACS section 232 for computing path-metric data mABC as an ACS section for computations of path-metric data mAB.

To put it concretely, in the PR (1, x, x, 1) mode, the ACS section 232-1 updates the path-metric data m000$_k$, which is the likelihood of a history up to state S000. To be more specific, the ACS section 232-1 adds the path-metric data m000$_{k-2}$ stored internally in the ACS section 232-1 as the path-metric data of a state immediately leading ahead of the state immediately preceding the present state to the branch-metric data bm00000$_k$ received from the branch-metric computation section 231-1 to produce a first sum. The ACS section 232-1 also adds the path-metric data m100$_{k-2}$ stored internally in the ACS section 232-4 as the path-metric data of a state immediately leading ahead of the state immediately preceding the present state to the branch-metric data bm10000$_k$ received from the branch-metric computation section 231-2 to produce a second sum. In addition, the ACS section 232-1 also adds the path-metric data m110$_{k-2}$ stored internally in the ACS section 232-5 as the path-metric data of a state immediately leading ahead of the state immediately preceding the present state to the branch-metric data bm11000$_k$ received from the branch-metric computation section 231-3 to produce a third sum. Then, the ACS section 232-1 compares the first, second and third sums with each other in order to select the smallest one to be used as updated path-metric data m000$_k$ of the present state. Finally, the ACS section 232-1 outputs a selection result sel000 to a memory included in the path memory 123 as a memory used for storing the value of state S000. The computations and the comparison are carried out by the ACS section 232-1 in accordance with Eq. (15) given before.

In the PR (1, x, 1) mode, on the other hand, the ACS section 232-1 updates the path-metric data m00$_k$, which is the likelihood of a history up to state S00. To be more specific, the ACS section 232-1 adds the path-metric data m00$_{k-2}$ stored internally in the ACS section 232-1 as the path-metric data of a state immediately leading ahead of the state immediately preceding the present state to the branch-metric data bm0000$_k$ received from the branch-metric computation section 231-1 to produce a first sum. The ACS section 232-1 also adds the path-metric data m10$_{k-2}$ stored internally in the ACS section 232-4 as the path-metric data of a state immediately leading ahead of the state immediately preceding the present state to the branch-metric data bm1000$_k$ received from the branch-metric computation section 231-2 to produce a second sum. In addition, the ACS section 232-1 also adds the updated path-metric data m11$_{k-2}$ stored internally in the ACS section 232-6 as the path-metric data of a state immediately leading ahead of the state immediately preceding the present state to the branch-metric data bm1100$_k$ received from the branch-metric computation section 231-3 to produce a third sum. Then, the ACS section 232-1 compares the first, second and third sums with each other in order to select the smallest one to be used as updated path-metric data m00$_k$ of the present state. Finally, the ACS section 232-1 outputs a selection result sel000 to a memory used for storing the value of state S00. The computations and the comparison are carried out by the ACS section 232-1 in accordance with Eq. (11) given before.

It is to be noted that, as described above, in the PR (1, x, 1) mode, the ACS section 232-1 updates the path-metric data $m00_k$ on the basis of path-metric data $m11_{k-2}$ stored internally in the ACS section 232-6 (also for updating path-metric data $m111_k$ in the PR (1, x, x, 1) mode) in place of the path-metric data $m110_{k-2}$ that should be used for updating path-metric data $m00_k$. This is because the ACS section 232-2 for finding path-metric data $m110_{k-2}$ does not operate in the PR (1, x, 1) mode as will be described below. The path-metric data $m110_{k-2}$ is path metric data of a state immediately leading ahead of the state immediately preceding the present state having path-metric data $m000_k$ corresponding to the path-metric data $m00_k$ updated by the ACS section 232-1.

By the same token, in the PR (1, x, x, 1) mode, the ACS section 232-2 updates the path-metric data $m001_k$, which is the likelihood of a history up to state S001. To be more specific, the ACS section 232-2 adds the path-metric data $m000_{k-2}$ stored internally in the ACS section 232-1 as the path-metric data of a state immediately leading ahead of the state immediately preceding the present state to the branch-metric data $bm00001_k$ received from the branch-metric computation section 231-4 to produce a first sum. The ACS section 232-2 also adds the path-metric data $m100_{k-2}$ stored internally in the ACS section 232-4 as the path-metric data of a state immediately leading ahead of the state immediately preceding the present state to the branch-metric data $bm10001_k$ received from the branch-metric computation section 231-5 to produce a second sum. In addition, the ACS section 232-2 also adds the path-metric data $m110_{k-2}$ stored internally in the ACS section 232-5 as the path-metric data of a state immediately leading ahead of the state immediately preceding the present state to the branch-metric data $bm11001_k$ received from the branch-metric computation section 231-6 to produce a third sum. Then, the ACS section 232-2 compares the first, second and third sums with each other in order to select the smallest one to be used as updated path-metric data $m001_k$ of the present state. Finally, the ACS section 232-2 outputs a selection result sel001 to a memory used for storing the value of state S001. The computations and the comparison are carried out by the ACS section 232-2 in accordance with Eq. (16) given before.

In the PR (1, x, 1) mode, on the other hand, the ACS section 232-2 does not operate.

In the PR (1, x, x, 1) mode, the ACS section 232-3 updates the path-metric data $m011_k$, which is the likelihood of a history up to state S011. To be more specific, the ACS section 232-3 adds the path-metric data $m000_{k-2}$ stored internally in the ACS section 232-1 as the path-metric data of a state immediately leading ahead of the state immediately preceding the present state to the branch-metric data $bm00011_k$ received from the branch-metric computation section 231-7 to produce a first sum. The ACS section 232-3 also adds the path-metric data $m100_{k-2}$ stored internally in the ACS section 232-4 as the path-metric data of a state immediately leading ahead of the state immediately preceding the present state to the branch-metric data $bm10011_k$ received from the branch-metric computation section 231-8 to produce a second sum. Then, the ACS section 232-3 compares the first and second sums with each other in order to select the smaller one to be used as updated path-metric data $m011_k$ of the present state. Finally, the ACS section 232-3 outputs a selection result sel011 to a memory used for storing the value of state S011. The computations and the comparison are carried out by the ACS section 232-3 in accordance with Eq. (17) given before.

In the PR (1, x, 1) mode, on the other hand, the ACS section 232-3 updates the path-metric data $m01_k$, which is the likelihood of a history up to state S01. To be more specific, the ACS section 232-3 adds the path-metric data $m00_{k-2}$ stored internally in the ACS section 232-1 as the path-metric data of a state immediately leading ahead of the state immediately preceding the present state to the branch-metric data $bm0001_k$ received from the branch-metric computation section 231-7 to produce a first sum. The ACS section 232-3 also adds the path-metric data $m10_{k-2}$ stored internally in the ACS section 232-4 as the path-metric data of a state immediately leading ahead of the state immediately preceding the present state to the branch-metric data $bm1001_k$ received from the branch-metric computation section 231-8 to produce a second sum. Then, the ACS section 232-3 compares the first and second sums with each other in order to select the smaller one to be used as updated path-metric data $m01_k$ of the present state. Finally, the ACS section 232-3 outputs a selection result sel011 to a memory used for storing the value of state S01. The computations and the comparison are carried out by the ACS section 232-3 in accordance with Eq. (12) given before.

By the same token, in the PR (1, x, x, 1) mode, the ACS section 232-4 updates the path-metric data $m100_k$, which is the likelihood of a history up to state S100. To be more specific, the ACS section 232-4 adds the path-metric data $m111_{k-2}$ stored internally in the ACS section 232-6 as the path-metric data of a state immediately leading ahead of the state immediately preceding the present state to the branch-metric data $bm11100_k$ received from the branch-metric computation section 231-10 to produce a first sum. The ACS section 232-4 also adds the path-metric data $m011_{k-2}$ stored internally in the ACS section 232-3 as the path-metric data of a state immediately leading ahead of the state immediately preceding the present state to the branch-metric data $bm01100_k$ received from the branch-metric computation section 231-9 to produce a second sum. Then, the ACS section 232-4 compares the first and second sums with each other in order to select the smaller one to be used as updated path-metric data $m100_k$ of the present state. Finally, the ACS section 232-4 outputs a selection result sel100 to a memory for storing the value of state S100. The computations and the comparison are carried out by the ACS section 232-4 in accordance with by Eq. (18) given before.

In the PR (1, x, 1) mode, on the other hand, the ACS section 232-4 updates the path-metric data $m10_k$, which is the likelihood of a history up to state S10. To be more specific, the ACS section 232-4 adds the path-metric data $m11_{k-2}$ stored internally in the ACS section 232-6 as the path-metric data of a state immediately leading ahead of the state immediately preceding the present state to the branch-metric data $bm1110_k$ received from the branch-metric computation section 231-10 to produce a first sum. The ACS section 232-4 also adds the path-metric data $m01_{k-2}$ stored internally in the ACS section 232-3 as the path-metric data of a state immediately leading ahead of the state immediately preceding the present state to the branch-metric data $bm0110_k$ received from the branch-metric computation section 231-9 to produce a second sum. Then, the ACS section 232-4 compares the first and second sums with each other in order to select the smaller one to be used as updated path-metric data $m10_k$ of the present state. Finally, the ACS section 232-4 outputs a selection result sel100 to a memory for storing the value of state S10. The computations and the comparison are carried out by the ACS section 232-4 in accordance with Eq. (13) given before.

By the same token, in the PR (1, x, x, 1) mode, the ACS section 232-5 updates the path-metric data $m110_k$, which is the likelihood of a history up to state S110. To be more specific, the ACS section 232-5 adds the path-metric data $m111_{k-2}$ stored internally in the ACS section 232-6 as the path-metric data of a state immediately leading ahead of the state immediately preceding the present state to the branch-metric data bm$11110_k$ received from the branch-metric computation section 231-13 to produce a first sum. The ACS section 232-5 also adds the path-metric data m$011_{k-2}$ stored internally in the ACS section 232-3 as the path-metric data of a state immediately leading ahead of the state immediately preceding the present state to the branch-metric data bm$01110_k$ received from the branch-metric computation section 231-12 to produce a second sum. In addition, the ACS section 232-5 also adds the path-metric data m$001_{k-2}$ stored internally in the ACS section 232-3 as the path-metric data of a state immediately leading ahead of the state immediately preceding the present state to the branch-metric data bm$00110_k$ received from the branch-metric computation section 231-11 to produce a third sum. Then, the ACS section 232-5 compares the first, second and third sums with each other in order to select the smallest one to be used as updated path-metric data m$110_k$ of the present state. Finally, the ACS section 232-5 outputs a selection result sel110 to a memory used for storing the value of state S110. The computations and the comparison are carried out by the ACS section 232-5 in accordance with Eq. (19) given before.

In the PR (1, x, 1) mode, on the other hand, the ACS section 232-5 does not operate.

In the PR (1, x, x, 1) mode, the ACS section 232-6 updates the path-metric data m$111_k$, which is the likelihood of a history up to state S111. To be more specific, the ACS section 232-6 adds the path-metric data m$111_{k-2}$ stored internally in the ACS section 232-6 as the path-metric data of a state immediately leading ahead of the state immediately preceding the present state to the branch-metric data bm$11111_k$ received from the branch-metric computation section 231-16 to produce a first sum. The ACS section 232-6 also adds the path-metric data m$011_{k-2}$ stored internally in the ACS section 232-3 as the path-metric data of a state immediately leading ahead of the state immediately preceding the present state to the branch-metric data bm$01111_k$ received from the branch-metric computation section 231-15 to produce a second sum. In addition, the ACS section 232-6 also adds the path-metric data m$001_{k-2}$ stored internally in the ACS section 232-3 as the path-metric data of a state immediately leading ahead of the state immediately preceding the present state to the branch-metric data bm$00111_k$ received from the branch-metric computation section 231-14 to produce a third sum. Then, the ACS section 232-6 compares the first, second and third sums with each other in order to select the smallest one to be used as updated path-metric data m$111_k$ of the present state. Finally, the ACS section 232-6 outputs a selection result sel111 to a memory used for storing the value of state S111. The computations and the comparison are carried out by the ACS section 232-6 in accordance with Eq. (20) given before.

In the PR (1, x, 1) mode, on the other hand, the ACS section 232-6 updates the path-metric data m$11_k$, which is the likelihood of a history up to state S11. To be more specific, the ACS section 232-6 adds the path-metric data m$11_{k-2}$ stored internally in the ACS section 232-6 as the path-metric data of a state immediately leading ahead of the state immediately preceding the present state to the branch-metric data bm$1111_k$ received from the branch-metric computation section 231-16 to produce a first sum. The ACS section 232-6 also adds the path-metric data m$01_{k-2}$ stored internally in the ACS section 232-3 as the path-metric data of a state immediately leading ahead of the state immediately preceding the present state to the branch-metric data bm$0111_k$ received from the branch-metric computation section 231-15 to produce a second sum. In addition, the ACS section 232-6 also adds the updated path-metric data m$00_{k-2}$ stored internally in the ACS section 232-1 as the path-metric data of a state immediately leading ahead of the state immediately preceding the present state to the branch-metric data bm$0011_k$ received from the branch-metric computation section 231-14 to produce a third sum. Then, the ACS section 232-6 compares the first, second and third sums with each other in order to select the smallest one to be used as updated path-metric data m$11_k$ of the present state. Finally, the ACS section 232-6 outputs a selection result sel111 to a memory used for storing the value of state S11. The computations and the comparison are carried out by the ACS section 232-6 in accordance with Eq. (14) given before.

It is to be noted that, as described above, in the PR (1, x, 1) mode, the ACS section 232-6 updates the path-metric data m$11_k$ on the basis of path-metric data m$00_{k-2}$ stored internally in the ACS section 232-1 (also used for finding path-metric data m$000_k$ in the PR (1, x, x, 1) mode) in place of path-metric data m$001_{k-2}$, which should be used for updating path-metric data m$11_k$, in the same way as the ACS section 232-1 updates the path-metric data m$00_k$ as described above. This is because the ACS section 232-5 for finding path-metric data m$001_{k-2}$ does not operate in the PR (1, x, 1) mode as described above. The path-metric data m$001_{k-2}$ is path metric data of a state immediately leading ahead of the state immediately preceding the present state having path-metric data m$111_k$ corresponding to the path-metric data m$11_k$ updated by the ACS section 232-6.

Figure 10:
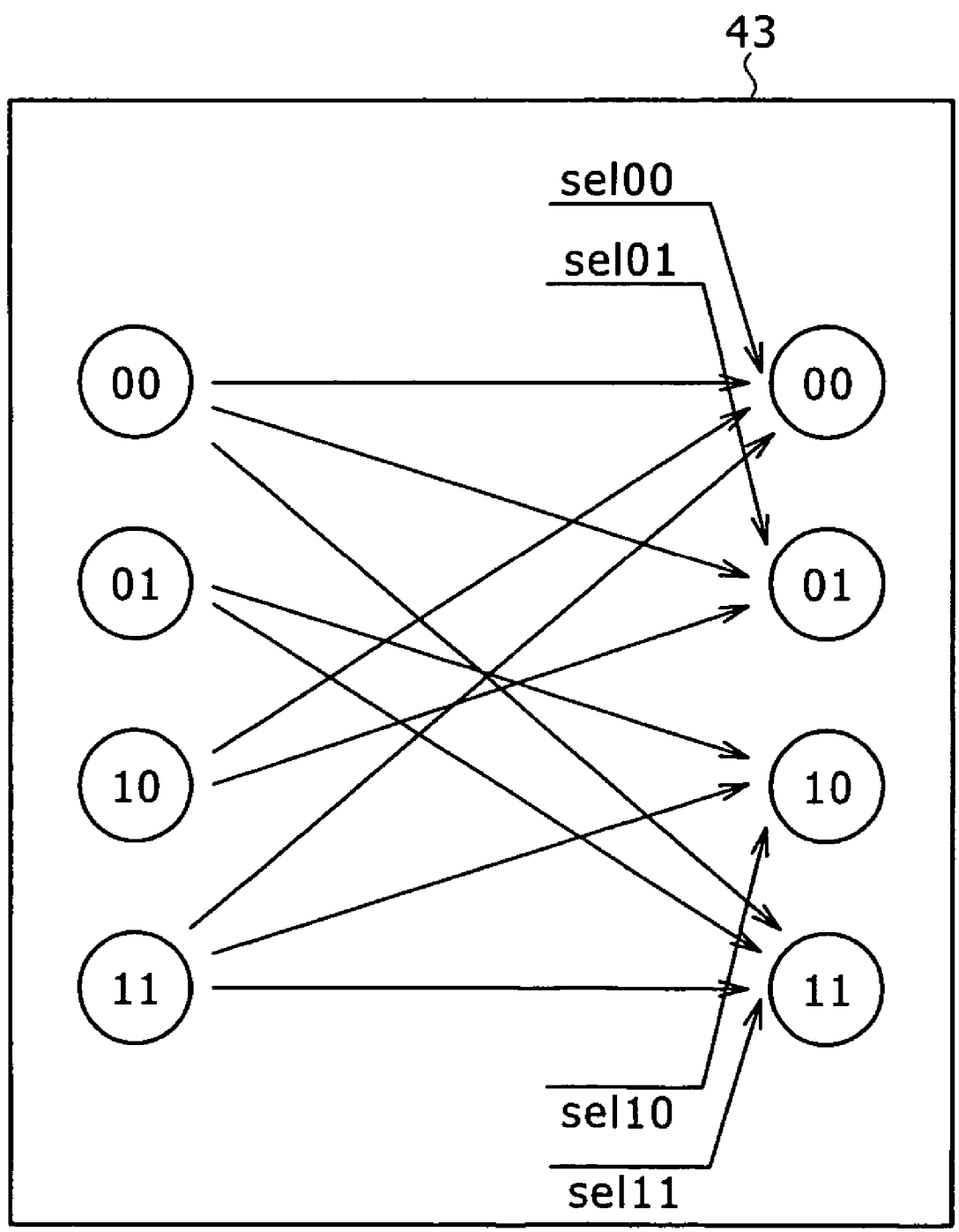
FIG. 10 is a block diagram showing a typical configuration of a path memory provided for the state transitions shown in FIG. 3 as a circuit for carrying out processing in units of two time slots.

By using the path-metric data m$11_{k-2}$ and the path-metric data m$00_{k-2}$ as substitutes as described above, a trellis spread throughout the path memory 123 shown in FIG. 22 as the trellis of state transitions occurring in the PR (1, x, x, 1) mode becomes compatible with the trellis spread throughout the path memory 43 shown in FIG. 10 as the trellis of state transitions occurring in the PR (1, x, 1) mode so that the ACS circuit 122 is capable of operating in both the PR (1, x, x, 1) mode and the PR (1, x, 1) mode.

FIG. 22 is a diagram showing a typical configuration of the path memory 123 for carrying out processing of an amount corresponding to two time slots in just one time slot.

What is claimed is:

1. A decoding apparatus for decoding an encoded signal on the basis of a plurality of state-transition trellises having different state counts, comprising:
    decoding means for decoding a plurality of bits from multiple time slots of said encoded signal at a single state transition on the basis of a first state-transition trellis or a second state-transition trellis, the first state transition trellis being different from the second state transition trellis; and
    mode selection means for selecting either a first operating mode based on said first state-transition trellis or a second operating mode based on said second state-transition trellis, the first state-transition trellis having a state count greater than said second state-transition trellis, and includes all the states in the second transition trellis,
    wherein, if said mode selection means selects said second operating mode, said decoding means switches from decoding said encoded signal by carrying out a first state transition selected from said first state-transition trellis to decoding said encoded signal by carrying out a second state transition selected from said second state-transition trellis.

2. The decoding apparatus according to claim 1, wherein said decoding means comprises:
    branch-metric computation means for calculating branch-metric data;

path-metric selection means for selecting a most probable path-metric data on the basis of branch-metric data calculated by said branch-metric computation means; and
a path memory for obtaining a decoded signal by shifting information, which is stored in memories employed in said path memory, in accordance with a selection result produced by said path-metric selection means.

3. The decoding apparatus according to claim 1, wherein:
in said first operating mode, said decoding means employs a circuit that implements the states and performs the state transitions of said first state-transition trellis, and
in said second operating mode, said decoding means employs said circuit to implement the states and perform the state transitions of said second state-transition trellis,
wherein the implementation of the states of the second state-transition trellis also implement a portion of the states of the first state-transition trellis.

4. The decoding apparatus according to claim 1, wherein the first trellis includes a state transition from the second transition trellis.

5. The decoding apparatus according to claim 1, wherein the first trellis includes a plurality of state transitions from the second transition trellis.

6. A decoding method for decoding an encoded signal on the basis of a plurality of state-transition trellises having different state counts, comprising the steps of:
decoding a plurality of bits from multiple time slots of said encoded signal at a single step on the basis of a first state-transition trellis or a second state-transition trellis, the first state transition trellis being different from the second state transition trellis; and
mode selection, including selecting either a first operating mode based on said first state-transition trellis or a second operating mode based on a second state-transition trellis, the first state-transition trellis having a state count greater than said second state-transition trellis, and including all the states in the second transition trellis,
whereby, if said second operating mode is selected at said mode selection step, said decoding step switches from decoding said encoded signal by carrying out a first state transition selected from said first state-transition trellis to decoding said encoded signal by carrying out a second state transition selected from said second state-transition trellis.

7. The decoding method according to claim 6, wherein in said decoding step:
in said first operating mode, using a circuit to implement the states and perform the state transitions of said first state-transition trellis, and
in said second operating mode, using the circuit to implement the states and perform the state transitions of said second state-transition trellis,
wherein the implementation of the states of the second state-transition trellis also implement a portion of the states of the first state-transition trellis.

8. The decoding method according to claim 6, wherein in the first trellis includes a state transition from the second transition trellis.

9. The decoding method according to claim 6, wherein in the first trellis includes a plurality of state transitions from the second transition trellis.

10. A computer program stored on a computer readable medium, that when executed causes a computer to decode an encoded signal read from a recording medium to produce a modulated signal having a low production-error rate on the basis of a plurality of state-transition trellises having different state counts, the computer program stored on the computer readable medium comprising the steps of:
decoding a plurality of bits from multiple time slots of said encoded signal at a single state transition on the basis of a first state-transition trellis or a second state-transition trellis, the first state transition trellis being different from the second state transition trellis; and
mode selection, selecting either a first operating mode based on said first state-transition trellis or a second operating mode based on a second state-transition trellis, the first state-transition trellis having a state count greater than said second state-transition trellis, and including all the states in the second transition trellis, and
if said second operating mode is selected at said mode selection step, said decoding step switches from decoding said encoded signal by carrying out a first state transition selected from said first state-transition trellis to decoding said encoded signal by carrying out a second state transition selected from said second state-transition trellis.

11. The computer program stored on a computer readable medium according to claim 10, wherein while decoding:
in said first operating mode, using the first state-transition trellis to implement states and perform state transitions, and
in said second operating mode, using the second state-transition trellis implement states and to perform state transitions,
wherein the states of the second state-transition trellis also implement a portion of the states of the first state-transition trellis.

12. The computer program stored on a computer readable medium according to claim 10, wherein the first trellis includes a state transition from the second transition trellis.

13. The computer program stored on a computer readable medium according to claim 10, wherein the first trellis includes a plurality of state transitions from the second transition trellis.

14. A recording/reproduction apparatus for recording/reproducing a signal onto/from a predetermined recording medium, to result in a reproduced signal and decoding said reproduced signal on the basis of a plurality of different state-transition trellises, comprising:
recording means for recording a signal onto said predetermined recording medium;
reproduction means for reproducing a signal, which has been recorded by said recording means on said recording medium, to result in a reproduced signal by carrying out an equalization process on said signal to convert said signal into a signal having a PR (Partial Response) characteristic;
decoding means for decoding a plurality of bits from multiple time slot of said reproduced signal at a single step, said reproduced signal having been reproduced by said reproduction means, on the basis of a first state-transition trellis or a second state-transition trellis, the first state transition trellis being different from the second state transition trellis; and
mode selection means for selecting either a first operating mode based on said first state-transition trellis or a second operating mode based on a second state-transition trellis, the first state-transition trellis having a state count greater than said second state-transition trellis, and including all the states in the second transition trellis,
wherein, if said mode selection means selects said second operating mode, said decoding means decodes switches from decoding said reproduced signal by carrying out a first state transition selected from said first state-transition trellis to decoding said reproduced signal by carrying out a second state transition selected from said second state-transition trellis.

15. The recording/reproduction apparatus according to claim 14, wherein
in said first operating mode said decoding means employs a circuit to implement the states and perform the state transitions of said first state-transition trellis, and
in said second operating mode said decoding means employs the circuit to implement the states and perform the state transitions of said second state-transition trellis, wherein the implementation of the states of the second state-transition trellis also implement a portion of the states of the first state-transition trellis.

16. The recording/reproduction apparatus according to claim 14, wherein the first trellis includes a state transition from the second transition trellis.

17. The recording/reproduction apparatus according to claim 14, wherein the first trellis includes a plurality of state transitions from the second transition trellis.

18. A decoding apparatus for decoding an encoded signal on the basis of a plurality of state-transition trellises having different state counts, comprising:
a decoding unit for decoding a plurality of bits from multiple time slots of said encoded signal at a single state transition on the basis of a first state-transition trellis or a second state-transition trellis, the first state transition trellis being different from the second state transition trellis; and
a mode selection unit for selecting either a first operating mode based on said first state-transition trellis or a second operating mode based on a second state-transition trellis, the first state-transition trellis having a state count greater than said second state-transition trellis, and includes all the states in the second transition trellis,
wherein, if said mode selection unit selects said second operating mode, said decoding unit switches from decoding said encoded signal by carrying out a first state transition selected from said first state-transition trellis to decoding said encoded signal by carrying out a second state transition selected from said second state-transition trellis.

19. A recording/reproduction apparatus for recording/reproducing a signal onto/from a predetermined recording medium, to result in a reproduced signal and decoding said reproduced signal on the basis of a plurality of state-transition trellises having state counts different from each other, comprising:
a recording unit for recording a signal onto said predetermined recording medium;
a reproduction unit for reproducing a signal, which has been recorded by said recording unit on said recording medium, to result in a reproduced signal by carrying out an equalization process on said signal to convert said signal into a signal having a PR (Partial Response) characteristic;
a decoding unit for decoding a plurality of bits from multiple time slots of said reproduced signal at a single step, said reproduced signal having been reproduced by said reproduction unit, on the basis of a first state-transition trellis or a second state-transition trellis, the first state transition trellis being different from the second state transition trellis; and
a mode selection unit for selecting either a first operating mode based on said first state-transition trellis or a second operating mode based on a second state-transition trellis, the first state-transition trellis having a state count greater than said second state-transition trellis, and including all the states in the second transition trellis and at least one of the state transitions from the second transition trellis,
wherein, if said mode selection unit selects said second operating mode, said decoding unit switches from decoding said reproduced signal by carrying out a first state transition selected from said first state-transition trellis to decoding said reproduced signal by carrying out a second state transition selected from said second state-transition trellis.

* * * * *